United States Patent
Hoffman et al.

(10) Patent No.: US 7,470,626 B2
(45) Date of Patent: *Dec. 30, 2008

(54) METHOD OF CHARACTERIZING A CHAMBER BASED UPON CONCURRENT BEHAVIOR OF SELECTED PLASMA PARAMETERS AS A FUNCTION OF SOURCE POWER, BIAS POWER AND CHAMBER PRESSURE

(75) Inventors: Daniel J. Hoffman, Saratoga, CA (US); Ezra Robert Gold, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 57 days.

This patent is subject to a terminal disclaimer.

(21) Appl. No.: 11/608,944

(22) Filed: Dec. 11, 2006

(65) Prior Publication Data

US 2007/0080137 A1    Apr. 12, 2007

Related U.S. Application Data

(63) Continuation-in-part of application No. 10/440,364, filed on May 16, 2003, now Pat. No. 7,247,218.

(51) Int. Cl.
    *H01L 21/302* (2006.01)
(52) U.S. Cl. .................. 438/706; 438/714; 216/59
(58) Field of Classification Search .......... 438/706, 438/710, 712, 714; 216/59, 61, 67
    See application file for complete search history.

(56) References Cited

U.S. PATENT DOCUMENTS

| | | | |
|---|---|---|---|
| 2,951,960 A | 9/1960 | Watrous, Jr. | 313/36 |
| 2,967,926 A | 1/1961 | Edstrom | 219/75 |
| 3,355,615 A | 11/1967 | Bihan et al. | 313/63 |
| 3,610,986 A | 10/1971 | King | 313/63 |
| 4,458,180 A | 7/1984 | Sohval | 315/111.81 |
| 4,464,223 A | 8/1984 | Gorin | 156/643 |

(Continued)

FOREIGN PATENT DOCUMENTS

| | | |
|---|---|---|
| EP | 0 343 500 A1 | 11/1989 |
| EP | 0 678 903 | 10/1995 |
| EP | 0 719 447 | 7/1998 |
| WO | WO 01/71765 | 9/2001 |

OTHER PUBLICATIONS

King, Ronald W.P., "Transmission-Line Theory", Dover Publications, Inc., 1965, New York, pp. 1-10 and 282-286.

*Primary Examiner*—Kin-Chan Chen
(74) *Attorney, Agent, or Firm*—Law Office of Robert M. Wallace

(57) ABSTRACT

A plasma reactor chamber is characterized by performing two steps for each one of plural selected chamber parameters. The first step consists of ramping the level of the one chamber parameter while sampling RF electrical parameters at an RF bias power input to said wafer support pedestal and computing from each sample of said RF electrical parameters the values of the plasma parameters. The second step consists of deducing, from the corresponding chamber parameter data generated in the first step, a single variable function for each of the plural plasma parameters having said one chamber parameter as an independent variable, and constructing combinations of these functions that are three variable functions having each of the chamber parameters as a variable.

22 Claims, 37 Drawing Sheets

U.S. PATENT DOCUMENTS

| | | | |
|---|---|---|---|
| 4,570,106 A | 2/1986 | Sohval et al. | 315/111.81 |
| 4,579,618 A | 4/1986 | Celestino et al. | 156/345 |
| 4,859,908 A | 8/1989 | Yoshida et al. | 315/111.81 |
| 4,888,518 A | 12/1989 | Grunwald | 313/40 |
| 4,973,883 A | 11/1990 | Hirose et al. | 315/111.41 |
| 4,990,229 A | 2/1991 | Campbell et al. | 204/298.06 |
| 5,006,760 A | 4/1991 | Drake, Jr. | 315/111.21 |
| 5,017,835 A | 5/1991 | Oechsner | 315/111.81 |
| 5,032,202 A | 7/1991 | Tsai et al. | 156/345 |
| 5,053,678 A | 10/1991 | Koike et al. | 315/111.81 |
| 5,055,853 A | 10/1991 | Garnier | 343/769 |
| 5,074,456 A | 12/1991 | Degner et al. | 228/121 |
| 5,077,499 A | 12/1991 | Oku | 315/111.81 |
| 5,089,083 A | 2/1992 | Kojima et al. | 156/643 |
| 5,107,170 A | 4/1992 | Ishikawa et al. | 313/362.1 |
| 5,115,167 A | 5/1992 | Ootera et al. | 315/111.21 |
| 5,122,251 A | 6/1992 | Campbell et al. | 204/298.06 |
| 5,134,603 A | 7/1992 | Baas | 720/606 |
| 5,140,223 A | 8/1992 | Gesche et al. | 315/111.21 |
| 5,175,472 A | 12/1992 | Johnson et al. | 315/111.21 |
| 5,195,045 A | 3/1993 | Keane et al. | 364/482 |
| 5,198,725 A | 3/1993 | Chen et al. | 315/111.41 |
| 5,210,466 A | 5/1993 | Collins et al. | 315/111.21 |
| 5,213,658 A | 5/1993 | Ishida | 156/643 |
| 5,218,271 A | 6/1993 | Egorov et al. | 315/111.61 |
| 5,223,457 A | 6/1993 | Mintz et al. | 437/225 |
| 5,225,024 A | 7/1993 | Hanley et al. | 156/345 |
| 5,246,532 A | 9/1993 | Ishida | 156/345 |
| 5,256,931 A | 10/1993 | Bernadet | 313/360.1 |
| 5,272,417 A | 12/1993 | Ohmi | 315/111.21 |
| 5,273,610 A | 12/1993 | Thomas, III et al. | 156/62.7 |
| 5,274,306 A | 12/1993 | Kaufman et al. | 315/111.41 |
| 5,279,669 A | 1/1994 | Lee | 118/723 |
| 5,280,219 A | 1/1994 | Ghanbari | 315/111.41 |
| 5,300,460 A | 4/1994 | Collins et al. | 437/225 |
| 5,325,019 A | 6/1994 | Miller et al. | 315/111.21 |
| 5,401,351 A | 3/1995 | Samukawa | 156/345 |
| 5,432,315 A | 7/1995 | Kaji et al. | 219/121.43 |
| 5,453,305 A | 9/1995 | Lee | 427/562 |
| 5,463,525 A | 10/1995 | Barnes et al. | 361/234 |
| 5,467,013 A * | 11/1995 | Williams et al. | 324/127 |
| 5,474,648 A | 12/1995 | Patrick et al. | 156/627.1 |
| 5,512,130 A | 4/1996 | Barna et al. | 156/651.1 |
| 5,534,070 A | 7/1996 | Okamura et al. | 118/723 |
| 5,537,004 A | 7/1996 | Imahashi et al. | 315/111.21 |
| 5,554,223 A | 9/1996 | Imahashi | 118/723 |
| 5,556,549 A | 9/1996 | Patrick et al. | 216/61 |
| 5,567,268 A | 10/1996 | Kadomura | 156/345 |
| 5,576,600 A | 11/1996 | McCrary et al. | 315/111.81 |
| 5,576,629 A | 11/1996 | Turner et al. | 324/709 |
| 5,587,038 A | 12/1996 | Cecchi et al. | 156/345 |
| 5,592,055 A | 1/1997 | Capacci et al. | 315/111.21 |
| 5,595,627 A | 1/1997 | Inazawa et al. | 156/643.1 |
| 5,605,637 A | 2/1997 | Shan et al. | 216/71 |
| 5,618,382 A | 4/1997 | Mintz et al. | 216/64 |
| 5,627,435 A | 5/1997 | Jansen et al. | 315/111.21 |
| 5,654,679 A | 8/1997 | Mavretic et al. | 333/17.3 |
| 5,660,671 A | 8/1997 | Harada et al. | 156/345 |
| 5,661,669 A * | 8/1997 | Mozumder et al. | 702/84 |
| 5,662,770 A | 9/1997 | Donohoe | 438/716 |
| 5,674,321 A | 10/1997 | Pu et al. | 118/723 |
| 5,685,914 A | 11/1997 | Hills et al. | 118/723 |
| 5,705,019 A | 1/1998 | Yamada et al. | 156/345 |
| 5,707,486 A | 1/1998 | Collins | 156/643.1 |
| 5,710,486 A | 1/1998 | Ye et al. | 315/111.21 |
| 5,720,826 A | 2/1998 | Hayashi et al. | 136/249 |
| 5,733,511 A | 3/1998 | De Francesco | 422/186.05 |
| 5,770,922 A | 6/1998 | Gerrish et al. | 315/111.21 |
| 5,792,376 A | 8/1998 | Kanai et al. | 216/71 |
| 5,846,885 A | 12/1998 | Kamata et al. | 438/729 |
| 5,849,136 A | 12/1998 | Mintz et al. | 156/345 |
| 5,849,372 A | 12/1998 | Annaratone et al. | 427/569 |
| 5,855,685 A | 1/1999 | Tobe et al. | 118/723 |
| 5,858,819 A | 1/1999 | Miyasaka | 438/149 |
| 5,863,376 A | 1/1999 | Wicker et al. | 156/345 |
| 5,866,986 A | 2/1999 | Pennington | 315/111.21 |
| 5,868,848 A | 2/1999 | Tsukamoto | 118/723 |
| 5,885,358 A | 3/1999 | Maydan et al. | 118/723 |
| 5,889,252 A * | 3/1999 | Williams et al. | 219/121.54 |
| 5,904,799 A | 5/1999 | Donohoe | 156/345 |
| 5,914,568 A | 6/1999 | Nonaka | 315/111.21 |
| 5,929,717 A | 7/1999 | Richardson et al. | 333/17.3 |
| 5,936,481 A | 8/1999 | Fiji | 333/17.3 |
| 5,939,886 A | 8/1999 | Turner et al. | 324/464 |
| 5,942,074 A | 8/1999 | Lenz et al. | 156/345 |
| 5,971,591 A | 10/1999 | Vona et al. | 364/478.08 |
| 5,997,962 A | 12/1999 | Ogasawara et al. | 427/535 |
| 6,016,131 A | 1/2000 | Sato et al. | 343/895 |
| 6,043,608 A | 3/2000 | Samukawa et al. | 315/111.51 |
| 6,073,577 A | 6/2000 | Lilleland et al. | 118/723 |
| 6,089,182 A | 7/2000 | Hama | 118/723 |
| 6,093,457 A | 7/2000 | Okumura et al. | 427/569 |
| 6,095,084 A | 8/2000 | Shamouilian et al. | 118/723 E |
| 6,096,160 A | 8/2000 | Kadomura | 156/345 |
| 6,106,663 A | 8/2000 | Kuthi et al. | 156/345 |
| 6,110,395 A | 8/2000 | Gibson, Jr. | 216/67 |
| 6,113,731 A | 9/2000 | Shan et al. | 156/345 |
| 6,142,096 A | 11/2000 | Sakai et al. | 118/723 |
| 6,152,071 A | 11/2000 | Akiyama et al. | 118/723 |
| 6,155,200 A | 12/2000 | Horijke et al. | 118/723 |
| 6,162,709 A | 12/2000 | Raoux et al. | 438/513 |
| 6,174,450 B1 | 1/2001 | Patrick et al. | 216/61 |
| 6,188,564 B1 | 2/2001 | Hao | 361/234 |
| 6,213,050 B1 | 4/2001 | Liu et al. | 118/723 |
| 6,218,312 B1 | 4/2001 | Collins et al. | 438/723 |
| 6,245,190 B1 | 6/2001 | Masuda et al. | 156/345 |
| 6,251,216 B1 | 6/2001 | Okamura et al. | 156/345 |
| 6,262,538 B1 | 7/2001 | Keller | 315/111.21 |
| 6,290,806 B1 | 9/2001 | Donohoe | 156/345 |
| 6,291,999 B1 | 9/2001 | Nishimori et al. | 324/464 |
| 6,337,292 B1 | 1/2002 | Kim et al. | 438/787 |
| 6,346,915 B1 | 2/2002 | Okumura et al. | 343/701 |
| RE37,580 E | 3/2002 | Barnes et al. | 361/234 |
| 6,424,232 B1 | 7/2002 | Mavretic et al. | 333/17.3 |
| 6,449,568 B1 | 9/2002 | Gerrish | 702/60 |
| 6,451,703 B1 | 9/2002 | Liu et al. | 438/710 |
| 6,462,481 B1 | 10/2002 | Holland et al. | 315/111.21 |
| 6,528,751 B1 | 3/2003 | Hoffman et al. | 219/121.43 |
| 6,586,886 B1 | 7/2003 | Katz et al. | 315/111.21 |
| 6,652,712 B2 | 11/2003 | Wang et al. | 156/345.48 |
| 6,804,572 B1 | 10/2004 | Cooperberg et al. | 700/121 |
| 6,818,097 B2 | 11/2004 | Yamaguchi et al. | 156/345.47 |
| 7,138,767 B2 | 11/2006 | Chen et al. | 315/111.21 |
| 7,247,218 B2 | 7/2007 | Hoffman | 156/345.28 |
| 2002/0026251 A1* | 2/2002 | Johnson et al. | 700/67 |
| 2002/0108933 A1 | 8/2002 | Hoffman et al. | 219/121.43 |
| 2002/0142493 A1 | 10/2002 | Halliyal et al. | 438/14 |
| 2003/0003757 A1* | 1/2003 | Nallan et al. | 438/710 |
| 2003/0168427 A1 | 9/2003 | Flamm et al. | 216/2 |
| 2004/0235304 A1* | 11/2004 | Oh | 438/689 |
| 2005/0151544 A1* | 7/2005 | Mahoney et al. | 324/655 |
| 2006/0144518 A1 | 7/2006 | Kaji et al. | 156/345.43 |
| 2006/0226786 A1 | 10/2006 | Lin et al. | 315/111.21 |
| 2006/0278608 A1 | 12/2006 | Hoffman | 216/61 |
| 2006/0278609 A1 | 12/2006 | Hoffman | 216/61 |
| 2006/0278610 A1 | 12/2006 | Hoffman | 216/61 |
| 2006/0283835 A1 | 12/2006 | Hoffman | 216/59 |
| 2007/0029282 A1 | 2/2007 | Hoffman | 216/59 |
| 2007/0080138 A1 | 4/2007 | Hoffman et al. | 216/59 |
| 2007/0080139 A1 | 4/2007 | Hoffman et al. | 216/59 |
| 2007/0080140 A1 | 4/2007 | Hoffman et al. | 216/59 |
| 2007/0095788 A1 | 5/2007 | Hoffman et al. | 216/59 |

* cited by examiner

METHOD OF CHARACTERIZING A CHAMBER BASED UPON CONCURRENT BEHAVIOR OF SELECTED PLASMA PARAMETERS AS A FUNCTION OF SOURCE POWER, BIAS POWER AND CHAMBER PRESSURE

CROSS-REFERENCE TO RELATED APPLICATIONS

This application is a continuation-in-part of U.S. application Ser. No. 10/440,364, filed May 16, 2003 by Daniel Hoffman, entitled PLASMA DENSITY, ENERGY AND ETCH RATE MEASUREMENTS AT BIAS POWER INPUT AND REAL TIME FEEDBACK CONTROL OF PLASMA SOURCE AND BIAS POWER, issued as U.S. Pat. No. 7,247,218 on Jul. 24, 2007, and assigned to the present assignee.

BACKGROUND OF THE INVENTION

Plasma reactors employed in microelectronic circuit fabrication can etch or deposit thin film layers on a semiconductor substrate. In a plasma reactive ion etch process, the etch rate, ion density, wafer voltage and wafer current are critical in controlling etch selectivity, wafer heating, etch striations, ion bombardment damage, etch stopping, feature size and other effects. Such control becomes more critical as feature size decreases and device density increases. The main problem is that present techniques for measuring etch rate, ion density, wafer voltage and wafer current tend to be highly inaccurate (in the case of the wafer voltage) or must be performed by examining a test workpiece or wafer at the conclusion of processing (in the case of etch rate). There appears to be no accurate technique for measuring these parameters in "real time" (i.e., during wafer processing). As a result, the plasma reactor control parameters (source power, bias power, chamber pressure, gas flow rate and the like) must be selected before processing a current workpiece based upon prior results obtained by processing other workpieces in the chamber. Once target values for each of the reactor control parameters have been chosen to achieve a desired etch rate or a desired wafer voltage or a desired ion density, the target values must remain the same throughout the process step, and all efforts are dedicated to maintaining the chosen target values. If for example the chosen target value of one of the control parameters unexpectedly leads to a deviation from the desired processing parameter (e.g., etch rate), this error will not be discovered until after the current workpiece has been processed and then examined, and therefore the current workpiece or wafer cannot be saved from this error. As a result, the industry is typically plagued with significant losses in material and time.

A related problem is that plasma process evolution and design is slow and inefficient in that the discovery of optimal target values for the reactor control parameters of source power, bias power, chamber pressure and the like typically relies upon protracted trial and error methods. The selection of target values for the many reactor control parameters (e.g., source power, bias power, chamber pressure and the like) to achieve a particular etch rate at a particular wafer current (to control wafer heating) and at a particular wafer voltage (to control ion bombardment damage) and at a particular ion density (to control etch selectivity, for example) is a multi-dimensional problem. The mutual dependence or lack thereof among the various reactor control parameters (source power, bias power, chamber pressure, etc.) in reaching the desired target values of the process parameters (e.g., etch rate, wafer voltage, wafer current, ion density) is generally unknown, and the trial and error process to find the best target values for the reactor control parameters (bias and source power levels and chamber pressure) is necessarily complex and time consuming. Therefore, it is not possible to optimize or alter target values for the process parameters (e.g., etch rate, etc.) without a time-consuming trial and error process. Thus, real-time plasma process control or management has not seemed possible.

SUMMARY OF THE INVENTION

The invention involves a method of characterizing a plasma reactor chamber through the behavior of plasma parameters selected from a group comprising ion density, wafer voltage, etch rate, wafer current, as functions of chamber parameters of source power, bias power and chamber pressure. The method begins by performing two steps for each one of the selected chamber parameters. The first step consists of ramping the level of the one chamber parameter while sampling RF electrical parameters at an RF bias power input to said wafer support pedestal and computing from each sample of said RF electrical parameters the values of the plasma parameters. These values are stored with the corresponding levels of the one chamber parameter as corresponding chamber parameter data. The second step consists of deducing, from the corresponding chamber parameter data, a single variable function for each of the plural plasma parameters having said one chamber parameter as an independent variable. The method continues with constructing combinations of these functions that are three variable functions having each of the chamber parameters as a variable. Then, from each three-variable function, the method constructs a set of surfaces, each individual surface corresponding to a respective constant value of the corresponding plasma parameter and defining simultaneous values of all of the selected chamber parameters. These surfaces are stored in memory for later use in controlling the chamber during wafer processing.

BRIEF DESCRIPTION OF THE DRAWINGS

FIG. 27 depicts processes for constructing the single variable functions of the different plasma parameters in which the variable is the chamber parameter of plasma source power.

FIG. 28 depicts processes for constructing the single variable functions of the different plasma parameters in which the variable is the chamber parameter of plasma bias power.

FIG. 29 depicts processes for constructing the single variable functions of the different plasma parameters in which the variable is the chamber parameter of chamber pressure.

FIG. 30 depicts processes for constructing the single variable functions of the different plasma parameters in which the variable is the chamber parameter of inner magnet coil current.

FIG. 31 depicts processes for constructing the single variable functions of the different plasma parameters in which the variable is the chamber parameter of outer magnet coil current.

FIG. 32 depicts processes for constructing the single variable functions of the different plasma parameters in which the variable is the chamber parameter of gas flow rate or gas composition.

FIG. 33 depicts a process for producing contours of constant value for the plasma parameter of wafer voltage in the three dimensional control space.

FIG. 34 depicts a process for producing contours of constant value for the plasma parameter of etch rate in the three dimensional control space.

FIG. 35 depicts a process for producing contours of constant value for the plasma parameter of plasma ion density in the three dimensional control space.

FIG. 36 depicts a process for producing contours of constant value for the plasma parameter of wafer current in the three dimensional control space.

FIG. 40 depicts a process for producing contours of constant value for the plasma parameter of wafer voltage in the four dimensional control space.

FIG. 41 depicts a process for producing contours of constant value for the plasma parameter of etch rate in the four dimensional control space.

FIG. 42 depicts a process for producing contours of constant value for the plasma parameter of plasma ion density in the four dimensional control space.

FIG. 43 depicts a process for producing contours of constant value for the plasma parameter of wafer current in the four dimensional control space.

DETAILED DESCRIPTION OF THE INVENTION

Figure 1:
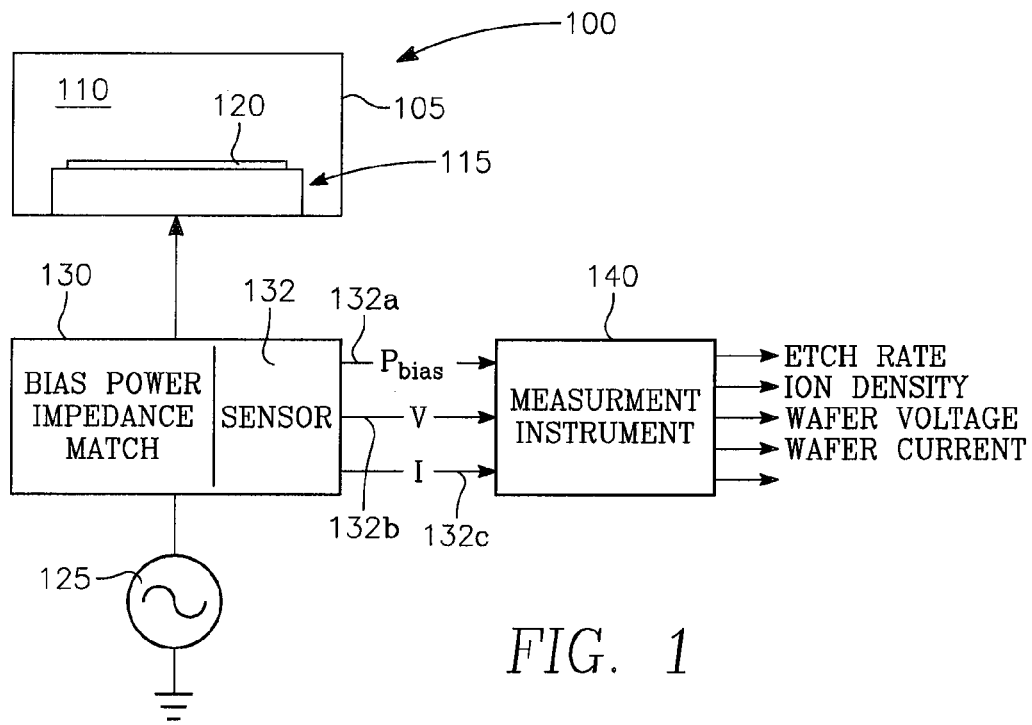
FIG. 1 illustrates a plasma reactor and a measurement instrument therefor.

Introduction:

The present description pertains to a plasma reactor having a plasma source power applicator (such as an overhead electrode or antenna) in which plasma bias power is applied to the wafer through the wafer support pedestal. I have discovered a measurement instrument (described below) that is the first one known to instantaneously and accurately measure wafer voltage, wafer current, ion density and etch rate. The measurement instrument uses only conventional electrical sensors at the bias power input that sense voltage, current and power at the output of an impedance match device coupled to the wafer support pedestal. The measurement instrument is therefore non-invasive of the plasma etch process occurring within the reactor chamber in addition to being accurate. The degree of accuracy is surprising, surpassing even the best known instruments and measurement techniques currently in use.

I have invented a plasma reactor having a feedback controller employing this same measurement instrument, in which plasma source power and plasma bias power are controlled in separate feedback control loops. In the bias power feedback control loop, plasma bias power is servoed or controlled to minimize the difference between a user-selected target value of the ion energy (or, equivalently, wafer voltage) and the actual ion energy sensed in real time by my measurement instrument. Simultaneously, in the source power feedback control loop, plasma source power is servoed or controlled to minimize the difference between a user-selected target value of the plasma ion density and the actual plasma ion density sensed in real time by my measurement instrument and a user-selected target value for the ion density. One surprising feature of my feedback controller is that a measurement at the bias power input is used to control the source power.

In addition, I have solved the problem of how to select the target values for ion density and ion energy. Because my measurement instrument provides instantaneous, accurate and simultaneous measurements of performance parameters such as wafer voltage (or, equivalently, ion energy), wafer current, ion density and etch rate, it has enabled me to observe accurately, for the first time, the real-time behavior of all these performance parameters simultaneously as a function of control parameters such as plasma source power, plasma bias power and others (e.g., chamber pressure, source power frequency, applied magnetic field, etc.). These observations have led to my discovery herein that the control parameters of plasma source power level and plasma bias power level affect the set of performance parameters (e.g., etch rate, ion energy, ion density) in the manner of a pair of independent variables. This discovery greatly simplifies the task of controlling plasma processing: by holding various other control parameters constant during processing (i.e., constant chamber pressure, constant gas flow rates, constant source power frequency and bias power frequency, etc.), the process is controlled entirely through the bias and source power levels. I have used this technique to parameterize all of the performance parameters (including etch rate, ion energy and others) as unique functions of two independent variables, namely source power level and bias power level. From this, I have generated curves in 2-dimensional source power-bias power space of constant etch rate, constant ion energy and constant ion density, for example. A process controller responds to user-selected ranges for the various performance parameters (etch rate, ion energy, ion density) using the curves of constant etch rate, constant ion density and constant ion energy to instantaneously find a target value for the source power level and the bias power level. This process controller provides the target values for the plasma source power level and plasma bias power level to the feedback controller referred to above.

As a result, a user need not have any knowledge of the control parameters (e.g., bias and source power levels) that may be required to realize a desired set of performance parameter values (e.g., etch rate) nor a corresponding understanding of the reactor's behavior in this regard. Instead, the user merely inputs to the control processor his set of desired performance parameter values or ranges, and the control processor instantly specifies target control parameter values (target source power and bias power values) to the feedback controller referred to above. Thereafter, control of the plasma process is entirely automatic, and can instantly accommodate any changes the user may introduce. For example, the user may specify different etch rates at different times during the same etch step, so that one etch rate prevails during the beginning of an etch process and another prevails toward the end of the process, for example. The user need not specify any control parameters, but only the results he desires (i.e., the performance parameters such as etch rate, etc.).

Instrument for Instantaneously Measuring Performance Parameters Including Etch Rate, Ion Density and Ion Energy:

Referring to FIG. 1, a plasma reactor 100 has a chamber enclosure 105 enclosing a vacuum chamber 110 in which a wafer support pedestal 115 supports a semiconductor wafer 120 being processed. Plasma RF bias power from an RF bias power generator 125 is applied through an impedance match circuit 130 to the wafer support pedestal 115. Conventional sensing circuits 132 within the impedance match circuit 130 have three output terminals 132a, 132b, 132c providing respective signals indicating the power ($P_{bias}$), voltage (V) and current (I) furnished at the output of the impedance match circuit 130 to the wafer support pedestal 115. A measurement instrument 140, which is the measurement instrument referred to above in this specification, uses the signals from the output terminals 132a, 132b, 132c to measure, simultaneously, etch rate on the wafer 120, ion energy at the wafer surface (or equivalently, wafer voltage), ion density in the reactor chamber and electric current through the wafer 120. The measurement instrument 140 employs processes based upon an electrical model of the reactor 100. This model is illustrated in FIG. 2.

Figure 2:
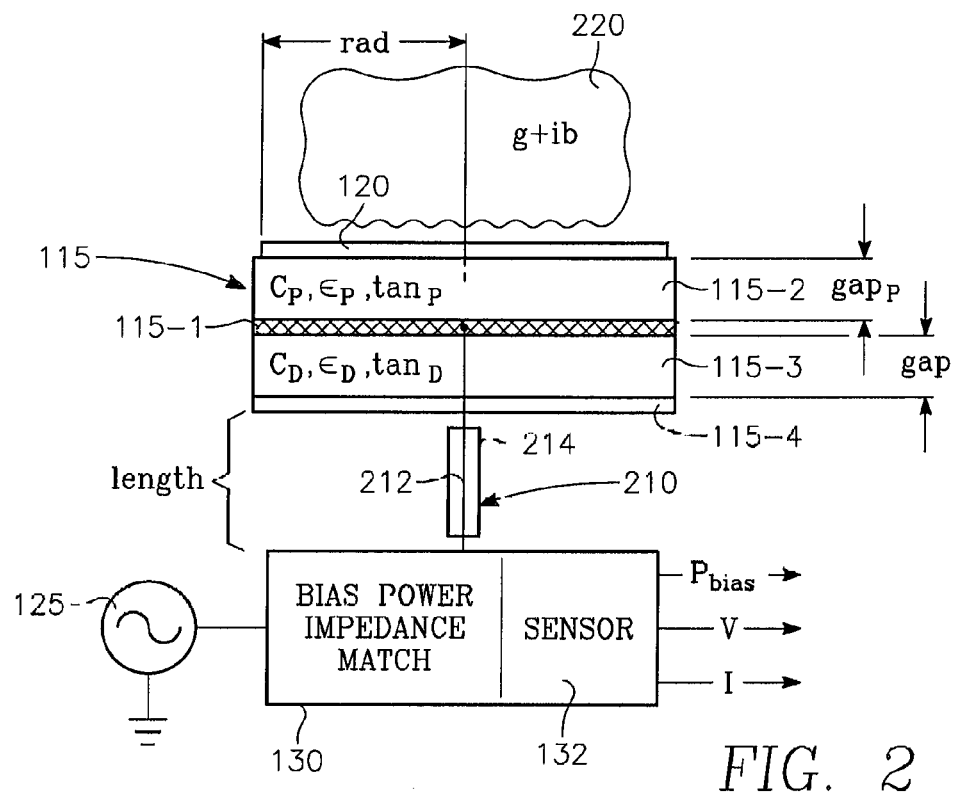
FIG. 2 illustrates an electrical model of the plasma reactor employed by the measurement instrument.

FIG. 2 depicts the plasma reactor of FIG. 1 in greater detail, so that the individual elements of the wafer support pedestal 115 are visible, including an electrode 115-1, a thin overlying dielectric (e.g., ceramic) layer 115-2, an underlying dielectric (e.g., ceramic) layer 115-3, and a conductive (e.g., aluminum) planar ground plate 115-4 at the bottom of the pedestal 115. The electrode 115-1 takes the form of a conductive grid in the illustrated embodiment, and may be implemented in various forms such as a conductive solid plate or as a conductive mesh, for example. While the electrode 115-1 will hereinafter be referred to as a conductive grid, the term "grid" as employed in this specification refers to all forms that the electrode 115-1 may take, such as a conductive solid plate, or a conductive mesh, or a conductive screen, or a form combining aspects of any or all of the foregoing forms, for example. Also visible in FIG. 2 is a coaxial cable 210 connecting the output of the impedance match circuit 130 to the grid 115-1. The coaxial cable 210 has an inner conductor 212 and an outer conductor 214. An electrical model with parameters depicted in FIG. 2 characterizes the electrical properties of the plasma reactor 100, which are readily determined using conventional techniques. Specifically, the coaxial transmission line or cable 210 is characterized by three quantities: (1) its length, (2) $Z_{ch}$, its characteristic impedance, and (3) $V_{ch}$, its complex phase velocity in the transmission line equation. The wafer support pedestal 115 is characterized by electrical properties of the overlying and underlying dielectric layers 115-2 and 115-3. Specifically, the underlying dielectric layer 115-3 has a capacitance $C_D$, which is a function of (1) the dielectric constant, $\in_D$, of the dielectric layer 115-3, and (2) the conductive loss component of the dielectric layer 115-3, $\tan_D$, (3) the thickness, gap, of the dielectric layer 115-3 and (4) the radius of the wafer 120. The overlying dielectric layer 115-2 has a capacitance $C_p$ which is a function of (1) the thickness, $gap_P$, of the dielectric layer 115-2, (2) the dielectric constant, $\in_P$, of the dielectric layer 115-2 and (3) the conductive loss component of the dielectric layer 115-2, $\tan_P$. The plasma 220 is characterized by an admittance $Y_{plasma}$ (to RF ground such as the interior chamber walls or ceiling) that consists of a real part (the conductance g) and an imaginary part (the susceptance b). Each of these electrical parameters has a role in the operation of the measurement instrument 140.

Figure 3:
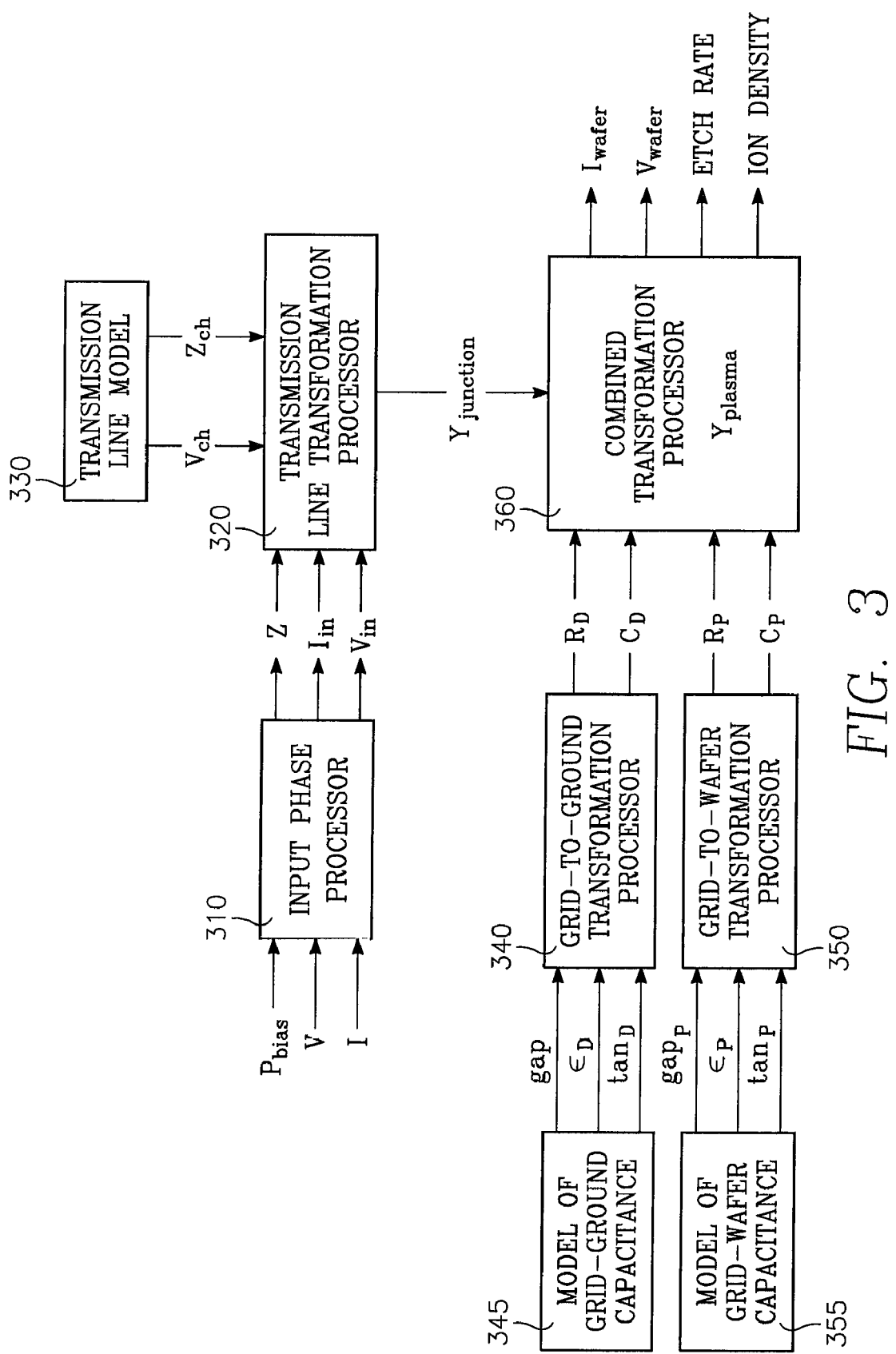
FIG. 3 illustrates the structure of the measurement instrument of FIG. 1.

FIG. 3 illustrates the structure of the measurement instrument 140 of FIG. 1. An input phase processor 310 receives the $P_{bias}$, V and I signals from the impedance match sensing circuit 132 of FIG. 1 and produces respective signals indicating a complex impedance Z, a complex input current $I_{in}$ and a complex input voltage $V_{in}$ at the near end of the coaxial cable 210 (i.e., the end nearest the impedance match circuit 130). A transmission line transformation processor 320 uses the characteristic impedance $Z_{ch}$ and the complex loss coefficient $V_{ch}$ (in the transmission line equation) from an electrical model 330 of the coaxial cable 210 to transform from Z, $I_{in}$ and $V_{in}$ at the near cable end to an admittance $Y_{junction}$ at the far cable end, i.e., at the junction between the coaxial cable 210 and the grid 115-1. A grid-to-ground transformation processor 340 takes radius, gap, $\in_D$ and $\tan_D$ from a model 345 of the grid-to-ground capacitance and produces a dielectric resistance $R_D$ and dielectric capacitance $C_D$. A grid-to-wafer transformation processor 350 takes radius, $gap_P$, $\in_P$ and $\tan_P$ from a model 355 of the grid-to-wafer capacitance and produces a plasma resistance $R_P$ and a plasma capacitance $C_P$. A combined transformation processor 360 accepts the outputs of all the other processors 320, 340, 350 and computes the admittance $Y_{plasma}$ through the plasma from the wafer to RF ground and computes the wafer voltage $V_{wafer}$ (or ion energy). From the plasma admittance and from the wafer voltage, the following quantities are computed: wafer current $I_{wafer}$, the etch rate and the ion density.

In summary, electrical measurements are made at the output of the impedance match circuit 130. The transmission line transformation processor 320 transforms these measurements at the near end of the cable 210 to an admittance at the far end. The grid to ground transformation processor 340 provides the transformation from the ground plane 115-4 near the far end of the cable to the conductive grid 115-1. The grid-to-wafer transformation processor 350 provides the transformation from the conductive grid 115-2 to the wafer 120. Using all of the foregoing transformations, the combined transformation processor 360 provides the transformation across the plasma in the form of the plasma admittance. From the plasma admittance, various performance parameters such as etch rate and plasma ion density are computed.

The transmission line model 330, the model of the grid-to-ground capacitance 345 and the model 355 of the grid-to-wafer capacitance are not necessarily a part of the measurement instrument 140. Or, they may be memories within the measurement instrument 140 that store, respectively, the coaxial cable parameters ($V_{ch}$ and $Z_{ch}$), the grid-to-ground capacitance parameters (gap, $\in_D$, $\tan_D$ and radius) and the grid-to-wafer capacitance parameters ($gap_P$, $\in_P$, $\tan_P$ and radius).

Figure 4:
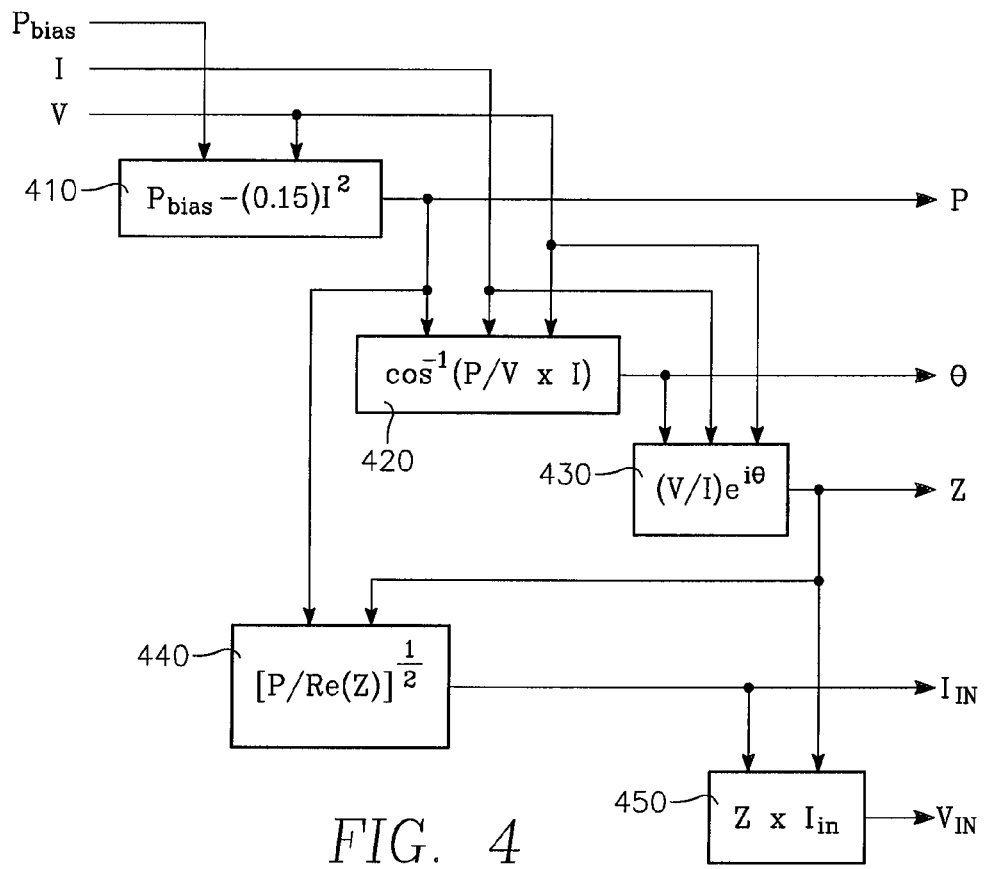
FIG. 4 illustrates an input phase processor of the measurement instrument of FIG. 3.

FIG. 4 illustrates the structure of the input phase processor 310 of FIG. 3. A delivered power arithmetic logic unit (ALU) 410 computes delivered power P from the outputs I and $P_{bias}$ from the impedance match sensing circuit 132 as $P_{bias}-(0.15)I^2$. A phase angle ALU 420 computes phase angle θ from the delivered power P and from V and I as $\cos^{-1}(P/VHI)$. An impedance ALU 430 computes the complex impedance Z as $(V/I)e^{j\theta}$, where $i=(-1)^{1/2}$. An input current ALU 440 computes the input current $I_{in}$ to the coaxial cable 210 as $[P/Re(Z)]^{1/2}$. An input voltage ALU 450 computes the input voltage $V_{in}$ to the coaxial cable 210 as $ZHI_{in}$.

Figure 5:
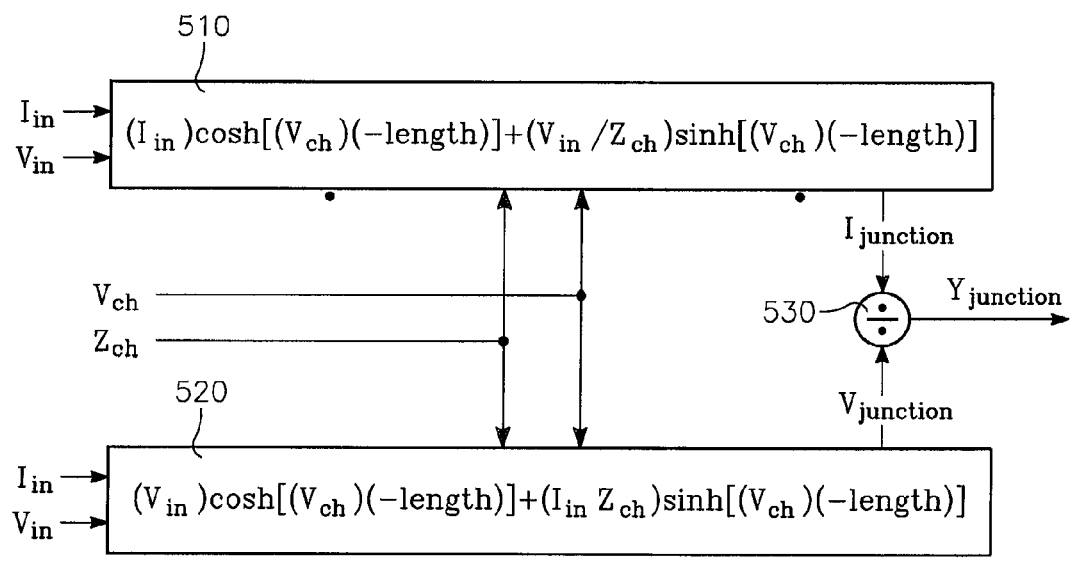
FIG. 5 illustrates a transmission line transformation processor in the measurement instrument of FIG. 3.

FIG. 5 illustrates the structure of the transmission line transformation processor 320 of FIG. 3. The transmission line processor receives $I_{in}$ and $V_{in}$ as inputs from the input phase processor 310 of FIG. 4 and uses the transmission line model parameters $V_{ch}$ and $Z_{ch}$ (from the transmission line model or memory 330 of FIG. 3) to compute the admittance $Y_{junction}$ as follows: A junction current ALU 510 computes the current $I_{junction}$ at the junction of the coaxial cable 210 and the grid 115-1 (FIG. 1) as:

$(I_{in})\cosh[(V_{ch})(-\text{length})]+(V_{in}/Z_{ch})\sinh[(V_{ch})(-\text{length})]$.

A junction voltage ALU 520 computes the voltage $V_{junction}$ at the junction between the coaxial cable 210 and the grid 115-1 as:

$(V_{in})\cosh[(V_{ch})(-\text{length})]+(I_{in}Z_{ch})\sinh[(V_{ch})(-\text{length})]$.

A divider 530 receives $I_{junction}$ and $V_{junction}$ computes $Y_{junction}$ as $I_{junction}/V_{junction}$. It should be noted that each of the electrical quantities in the foregoing computations (current, voltage, impedance, admittance, etc.) is a complex number having both a real part and an imaginary part.

Figure 6:
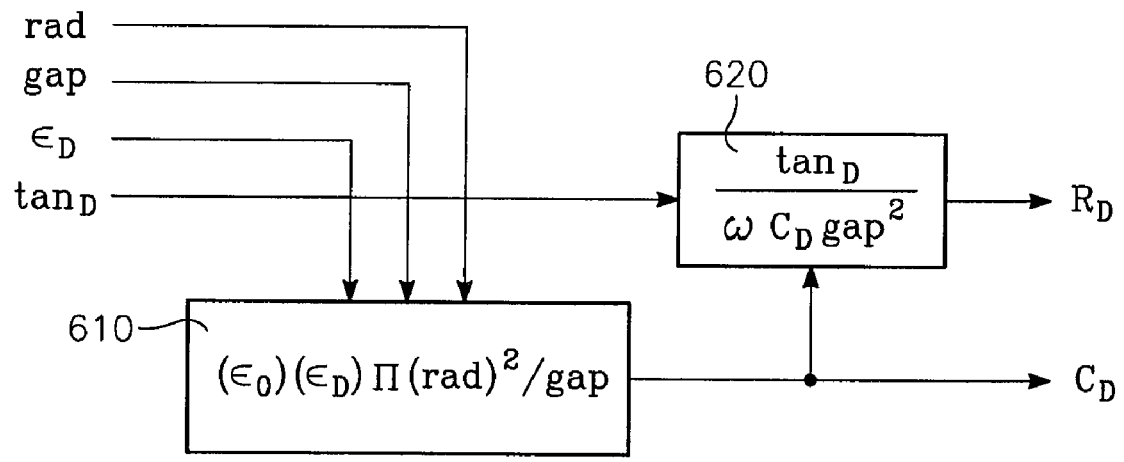
FIG. 6 illustrates a grid-to-ground transformation processor in the measurement instrument of FIG. 3.

FIG. 6 illustrates the structure of the grid-to-ground transformation processor 340 of FIG. 3. The grid-to-ground transformation processor 340 receives the parameters gap, $\in_D$, $\tan_D$ and rad (the wafer radius) from the grid-to-ground model or memory 345 of FIG. 3 computes the dielectric resistance $R_D$ and the dielectric capacitance $C_D$. The dielectric capacitance $C_D$ is computed by a CD ALU 610 as follows:

$(\in_0)(\in_D)\pi(\text{rad})^2/\text{gap}$ where $\in_0$ is the electrical permittivity of free space. An RD ALU 620 uses the value of $C_D$ from the CD ALU 610 and computes the dielectric resistance $R_D$ as follows:

$(\tan_D)/(\omega C_D \text{gap}^2)$ where ω is the angular frequency of the bias RF generator 125 of FIG. 2.

Figure 7:
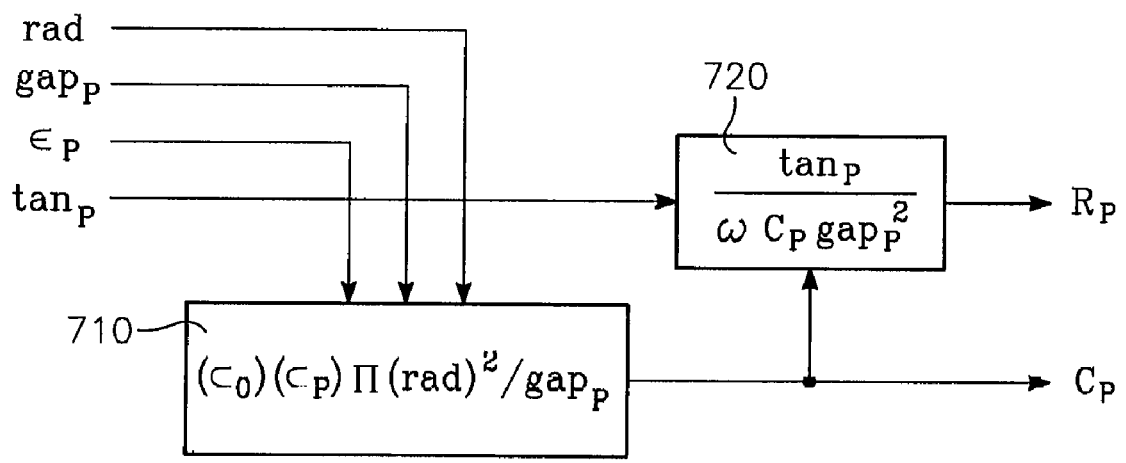
FIG. 7 illustrates a grid-to-wafer transformation processor in the measurement instrument of FIG. 3.

FIG. 7 illustrates the structure of the grid-to-wafer transformation processor 350 of FIG. 3. The grid-to-wafer transformation processor 350 receives the parameters $gap_P$, $\in_P$, $\tan_P$ and rad from the grid-to-wafer model or memory 355 of FIG. 3 and computes the plasma resistance $R_P$ and the plasma capacitance $C_P$. The plasma capacitance $C_P$ is computed by a CP ALU 710 as follows:

$(\in_0)(\in_P)\pi(\text{rad})^2/\text{gap}_P$ where $\in_0$ is the electrical permittivity of free space. An RP ALU 720 uses the value of $C_P$ from the CP ALU 710 and computes the plasma resistance $R_P$ as follows:

$(\tan_P)/(\omega C_P \text{gap}_D^2)$ where ω is the angular frequency of the bias RF generator 125 of FIG. 2.

Figure 8:
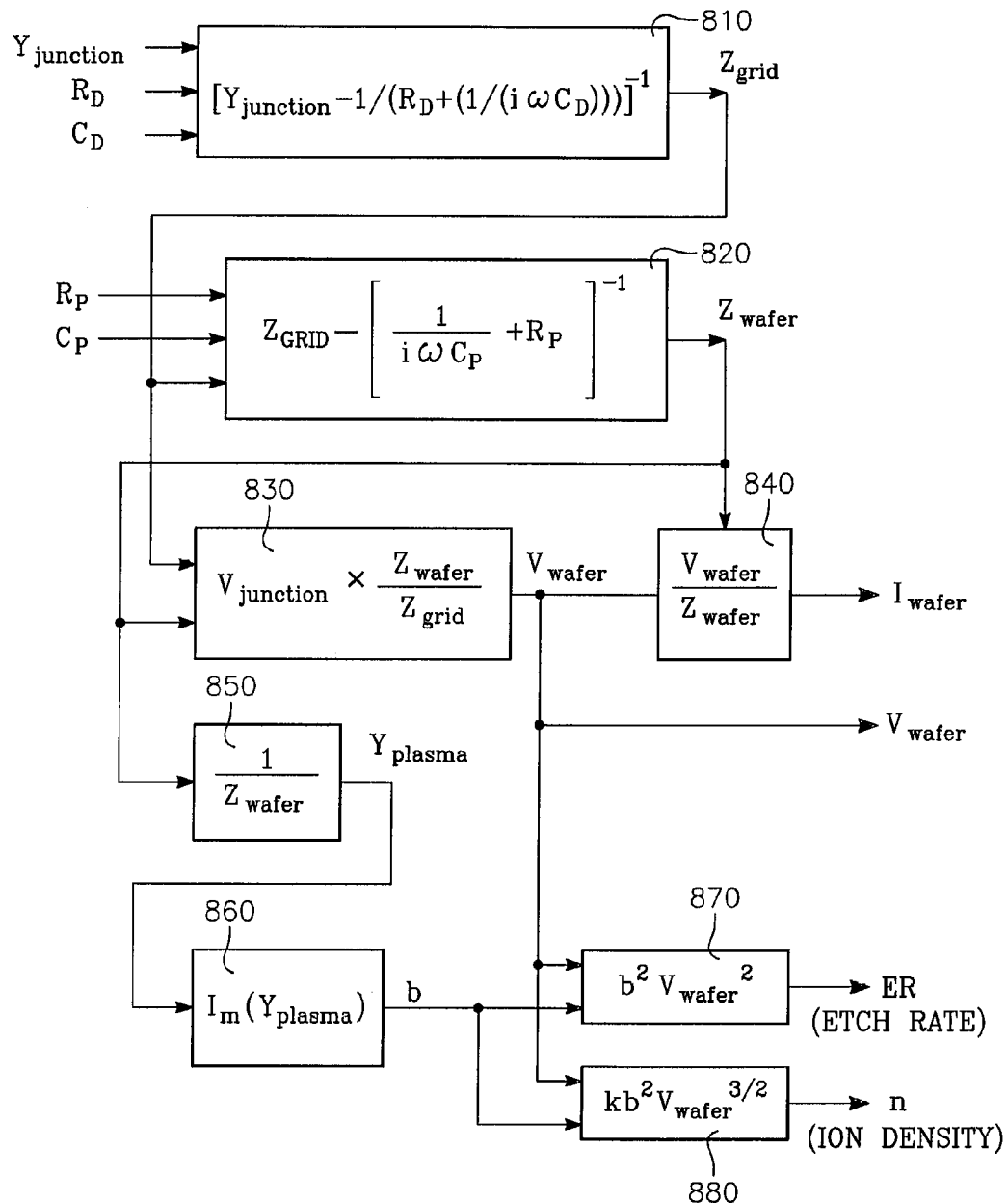
FIG. 8 illustrates a combined transformation processor in the measurement instrument of FIG. 3.

FIG. 8 illustrates the structure of the combined transformation processor 360 of FIG. 3. The combined transformation processor 360 receives the parameters $R_D$, $C_D$ from the processor 340 of FIG. 3, receives the parameters $R_P$, $C_P$ from the processor 350 of FIG. 3 and receives the parameter $Y_{junction}$ from the processor 320 of FIG. 3. A grid impedance ALU 810 computes $Z_{grid}$ (the impedance at the grid 115-1 of FIG. 2) as follows:

$[Y_{junction}-1/(R_D+(1/(i\omega C_D)))]^{-1}$

A wafer impedance ALU 820 uses the output of the grid impedance ALU 810 to compute $Z_{wafer}$ (the impedance at the wafer 120 of FIG. 2) as follows:

$$Z_{grid} = 1/(R_P + (1/(i\omega C_P)))$$

A wafer voltage ALU 830 uses the outputs of both ALU=s 810 and 820 and $V_{junction}$ from the divider 530 of FIG. 5 to compute the voltage on the wafer 120 of FIG. 2, $V_{wafer}$, as $V_{junction} Z_{wafer}/Z_{grid}$. A wafer current ALU 840 uses the outputs of the ALU=s 820 and 830 to compute the wafer current $I_{wafer}$ as $V_{wafer}/Z_{wafer}$. An admittance ALU 850 uses the output of the ALU 820 to compute the admittance of the plasma, $Y_{plasma}$, as $1/Z_{wafer}$. A susceptance ALU 860 uses the output of the ALU 850 to compute the plasma susceptance, b, as $Im(Y_{plasma})$. An etch rate ALU 870 uses the wafer voltage from the ALU 830 and the susceptance from the ALU 860 to compute the etch rate as $b^2 V_{wafer}^2$. An ion density ALU 880 uses the same outputs to compute the ion density as $kb^2 V_{wafer}^{3/2}$, where k is a constant given by:

$$(2^{3/2}/3^2)(1/[q\in_0 A^2 \pi^2 f^2 T_e^2])$$

where q is the electron charge, A is the area of the wafer 120 of FIG. 2, f is the frequency of the bias power generator 125 of FIG. 2 and $T_e$ is the electron temperature in volts. This relationship between ion density and the measured quantities b and $V_{wafer}$ follows from an approximate formula for the plasma susceptance and a formula for the plasma sheath thickness. The plasma susceptance may be approximated as $\in A\omega/\lambda$, where $\in$ is the electrical permittivity within the plasma, A is the electrode area, $\omega$ is the angular frequency of the bias power signal and $\lambda$ is the plasma sheath thickness. The plasma sheath thickness may be approximated as $[T_e/(q\eta)]^{1/2}[2V_{wafer}/T_e]^{3/4}$, where $T_e$ is electron temperature, q is the electron charge and $\eta$ is ion density. Substituting the expression for sheath thickness into the expression for the susceptance and solving for ion density yields an expression for ion density as a function of susceptance and wafer voltage.

Figure 9:
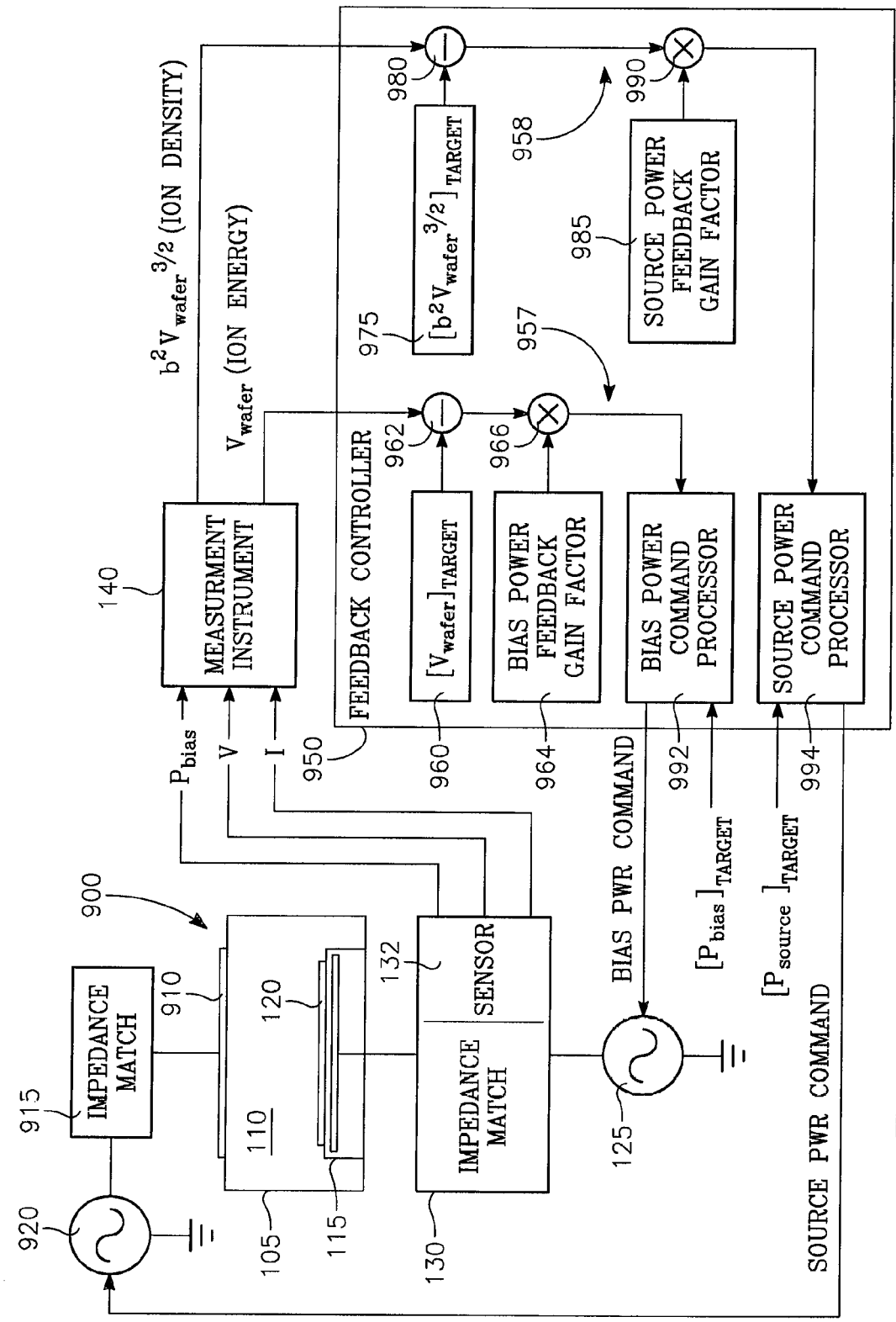
FIG. 9 illustrates a process feedback control system for a plasma reactor that includes the measurement instrument of FIG. 3.

Process Feedback Control System:

FIG. 9 illustrates a process feedback control system that uses the measurement instrument 140 of FIG. 3. A plasma reactor 900 includes all of the features of the plasma reactor 100 of FIG. 1, and in addition includes an overhead RF source power applicator 910 connected through an impedance match circuit 915 to an RF source power generator 920. The RF source power applicator 910 may be, for example, a ceiling electrode that is insulated from the grounded chamber enclosure 105. The power level of the RF plasma source power generator 920 generally controls the plasma ion density while the power level of the RF plasma bias power generator 125 generally controls the ion energy at the wafer surface. The measurement instrument 140 receives the power, voltage and current outputs from the sensor circuit 132 of the impedance match circuit 130. From these quantities, the measurement instrument 140 computes the plasma susceptance b and computes the wafer voltage $V_{wafer}$, which is output as a measurement signal. These computations are carried out in the manner described above with reference to FIG. 5. The measurement instrument 140 can then compute the ion density and/or the etch rate from b and $V_{wafer}$, in the manner described above with reference to FIG. 5. At least two of the three measurement signals thus produced by the measurement instrument 140 can be used in a feedback control loop.

A feedback controller 950 uses the measurement signals from the measurement instrument 140 to create feedback signals to control the power level of the RF plasma bias power generator 125 and the power level of the RF plasma source power generator 920. The ion energy at the wafer surface, which is equivalent to the wafer voltage $V_{wafer}$, is directly controlled by the power level of the bias power generator 125. Therefore, the wafer voltage measurement signal from the measurement instrument 140 (i.e., $V_{wafer}$ from the ALU 830 of FIG. 8) is used by the feedback controller 950 to control the bias power generator 125 in a bias power feedback control loop 957. The source power generator 920, on the other hand, directly controls plasma ion density. Therefore, plasma ion density measurement signal from the measurement instrument 140 (i.e., $kb^2 V_{wafer}^{3/2}$ from the ALU 880 of FIG. 8) is used by the feedback controller 950 to control the source power generator 920 in a source power feedback control loop 958.

The bias power feedback control loop 957 includes a memory 960 that stores a selected or desired target value of the wafer voltage or ion energy, $[V_{wafer}]_{TARGET}$. A subtractor 962 subtracts this target value from the sensed wafer voltage $V_{wafer}$ to produce an error signal. The gain of the bias power feedback loop 957 is determined by a bias power feedback gain factor stored in a memory 964. A multiplier 966 multiplies the error signal from the subtractor 962 by the gain factor in the memory 964 to produce a correction signal used to control the power level of the bias power generator 125. The path of the bias power feedback control loop 957 is completed by the V, I and $P_{bias}$ signals applied to the measurement instrument 140 to produce the measurement signal $V_{wafer}$ representing the wafer voltage.

The source power feedback control loop receives from the measurement instrument 140 the sensed ion density value $b^2 V_{wafer}^{3/2}$. A memory 975 stores a selected or desired target value of the ion density, $[b^2 V_{wafer}^{3/2}]_{TARGET}$. A subtractor 980 computes the difference between the measured ion density and the ion density target value to produce an error signal. The gain of the source power feedback control loop 958 is determined by a source power feedback gain factor stored in a memory 985. A multiplier 990 multiplies the error signal from the subtractor 980 by the gain factor from the memory 985 to produce a correction signal. This correction signal is used to control the power level of the RF source power generator 920. The path of the source power feedback control loop 958 is completed by the V, I and $P_{bias}$ signals applied to the measurement instrument 140 to produce the measurement signal $b^2 V_{wafer}^{3/2}$ representing the ion density.

At the start of a plasma process step such as an etch process step, initial values for the power levels $P_S$ and $P_B$ of the RF source power generator 920 and the RF bias power generator 125, respectively, can be specified. If these initial values are sufficiently close to the optimum values, this feature can avoid unduly large initial corrections by the feedback controller 950. For this purpose, the bias power feedback loop 957 includes a bias power command processor 992 coupled to receive the feedback correction signal from the multiplier 957 and to receive a target value for the bias power, $[P_{bias}]_{TARGET}$. Before plasma processing begins, there is no feedback signal, and the bias power command processor 992 sets the power level of the bias power generator 125 to the initial target value $[P_{bias}]_{TARGET}$. Once processing begins and a feedback signal is present, the bias power command processor 992 controls the bias power in accordance with the feedback correction signal from the multiplier 966 rather than the bias power target value.

Similarly, the source power feedback loop 958 includes a source power command processor 994 coupled to receive the feedback correction signal from the multiplier 990 and to receive a target value for the source power, $[P_{source}]_{TARGET}$. Before plasma processing begins, there is no feedback signal, and the source power command processor 994 sets the power level of the source power generator 920 to the initial target value $[P_{source}]_{TARGET}$. Once processing begins and a feedback signal is present, the source power command processor 994 controls the source power in accordance with the feedback correction signal from the multiplier 990 rather than the source power target value.

In accordance with another aspect, the source and bias power command processors 992, 994 can be instructed by the user to ignore their respective feedback control loops 957, 958 throughout much or all of the process step and instead maintain the source and bias power levels at the specified target values $[P_{source}]_{TARGET}$ and $[P_{bias}]_{TARGET}$. The user can change these values from time to time during processing.

Figure 10:
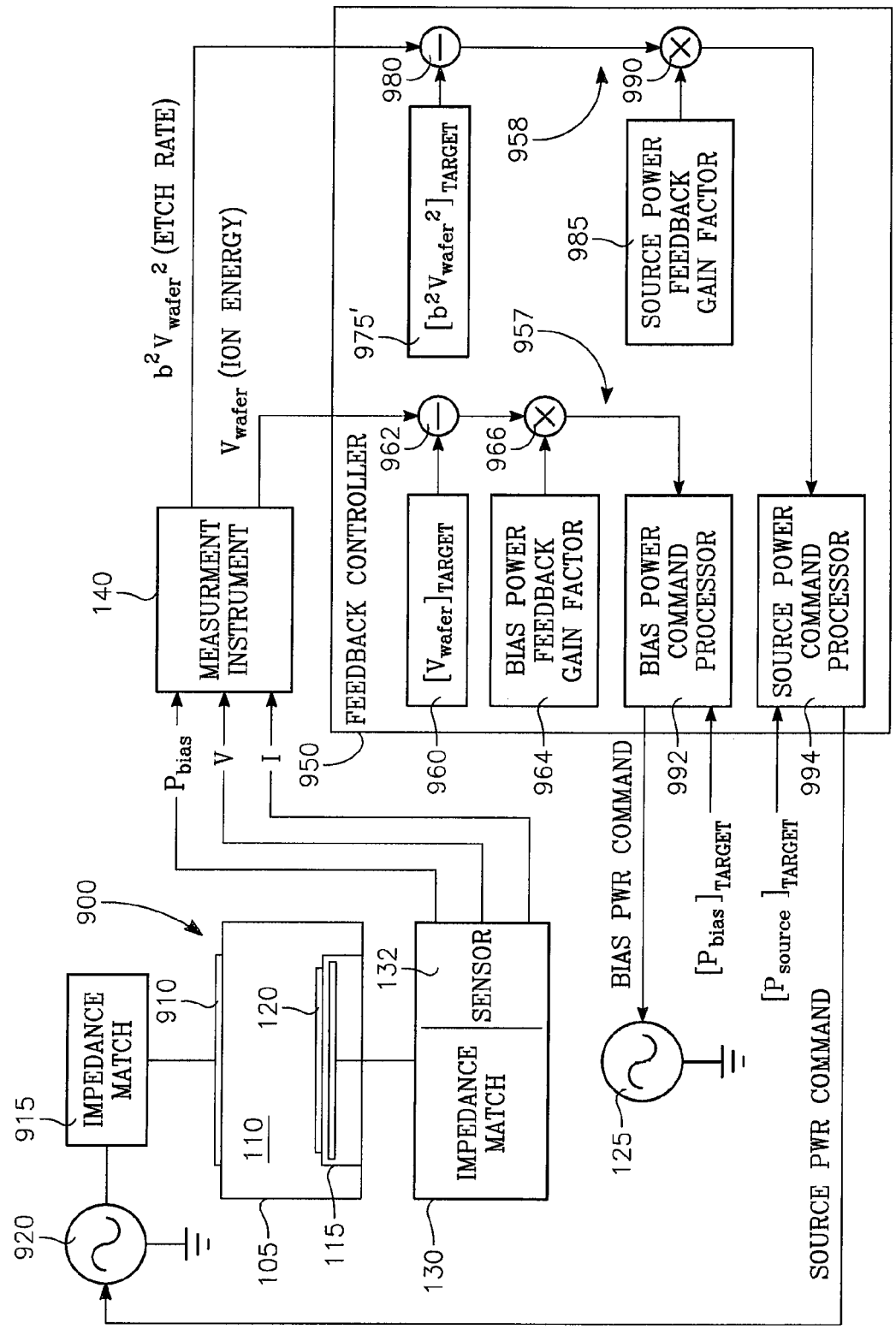
FIG. 10 illustrates an alternative implementation of the process feedback control system.

Referring to FIG. 10, the feedback control processor 950 may employ the etch rate rather than the ion density as the measured parameter in the source power feedback control loop 958. In the measurement instrument 140, the etch rate measurement signal is taken from the ALU 870 of FIG. 8 that computes $b^2 V_{wafer}^2$. In FIG. 10, a memory 975' (in lieu of the memory 975 of FIG. 9) stores a target value of the etch rate, $[b^2 V_{wafer}^2]_{TARGET}$. The subtractor 980 operates as described with reference to FIG. 9 to produce an error signal. The remainder of the source power feedback control loop of FIG. 10 generally is the same as in FIG. 9.

Process Set Point Controller:

The feedback controller 950 requires a number of target values for various process control parameters. Specifically the feedback controller 950 of FIG. 9 has a memory 975 storing the target value for the ion density, $[b^2 V_{wafer}^{3/2}]_{TARGET}$, and a memory 960 storing the target value for the ion energy (or, equivalently, wafer voltage), $[V_{wafer}]_{TARGET}$. In the feedback controller of FIG. 10, the memory 975 is replaced by the memory 975' storing the target value for the etch rate, $[b^2 V_{wafer}^2]_{TARGET}$. In addition, the feedback controller 950 can employ initial target values $[P_{source}]_{TARGET}$ and $[P_{bias}]_{TARGET}$ for the source and bias power levels respectively to initialize the feedback controller 950, as discussed above. The selection or optimization of these target values can be left to the user=s efforts, which may involve an undue amount of trial and error and may be unreliable. Typically, a user who wishes to achieve certain process results (e.g., a certain etch rate, a certain ion energy, a reduction in etch processing artifacts such as striations, a reduction in heating due to wafer current, etc.) must conduct a time-consuming program of trial and error experiments to find the optimum process control parameters values to achieve the desired results. For this reason, the alteration of an existing process or the design of a new process must be undertaken over a very long development period.

Figure 11:
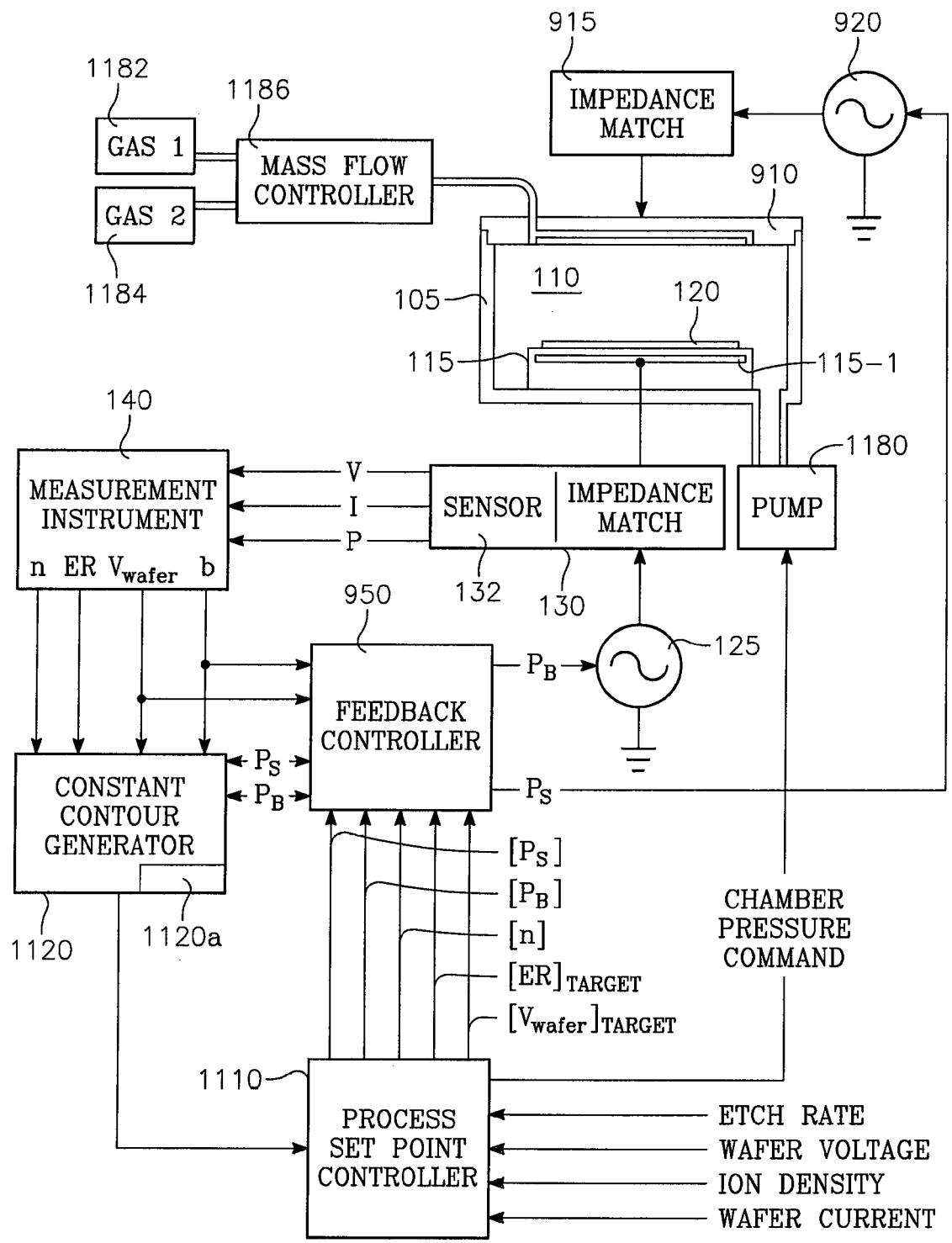
FIG. 11 illustrates the measurement instrument of FIG. 3, a constant contour generator and a process set point controller connected in a system with a plasma reactor.

In order to overcome this limitation, a process set point controller 1110 employed in the reactor of FIG. 11 automatically and quickly (or instantaneously) finds the optimum target values of process control parameters based upon the user's selection of values for various performance parameters. For example, the process set point controller 1110 may determine the target values $[P_{source}]_{TARGET}$ and $[P_{bias}]_{TARGET}$ based upon a desired etch rate and/or a desired wafer voltage or other performance parameter specified by the user. Thus, a new process recipe can be designed nearly instantaneously. For present plasma reactors, this can take place in milliseconds, but could be made to be as fast as microseconds if needed.

There are many process control parameters (i.e., characteristics of the reactor under direct user control such as chamber pressure, source and bias power levels, etc.) and many process performance parameters (i.e., characteristics of the plasma and process not susceptible of direct control such as etch rate, ion density, ion energy, wafer current, etc.). A user can specify any one or more of these performance parameters as an objective for a given process. Any one or group of or all of the control parameters can be used to achieve the desired levels of the performance parameters chosen by the user. The question is whether or not the effects of some of the control parameters might be dependent upon others of the control parameters in controlling the performance parameters chosen by the user. Thus, the problem of selecting the right set of control parameters to achieve the desired results in the chosen performance parameters is complex and there appears to be no particularly optimum choice.

However, I have discovered that the source power and the bias power control the performance parameters of interest and do so in an independent manner. That is, source power $P_{source}$ and bias power $P_{bias}$ are independent variables and may be thought of as orthogonal entities forming a two-dimensional control space in which control of the performance parameters may be exercised with such versatility that rio alteration of the other control parameters is required. This discovery greatly reduces the problem to only two variables.

Therefore, the following description will concern a control system in which the control parameters, with the exception of $P_{source}$ and $P_{bias}$, are held constant during processing. Thus, process control parameters including chamber pressure, gas composition, gas flow rate, source power frequency, bias power frequency, etc., are held constant. The source power and bias power levels ($P_{source}$ and $P_{bias}$) are varied to achieve desired values in a specified set of performance parameters (e.g., etch rate and ion density).

The problem of finding target values for the various parameters given a set of user-defined values for a chosen set of performance parameters is solved by the process set point controller 1110 superimposing a set of constant parameter contours in the two-dimensional $P_{source}$-$P_{bias}$ space referred to above. Such constant parameter contours are obtained from a constant parameter contour generator 1120 in FIG. 11. For example, contours of constant ion density (FIG. 12), contours of constant ion energy or wafer voltage (FIG. 13), and contours of constant etch rate (FIG. 14) are employed. How the constant parameter contour generator 1120 produces these contours using the measurement instrument 140 will be described later in this specification. The present description concerns their use by the process set point controller 1110.

Figure 12:
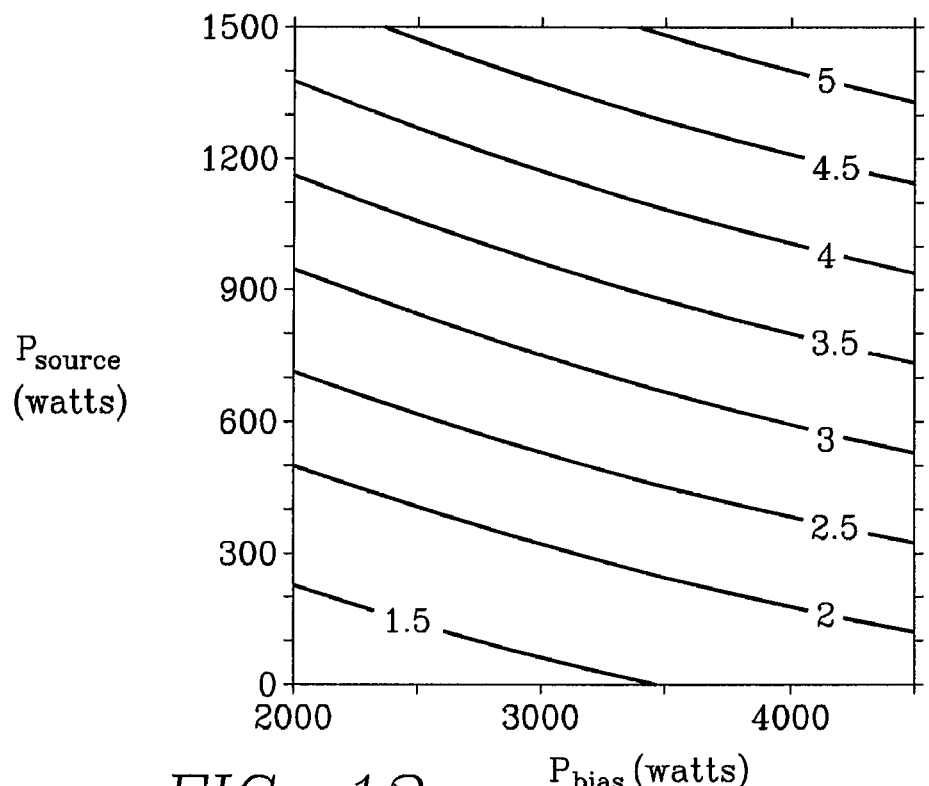
FIGS. 12, 13 and 14 illustrate different contours of constant performance parameter values produced by the system of FIG. 11.
Figure 13:
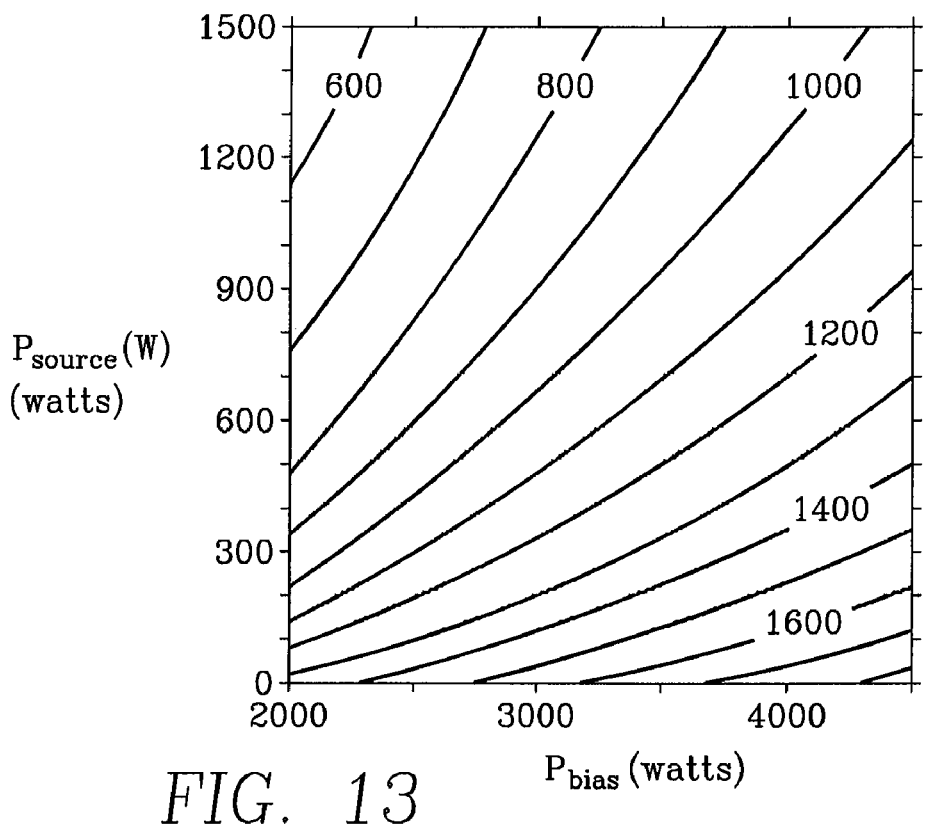
Figure 14:
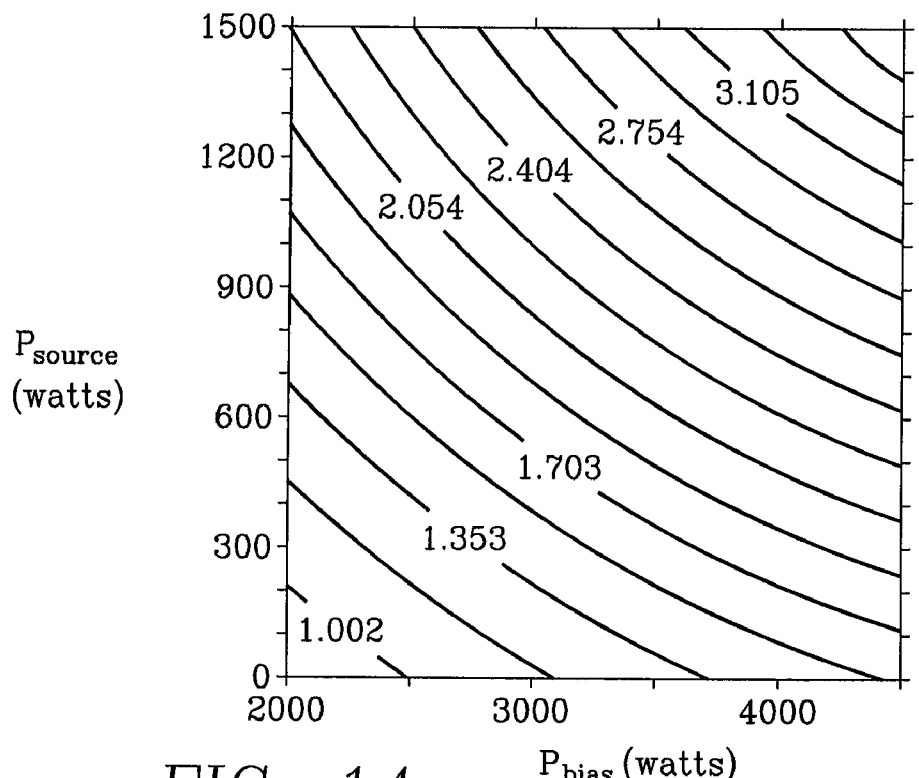

Referring to FIG. 12, a set of contours of constant plasma ion density in $P_{source}$-$P_{bias}$ space for a chamber pressure of 20 mT generally have a small negative slope and a small but positive first derivative $d(P_{source})/d(P_{bias})$. The top-most contour corresponds to a constant plasma density of $5 \times 10^{10}$ ions/cm$^3$ while the bottom contour corresponds to $1.5 \times 10^{10}$ ions/cm$^3$. The vertical axis ($P_{source}$) ranges from 0 to 1500 Watts while the horizontal axis ($P_{bias}$) ranges from 2000 to 4500 Watts. Referring to FIG. 13, a set of contours of constant wafer voltage for the same chamber pressure (20 mT) have a positive slope and range from 600 volts (at the top) to 1800 Volts (at the bottom). Referring to FIG. 14, a set of contours of constant etch rate (in arbitrary units, e.g., where k=1) have a large negative slope.

Figure 15:
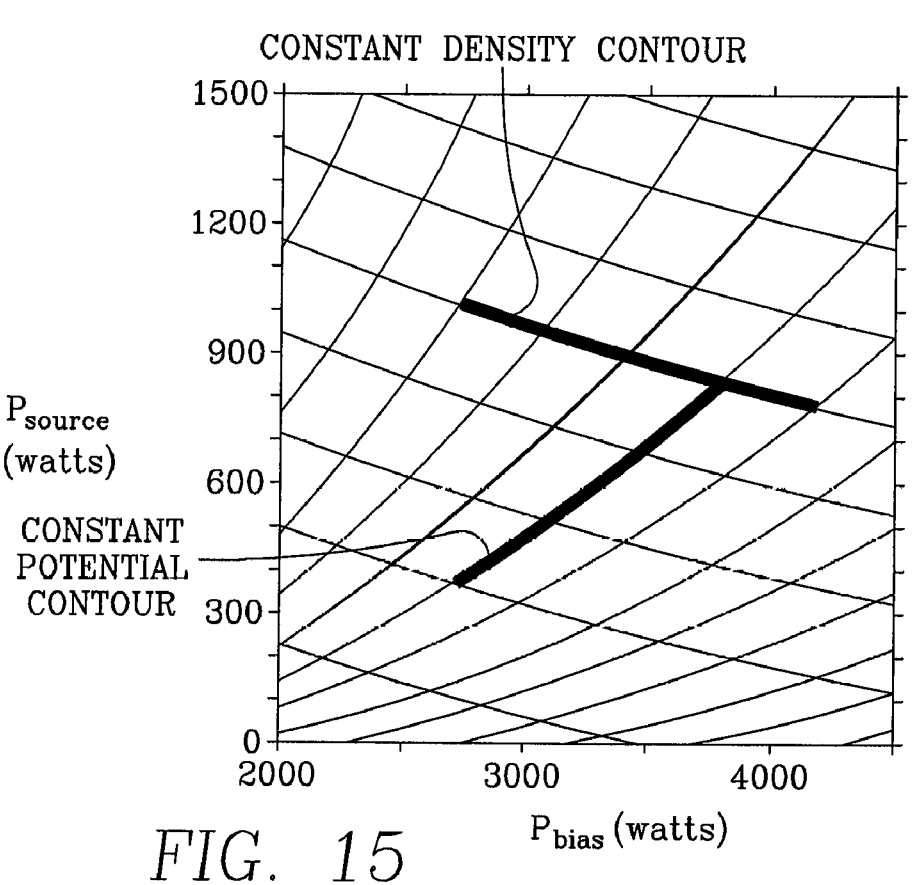
FIG. 15 illustrates a method of finding an optimal operating point at the intersection of different contours of constant parameter values.

The process set point controller 1110 determines how to simultaneously satisfy user-selected values of ion density, ion energy and etch rate. It does this by finding the intersection in $P_{source}$-$P_{bias}$ space of the corresponding contours of FIGS. 12-14. This intersection indicates the optimum target values for source and bias power, namely $[P_{source}]_{TARGET}$ and $[P_{bias}]_{TARGET}$. The problem is somewhat simpler if the user specifies values for only two performance parameters. For example, if the user specifies a wafer voltage of 1100 Volts and an ion density of $3.5 \text{H}10^{10}$ ions/cm$^3$, then the correct point in $P_{source}$-$P_{bias}$ space is found by superimposing the constant wafer voltage contour for 1100 volts from FIG. 12 and the constant density contour for $3.5 \text{H}10^{10}$ ions/cm$^3$ from FIG. 13 and finding their intersection in $P_{source}$-$P_{bias}$ space. This procedure is performed by the process set point controller 1110 and is illustrated in FIG. 15 in which the two curves intersect in $P_{source}$-$P_{bias}$ space at the point [850 W, 3750 W]. Therefore, in this example the user=s requirements are met by setting the source power level at 850 W and setting the bias power level at 3750 W. Thus, in this case the target values $[P_{source}]_{TARGET}$ and $[P_{bias}]_{TARGET}$ furnished to the source power command processor 994 and bias power command processer 992 of FIG. 9 are 850 Watts and 3750 Watts, respectively.

It should be noted that this deduction of the target values of source and bias power levels may also result in the deduction of a target value for other parameters whose values have not been specified or limited by the user. As an illustration, in the foregoing example, the user has not specified a particular etch rate. However, a target value for the etch rate satisfying the user-selected values for ion density and energy can be found by superimposing the contours of FIG. 14 onto FIG. 15 (or vice versa). The point [850 W, 3750 W] lies on the contour of a constant etch rate of 2.101 (in arbitrary units) of FIG. 14, as indicated by the AX@ symbol in that drawing. Therefore, if the feedback controller of FIG. 10 is employed, then the set point controller 1110 writes an etch rate target value of 2.101 in arbitrary units to the memory 975 of FIG. 10.

An advantage of this feature is that the contours of constant voltage, density, etch rate, etc., are characteristic of the reactor and generally do not change for given process conditions. They may therefore be determined by the constant parameter contour generator 1120 prior to processing and made available to the process set point controller 1110 constantly during use of the reactor, as indicated in FIG. 11. In this way, a target value for a particular parameter may be found instantly or whenever required in the manner illustrated in FIG. 15.

In operation, the bias power command processor 992 and the source power command processor 994 receive the target values $[P_{source}]_{TARGET}$ and $[P_{bias}]_{TARGET}$ from the process set point controller 1110 and receive feedback signals from the multipliers 958 and 957 respectively. During system initialization, the feedback signals are ignored, and the processors 992, 994 put the power levels of the RF generators 125, 920 to the target values $[P_{source}]_{TARGET}$ and $[P_{bias}]_{TARGET}$, respectively. After processing begins, the feedback signals are available and the processors 992, 994 can use the feedback control loops 957, 958 instead of the target values to control the source power and bias power levels. Alternatively, the power command processors 992, 994 may be programmed so that the target values $[P_{source}]_{TARGET}$ and $[P_{bias}]_{TARGET}$ determine the source and bias power levels not only at initialization but also during processing, while the feedback loops 957, 958 are ignored.

FIG. 11 shows that the user can apply to the process set point controller 1110 any one or a combination of user selected values for performance parameters, including etch rate, wafer voltage, ion density and wafer current. In response, the process set point controller 1110 uses the appropriate contours from the contour generator 1120 to produce not only source and bias power target values but, in some cases, target values for other parameters not limited or specified by the user, which may be a target value for the etch rate, the ion density, the ion energy or the wafer current. These target values are furnished to the feedback controller 950 for use in the manner described previously in this specification with reference to FIG. 9.

Figure 16:
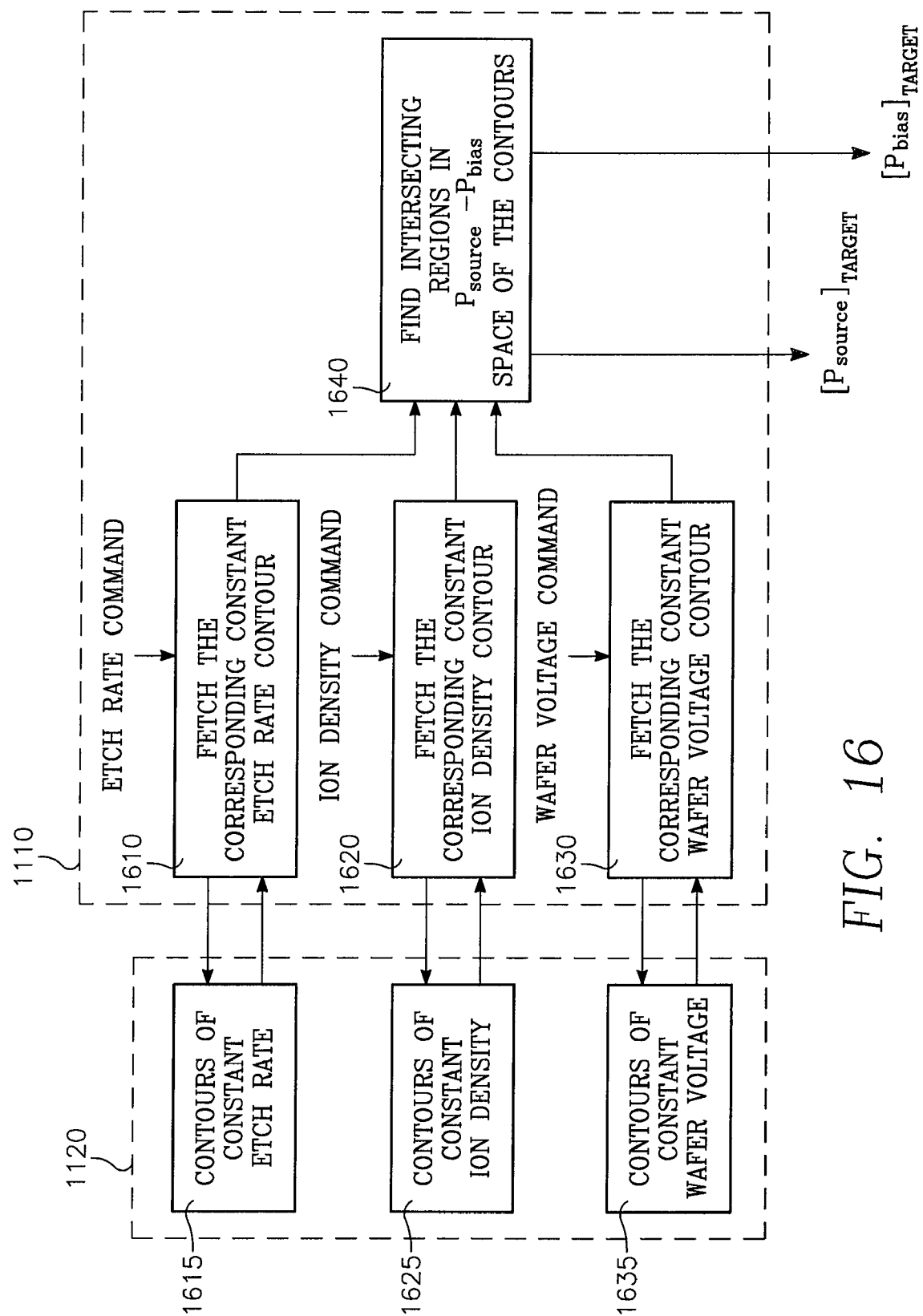
FIG. 16 illustrates the process set point controller in the system of FIG. 11.

FIG. 16 illustrates the structure and operation of the process set point controller 1110 of FIG. 11. A first logic unit 1610 receives an etch rate command (if any) from the user and fetches from a memory 1615 the corresponding contour of constant etch rate in the set of contours of constant etch rates previously generated by the contour generator 1120. A second logic unit 1620 receives an ion density command (if any) from the user and fetches from a memory 1625 the corresponding contour of constant ion density in the set of contours of constant ion density previously generated by the contour generator 1120. A third logic unit 1630 receives a wafer voltage (ion energy) command (if any) from the user and fetches from a memory 1635 the corresponding contour of constant wafer voltage in the set of contours of constant wafer voltage previously generated by the contour generator 1120. A fourth logic unit 1640 finds the intersection point in $P_{source}$-$P_{bias}$ space between any of the contours selected by the logic units 1610, 1620, 1630. This intersection point is output to the feedback controller 950 of FIG. 11 as $[P_{source}]_{TARGET}$, $[P_{bias}]_{TARGET}$.

Figure 17:
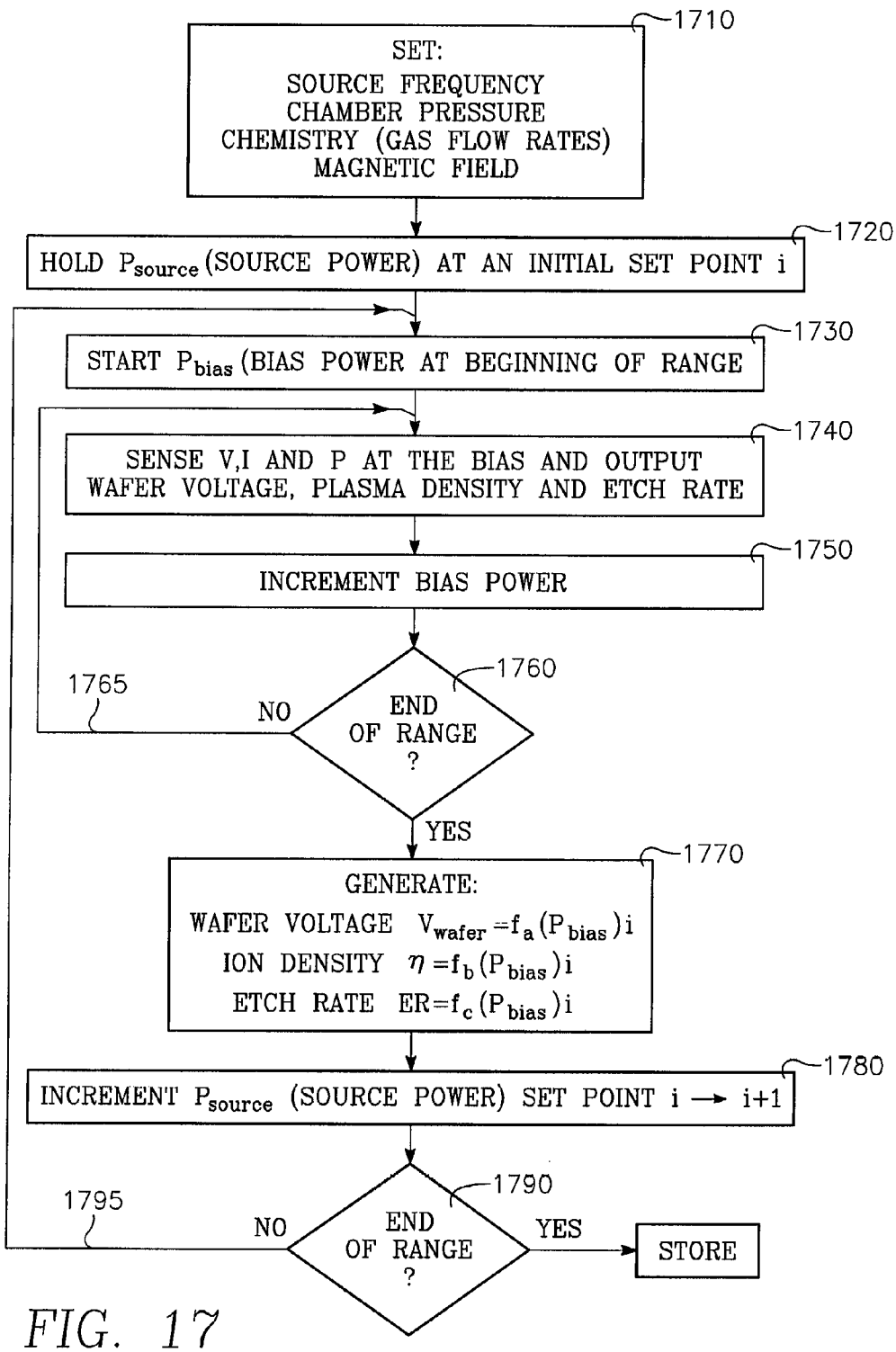
FIGS. 17, 18 and 19 illustrate respective operations performed by the process set point controller of the contour generator in the system of FIG. 11.
Figure 18:
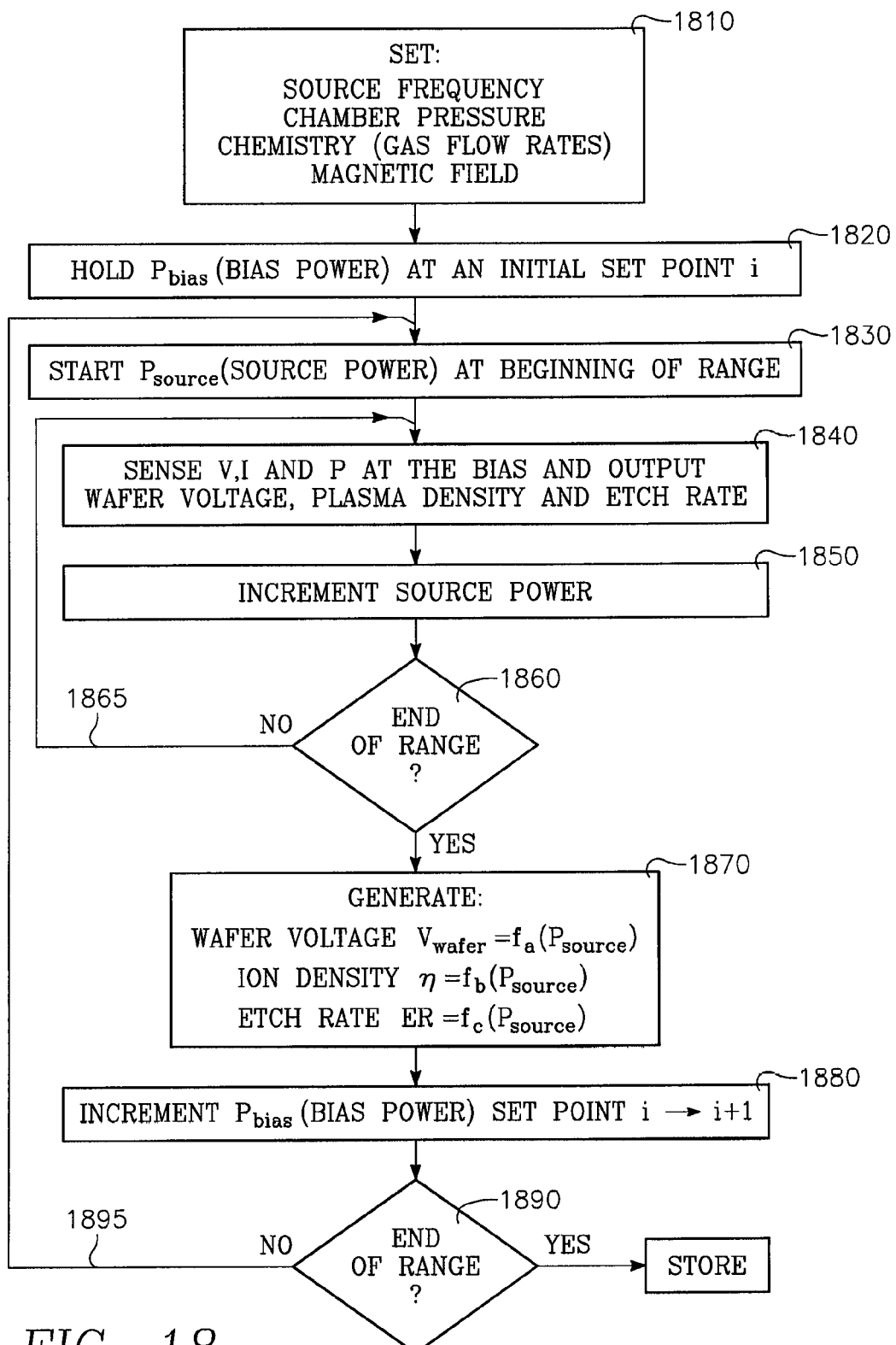
Figure 19:
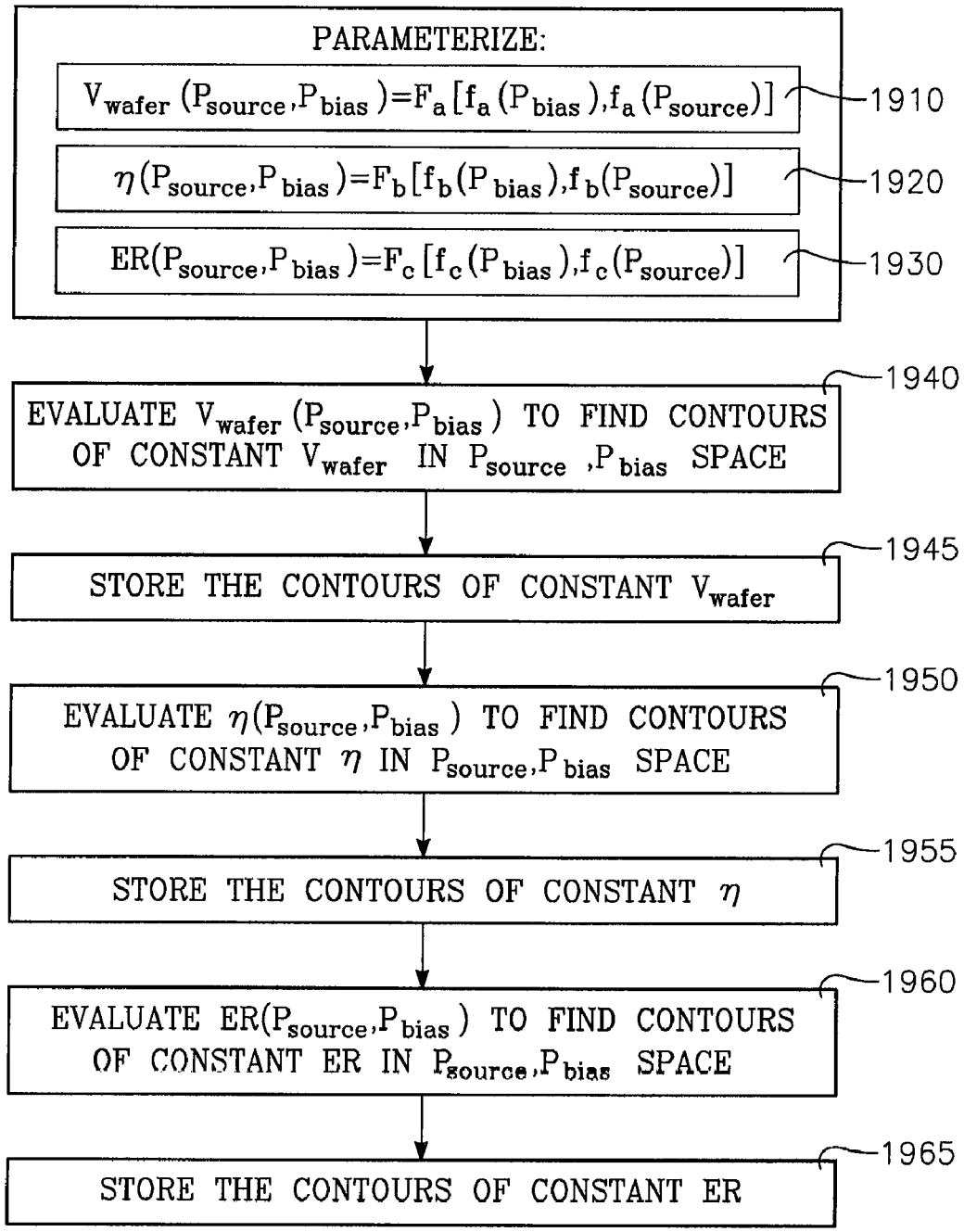

Contour Generator 1120:

Operation of the contour generator 1120 of FIG. 11 is illustrated in FIGS. 17, 18 and 19. FIG. 17 illustrates the operation of the contour generator 1120 in finding functions defining how certain performance parameters vary with bias power. These include functions for the performance parameters of wafer voltage, ion density and etch rate. As will be described below, the observations of changes in wafer voltage, ion density and etch rate with bias power are made for the contour generator 1120 by the measurement instrument 140 using the configuration of FIG. 11. In FIG. 11, the measurement instrument 140 transmits instantaneous measurements of wafer voltage, ion density and etch rate to the contour generator 1120. The contour generator 1120 also receives the current source power and bias power commands, as indicated in FIG. 11, allowing it to correlate behavior of the performance parameters of wafer voltage, ion density and etch rate, with the control parameters of source power and bias power.

FIG. 18 illustrates the operation of the contour generator 1120 in finding functions defining how certain performance parameters vary with source power. As in FIG. 17, in FIG. 18 these include functions for the performance parameters of wafer voltage, ion density and etch rate. Also as in FIG. 17, in the operation of FIG. 18 is carried out using the configuration of FIG. 11.

FIG. 19 illustrates the operation of the contour generator 1120 in parameterizing the separate functions of source power and bias power discovered in the operations of FIGS. 17 and 18 into combined functions of both source power and bias power. Such combined functions represent the behavior of the performance parameters (wafer voltage, ion density, etch rate) in 2-dimensional $P_{source}$-$P_{bias}$ space. The contour generator 1120 then derives the contours of constant ion density, ion energy and etch rate from the respective combined functions.

The operation depicted in FIG. 17 will now be described in detail with reference to both FIGS. 11 and 17. In the step of block 1710 of FIG. 17, the frequencies of the bias and source power generators 125, 920 of FIG. 11 are set to constant values, the exhaust rate of a vacuum pump 1180 of the reactor of FIG. 11 is controlled to achieve a constant chamber pressure, and mass flow rates from gas supplies 1182, 1184 are set through a mass flow controller 1186 of FIG. 11 to constant values. In the step of block 1720 of FIG. 17, the power level of the source power generator 920 of FIG. 11 is set to an initial set point, so that the entire process is at a steady state with the exception of the bias power level. In the step of block 1730 of FIG. 17, the power level of the bias power generator 125 of FIG. 11 is set at the beginning of a predetermined range. The measurement instrument 140 then senses the voltage current and power at the impedance match 130 in order to measure water voltage, ion density and etch rate in the manner described previously with respect to FIGS. 1-8 (block 1740 of FIG. 17). These measurements are sent to the contour generator 1120 and stored in a memory 1120a. In the next step (block 1750 of FIG. 17), the power level of the bias power generator 125 of FIG. 11 is incremented (by command of the controller 1110) to a slightly higher value and held at that value. A determination is then made in the step of block 1760 of FIG. 17 as to whether or not the latest bias power level is at the end of the bias power range. If not (ANO@ branch of block 1760), the operation returns in a loop 1765 to the step of block 1740. The steps within the loop 1765 are repeated in this manner until the end of the bias power range is reached (AYES@ branch of block 1760). The result is that three sets of data corresponding to functions of bias power defining the behaviors of wafer voltage, ion density and etch rate are stored in the memory 1120a. Using conventional data fit algorithms, the contour generator uses the three sets of data to produce algebraic functions corresponding to the data, which are stored in the memory 1120a as follows:

$$V_{wafer} = f_a(P_{bias})_i = f_b(P_{bias})_i$$

$$ER = f_c(P_{bias})_i$$

where η is plasma ion density, ER is etch rate and the index i refers to the current level of the source power generator 915 (block 1770). In the next step of FIG. 17 (block 1780), the level of the source power generator 915 is incremented to a new value so that i6i+1. If the new source power level is not at the end of the source power range (ANO@ branch of block 1790), then the operation returns in a loop 1795 to the step of block 1730, and the steps within the loop 1795 (i.e., blocks 1730 through 1790) are repeated until the source power level reaches the end of the source power range (AYES@ branch of block 1790). The result is that many sets of the functions $$V_{wafer} = f_a(P_{bias})_i = f_b(P_{bias})_i$$

$$ER = f_c(P_{bias})_i$$

for all values of i within the source power range are stored in the memory 1120a. This permits an analytical determination of whether or not the behavior of the three behavior parameters $V_{wafer}$, η, ER with bias power changes with source power. I have discovered that it does not change to a great extent, so that bias power and source power are at least nearly independent variables. Thus, a single function of bias power for each of the parameters $V_{wafer}$, η, ER generally suffices as a fairly accurate prediction of behavior over the entire range of the source power level, at least for the range chosen in the working examples given later in this specification. Thus, the loop 1795 of FIG. 17 may not be strictly necessary. Instead, it may be acceptable to choose a single value for the source power level in the middle of the source power level range in step 1720 and perform the loop of 1765 to produce a single set of data for each of the three functions $$V_{wafer} = f_a(P_{bias}) = f_b(P_{bias})$$

$$ER = f_c(P_{bias})$$

These three functions of bias power are stored in the memory 1120a.

The operation depicted in FIG. 18 will now be described in detail with reference to both FIGS. 11 and 18. In the step of block 1810 of FIG. 18, the frequencies of the bias and source power generators 125, 920 of FIG. 11 are set to constant values, the exhaust rate of a vacuum pump 1180 of the reactor of FIG. 11 is controlled to achieve a constant chamber pressure, and mass flow rates from gas supplies 1182, 1184 are set through a mass flow controller 1186 of FIG. 11 to constant values. In the step of block 1820 of FIG. 18, the power level of the bias power generator 125 of FIG. 11 is set to an initial set point, so that the entire process is at a steady state with the exception of the source power level. In the step of block 1830 of FIG. 18, the power level of the source power generator 920 of FIG. 11 is set at the beginning of a predetermined range. The measurement instrument 140 then senses the voltage current and power at the impedance match 130 in order to measure wafer voltage, ion density and etch rate in the manner described previously with respect to FIGS. 1-8 (block 1840 of FIG. 18). These measurements are sent to the contour generator 1120 and stored in the memory 1120a. In the next step (block 1850 of FIG. 18), the power level of the source power generator 920 of FIG. 11 is incremented (by command of the controller 1110) to a slightly higher value and held at that value. A determination is then made in the step of block 1860 of FIG. 18 as to whether or not the latest source power level is at the end of the source power range. If not (NO branch of block 1860), the operation returns in a loop 1865 to the step of block 1840. The steps within the loop 1865 are repeated in this manner until the end of the source power range is reached (YES branch of block 1860). The result is that three sets of data corresponding to functions of source power defining the behaviors of wafer voltage, ion density and etch rate are stored in the memory 1120a. Using conventional data fit algorithms, the contour generator 1120 uses the three sets of data to produce algebraic functions corresponding to the data, which are stored in the memory 1120a as follows:

$$V_{wafer} = f_a(P_{source})_i = f_b(P_{source})_i$$

$$ER = f_c(P_{source})_i$$

where η is plasma ion density, ER is etch rate and the index i refers to the current level of the bias power generator 125 (block 1870). In the next step of FIG. 18 (block 1880), the level of the bias power generator 125 is incremented to a new value so that i6i+1. If the new bias power level is not at the end of the bias power range (NO branch of block 1890), then the operation returns in a loop 1895 to the step of block 1830, and the steps within the loop 1895 (i.e., blocks 1830 through 1890) are repeated until the bias power level reaches the end of the bias power range (YES branch of block 1890). The result is that many sets of the functions $$V_{wafer} = f_a(P_{source})_i = f_b(P_{source})_i$$

$$ER = f_c(P_{source})_i$$

for all values of i within the bias power range are stored in the memory 1120a. This permits an analytical determination of whether or not the behavior of the three behavior parameters $V_{wafer}$, η, ER with source changes with bias power. I have discovered (as in the case of FIG. 17) that it does not change to a great extent, so that bias power and source power are at least nearly independent variables, as discussed above. Thus, a single function of source power for each of the parameters $V_{wafer}$, η, ER generally suffices as a fairly accurate prediction of behavior over the entire range of the bias power level, at least for the range chosen in the working examples given later in this specification. Thus, the loop 1895 of FIG. 18 may not be strictly necessary. Instead, it may be acceptable to choose a single value for the bias power level in the middle of the bias power level range in step 1820 and perform the loop of 1865 to produce a single set of data for each of the three functions $$V_{wafer} = f_a(P_{source}) = f_b(P_{source})$$

$$ER = f_c(P_{source})$$

These three functions of source power are stored in the memory 1120a. Thus, upon completion of the operations of FIGS. 17 and 18, the memory 1120a holds the following pair of functions for the wafer voltage:

$$V_{wafer} = f_a(P_{source})$$

$$V_{wafer} = f_a(P_{bias})$$

and following pair of functions for the ion density:

$$= f_b(P_{source})$$

$$= f_b(P_{bias})$$

and the following pair of functions for etch rate:

$$ER = f_c(P_{source})$$

$$ER = f_c(P_{bias}).$$

In the operation illustrated in FIG. 19, the contour generator 1120 combines each pair of functions having a single variable $P_{source}$, or $P_{bias}$, respectively, into a single combined function of the variable pair $P_{source}$ and $P_{bias}$. This produces the following three functions:

$$V_{wafer}(P_{source}, P_{bias})$$

$$\eta(P_{source}, P_{bias})$$

$$ER(P_{source}, P_{bias}).$$

Contours of constant parameter values (e.g., a contour of constant wafer voltage, a contour of constant etch rate, a contour of constant ion density) are found by setting the respective function to a constant value and then solving for $P_{source}$ as a function of $P_{bias}$. For example, in order to generate a contour of constant wafer voltage at 300 V, the function $V_{wafer}(P_{source}, P_{bias})$ is set equal to 300 V, and then solved for $P_{source}$.

Operation of the contour generator 1120 of FIG. 11 in carrying out the foregoing steps of generating the combined two-variable functions and then solving them for $P_{source}$ as a function of $P_{bias}$ at various constant values is illustrated in FIG. 19. Referring now to FIG. 19, the first step (block 1910) is to take the single variable functions of wafer voltage, i.e., $V_{wafer}(P_{source})$ and $V_{wafer}(P_{bias})$ and find their combined function. The next step (block 1920) is to take the single variable functions of ion density, i.e., $\eta(P_{source})$ and $\eta(P_{bias})$ and find their combined function $\eta(P_{source}, P_{bias})$. The third step (block 1930) is to take the single variable functions of etch rate, i.e., $ER(P_{source})$ and $ER(P_{bias})$ and find their combined function $ER(P_{source}, P_{bias})$.

Then, the contours of constant values are generated. To generate a contour of constant wafer voltage (block 1940 of FIG. 19), the function $V_{wafer}(P_{source}, P_{bias})$ is set equal to a constant value of wafer voltage and the resulting expression is then solved for $P_{source}$ as a function of $P_{bias}$. This step is repeated for a range of constant wafer voltage values to generate a set of contours covering the range. These contours are stored in the memory 1120a of FIG. 11 (block 1945 of FIG. 19).

To generate a contour of constant ion density (block 1950 of FIG. 19), the function $\eta(P_{source}, P_{bias})$ is set equal to a constant value of ion density and the resulting expression is solved for $P_{source}$ as a function of $P_{bias}$. This step is repeated for a range of constant ion density values to generate a set of contours covering the range of ion density values. These contours are stored in the memory 1120a of FIG. 11 (block 1955 of FIG. 19).

To generate a contour of constant etch rate (block 1960 of FIG. 19), the function $ER(P_{source}, P_{bias})$ is set equal to a constant value of etch rate and the resulting expression solved for $P_{source}$ as a function of $P_{bias}$. This step is repeated for a range of constant etch rate values to generate a set of contours covering the range of etch rate values. These contours are stored in the memory 1120a of FIG. 11 (block 1965 of FIG. 19).

Generally, each combined two-variable function, e.g., $V_{wafer}(P_{source}, P_{bias})$) can be approximated by the product of the pair of individual functions, e.g., $V_{wafer}(P_{source})$ and $V_{wafer}(P_{bias})$. For example, ignoring all control parameters except RF power level and ignoring constants of proportionality:

$$V_{wafer} = f_a(P_{source}) \cdot [P_{source}]^{1/2}$$

$$V_{wafer} = f_a(P_{bias}) \cdot [P_{bias}]^{1/2}$$

so that the combined two-variable function is approximately: $V_{wafer} = F_a(P_{source}, P_{bias}) = f_a(P_{source}) f_a(P_{bias}) \cdot [P_{source}]^{1/2} [P_{bias}]^{1/2}$ This expression, however is not exact. The exact function is best found by curve-fitting techniques involving all control parameters, namely $P_{source}$ and $P_{bias}$, as above, and in addition, source power frequency, bias power frequency, chamber pressure, and magnetic field (if any). I have found the following expression for $V_{wafer}$ as a function of both $P_{source}$ and $P_{bias}$:

$$V_{wafer}(P_{source}, P_{bias}) = V_0(P_{bias}/P_{b0})^{0.4}[(P_{source}/P_{s0})K_1 (p/p_0)^{-1} + (p/p_0)^{0.5}]^{-0.5}$$

where $P_{b0}$ is a maximum bias power value, $P_{s0}$ is a maximum source power value, $p_0$ is a minimum chamber pressure, and p is the actual chamber pressure. In the reactor chamber described above, the maximum source power $P_{s0}$ was 1500 Watts, the maximum bias power $P_{b0}$ was 4500 Watts and the minimum pressure $p_0$ was 30 mT. These values may differ from the foregoing example depending upon chamber design and process design. $V_0$ is determined in accordance with the following procedure: the maximum bias power $P_{b0}$ is applied to the wafer pedestal while the source power is held to zero and the chamber is held to the minimum pressure $p_0$. The wafer voltage $V_{wafer}$ is then measured and this measured value is stored as $V_0$. $K_1$ is then determined by increasing the source power to its maximum value $P_{s0}$ and then measuring the wafer voltage $V_{wafer}$ again, and $K_1$ is adjusted until the foregoing equation yields the correct value for $V_{wafer}$.

The exponents in the foregoing equations were obtained by an extensive trial and error parameterization process for the reactor described in this specification. These exponents may be useful for other reactor designs, or the user may wish to try other exponents, depending upon the particular reactor design.

Ion density, $\eta$, and etch rate, ER, are both functions of $V_{wafer}$ and b, the plasma susceptance or imaginary part of the plasma admittance, as described previously herein with reference to FIG. 8:

$$=b^2 V_{wafer}^2$$

and $$ER = k b^2 V_{wafer}^{3/2}$$

Therefore, only the plasma susceptance b need be specified in addition to $V_{wafer}$ to define ER and η, for the sake of brevity. I have found the following expression for the plasma susceptance b as a function of both $P_{source}$ and $P_{bias}$:

$$b(P_{source}, P_{bias}) = b_0 (P_{bias}/P_{b0})^{-0.25}[(P_{source}/P_{s0})(p/p_0)^{-0.65}]$$

$$[K_2 (P_{bias}/P_{b0})^{-0.62}(p/p_0)^3 + (p/p_0)^{0.27}]$$

where the definitions above apply and in addition $b_0$ is a reference susceptance value. The reference susceptance value $b_0$ is determined in accordance with the following procedure: the maximum bias power $P_{b0}$ is applied to the wafer pedestal while the source power is held to zero and the chamber is held to the minimum pressure $p_0$. The susceptance b is then measured at the wafer support pedestal (using a V/I meter, for example) and this measured value is stored as $b_0$. $K_2$ is then determined by increasing the source power to its maximum value $P_{s0}$ and then measuring the susceptance b again, and $K_2$ is adjusted until the foregoing equation yields the correct value for b.

Ion density, η, and etch rate, ER, are then obtained by substituting the expressions for $V_{wafer}$ and b into the foregoing expressions for η and ER.

Figure 20:
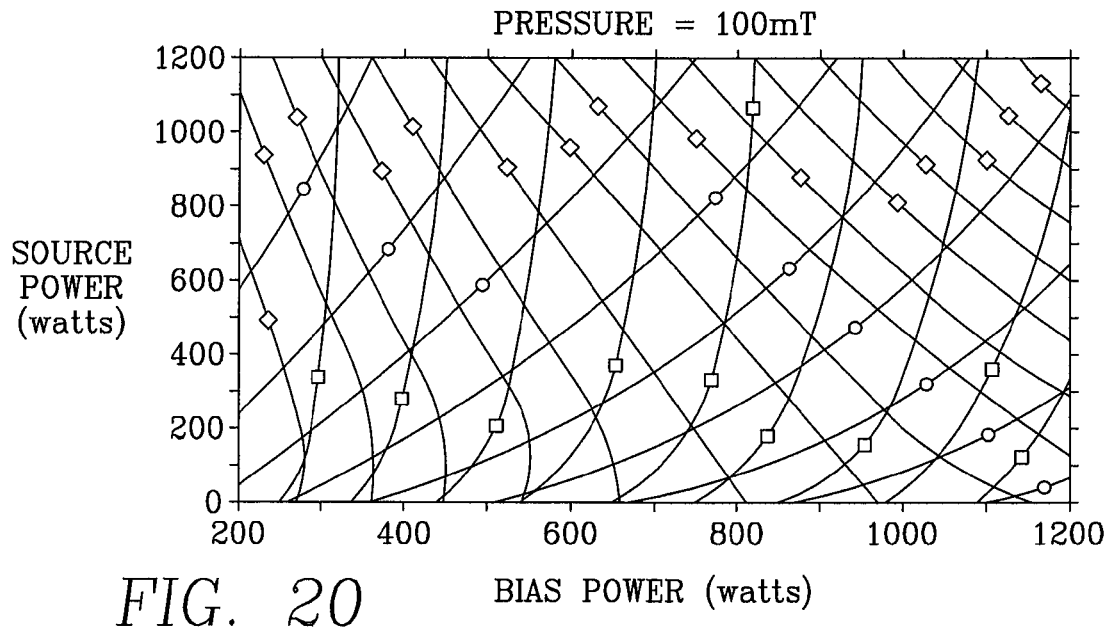
FIG. 20 illustrates an overlay of contours of constant wafer voltage, contours of constant etch rate and contours of constant ion density at a chamber pressure of 100 mT.
Figure 21:
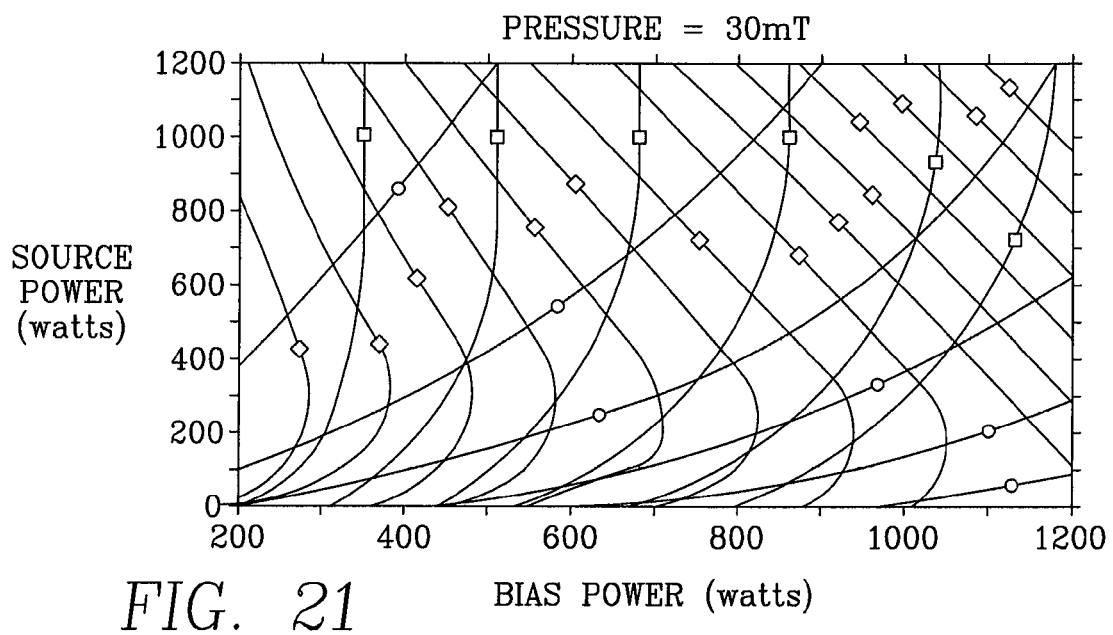
FIG. 21 illustrates an overlay of contours of constant wafer voltage, contours of constant etch rate and contours of constant ion density at a chamber pressure of 30 mT.
Figure 22:
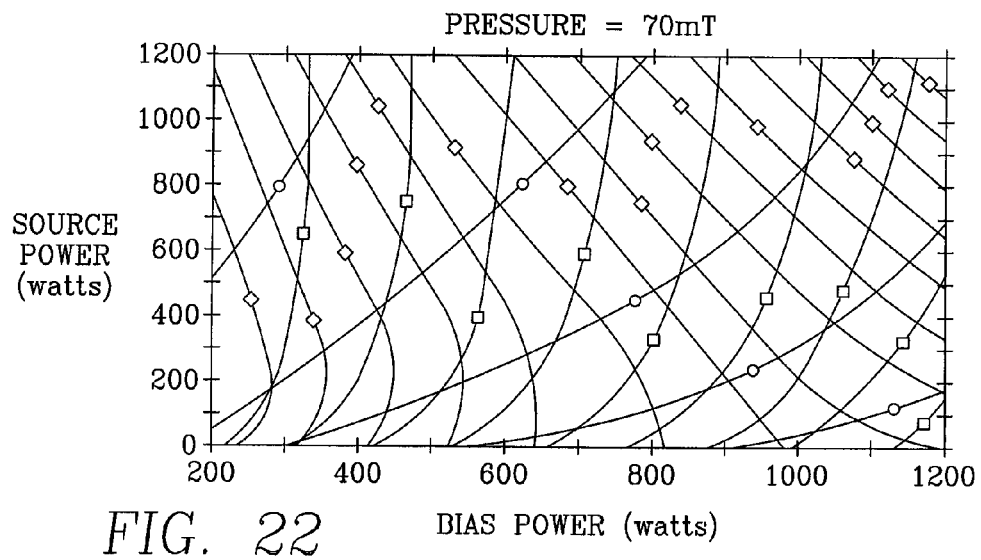
FIG. 22 illustrates an overlay of contours of constant wafer voltage, contours of constant etch rate and contours of constant ion density at a chamber pressure of 70 mT.
Figure 23:
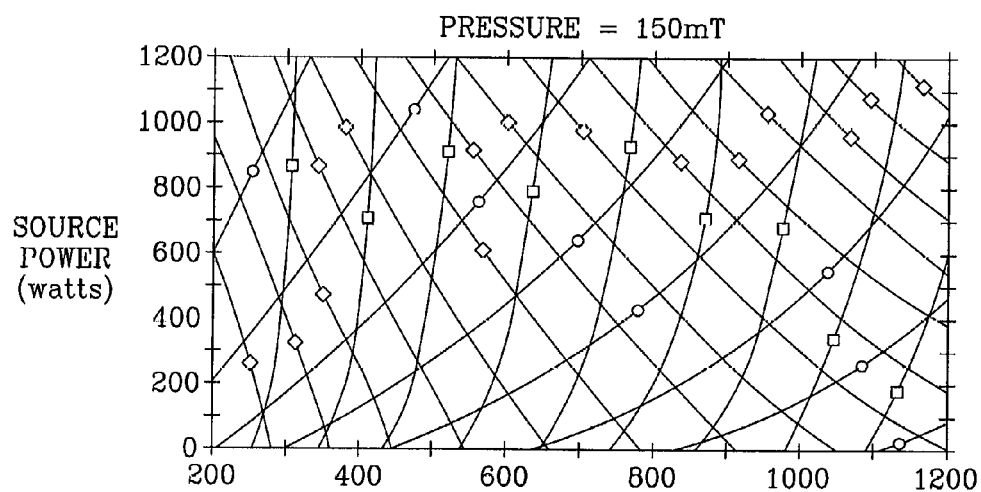
FIG. 23 illustrates an overlay of contours of constant wafer voltage, contours of constant etch rate and contours of constant ion density at a chamber pressure of 150 mT.
Figure 24:
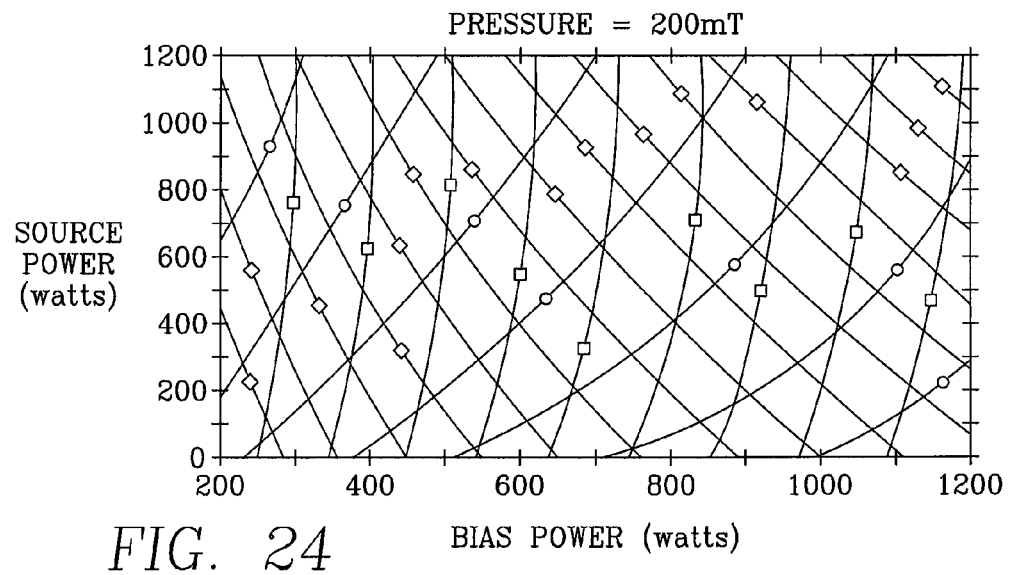
FIG. 24 illustrates an overlay of contours of constant wafer voltage, contours of constant etch rate and contours of constant ion density at a chamber pressure of 200 mT.
Figure 25:
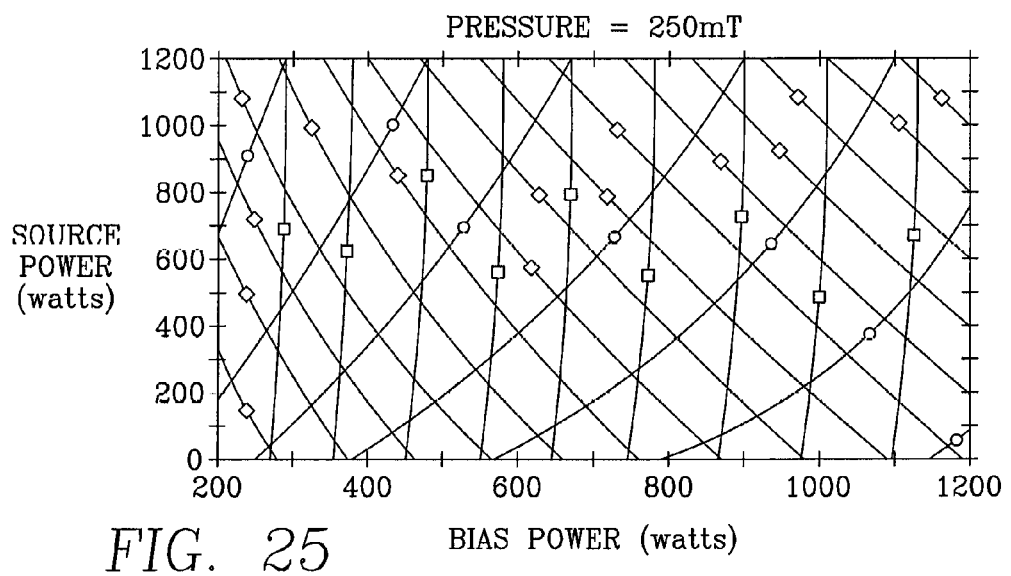
FIG. 25 illustrates an overlay of contours of constant wafer voltage, contours of constant etch rate and contours of constant ion density at a chamber pressure of 250 mT.

The results of the contour generator operation of FIG. 19 are illustrated for various chamber pressures in FIGS. 20-26. FIG. 20 illustrates contours of constant wafer voltage, contours of constant ion density and contours of constant etch rate superimposed upon one another in $P_{source}$-$P_{bias}$ space. The chamber pressure for these contours was 100 mT. The contours of constant wafer voltage are depicted in solid lines. The contours of constant ion density are depicted in dashed lines. The contours of constant etch rate are depicted in dotted lines. The source power range (the vertical axis or ordinate) has a range from zero to 1200 Watts. The bias power range (the horizontal axis or abscissa) has a range from 200 Watts to 1200 Watts. The stated values of constant wafer voltage are RMS volts. The stated values of constant ion density are $10^{10}$ ions/cm³.

FIGS. 20, 21, 22, 23, 24 and 25 correspond to FIG. 20 for respective chamber pressures of 100 mT, 30 mT, 70 mT, 150 mT, 200 mT and 250 mT, respectively.

Once a complete set of contours of constant voltage, constant etch rate and constant ion density have been generated and permanently stored in the memory 120a, the contour generator and even the measurement instrument may be discarded. In such an implementation, the process set point controller 1110 would control the entire process based upon the contours stored in the memory 120a in response to user inputs. In this case, the process set point controller 1110 could apply the bias and source power level commands directly to the bias and source power generators 125, 920, respectively, so that the feedback controller 950 could also be eliminated in such an embodiment.

While the measurement instrument 140 has been described with reference to discrete processors 310, 320, 340, 350, 360 that carry out individual computations, these processors comprising the measurement instrument 140 can be implemented together in a programmed computer, such as a workstation or a personal computer rather than as separate hardware entities. The contour generator 1120 may also be implemented in a programmed computer or workstation. In addition, the feedback controller 950 of FIG. 9 or FIG. 10 may be implemented in a programmed computer. Moreover, the process set point controller may be implemented in a programmed computer.

The measurement instrument 140 has been described in certain applications, such as in a process control system. It is also useful as a tool for "fingerprinting" or characterizing a particular plasma reactor by observing the etch rate, ion density and wafer voltage measured by the instrument 140 at a selected process setting of source power, bias power, pressure and other parameters.

While the description of FIG. 8 concerned an implementation in which etch rate is computed as $ER = b^2 V_{wafer}^2$ and ion density as $\eta = k b^2 V_{wafer}^{3/2}$, other functions may be employed, such as, for example, $[bV_{wafer}]^1$, or $[bV_{wafer}]^2$, or $g V_{wafer}^{3/2}$ (where g in this last expression is the conductance defined previously in this specification).

Figure 26:
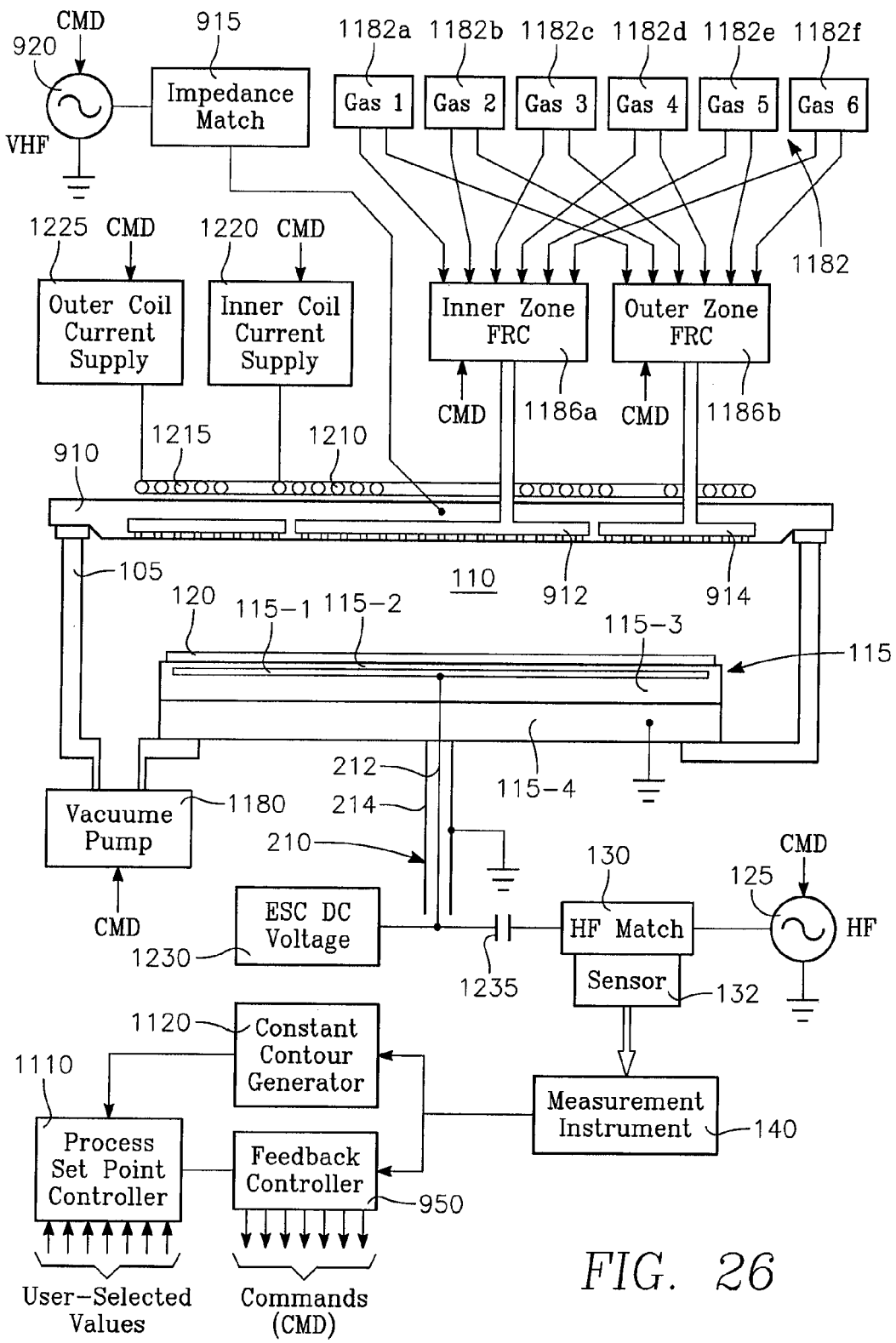
FIG. 26 is a simplified block diagram of a plasma reactor in accordance with further embodiments of the invention.

Reactor with Array of Chamber Parameters:

FIG. 26 illustrates a plasma reactor similar to that of FIG. 11 but having a greater number of chamber parameters capable of being controlled by the feedback controller 950. Like elements in FIGS. 11 and 26 have like reference numerals. In addition to the elements of FIG. 11, the reactor of FIG. 26 also has inner and outer annular gas injection zones or showerheads 912, 914 within the overhead electrode 910, plural gas supplies 1182a through 1182f, each containing a different chemical species (or mixture) and coupled to the inner and outer gas injection zones 912, 914 through respective gas flow controllers 1186a, 1186b. The gas flow controllers 1186a, 1186b control the gas flow rate and the composition or proportion of gas flow from each of the individual gas supplies 1182 to gas injection zones 912, 914. Inner and outer magnet coils 1210, 1215 are connected to respective inner and outer DC coil current supplies 1220, 1225. An optional DC chucking voltage supply 1230 is coupled to the bias feed center conductor 212, in which case a DC isolation capacitor 1235 is connected in series between the center conductor 212 and the bias match 130.

Chamber Characterization for Three Chamber Parameters:

The reactor chamber of FIG. 26 may be characterized by quantifying the behavior of, for example, four plasma parameters (such as wafer or sheath bias voltage, ion density, etch rate, wafer current) as functions of three chamber parameters (such as source power, bias power and chamber pressure). First, single value functions of the various plasma parameters are found with individual chamber parameters as the single variables, in the processes depicted in FIGS. 27-32. The first step is to initialize the chamber parameters (block 2001 of FIG. 27). This step sets chamber parameters, such as source power $P_S$, bias power $P_B$, chamber pressure $P_{ch}$, inner magnet current $I_{inner}$, outer magnet current $I_{outer}$, gas flow rate FR, to initial (e.g., mid-range) values.

Figure 27:
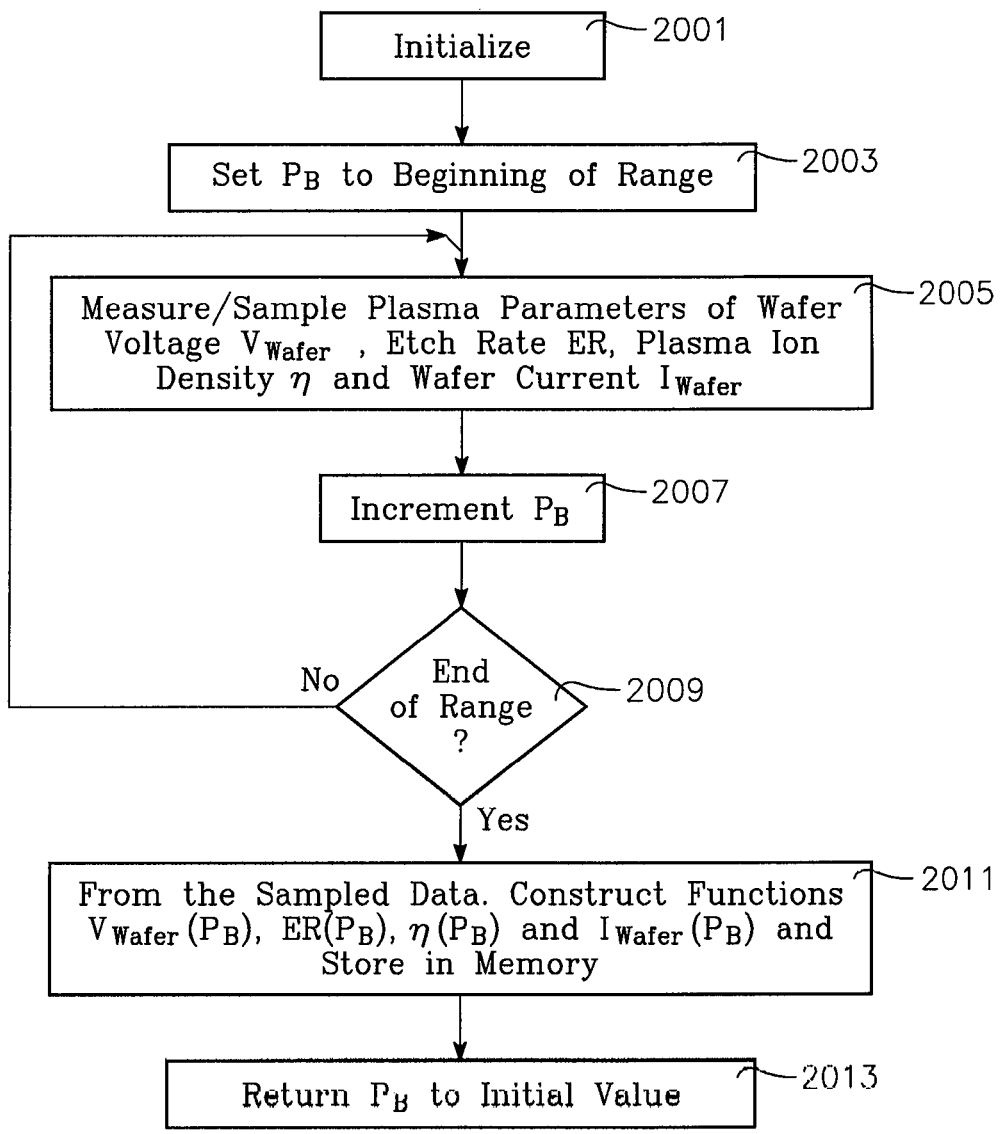
FIGS. 27-32 depict a process for constructing single variable functions of different plasma parameters for the variables of source power, bias power and chamber pressure.

The next major step is for the constant contour generator 1120 to find single variable functions of each plasma parameter in which bias power is the variable, which is depicted in FIG. 27. In the example of FIG. 27, functions are found for wafer voltage, $V_{wafer}(P_B)$, etch rate, $ER(P_B)$, plasma ion density, $\eta(P_B)$, and wafer current, $I_{wafer}(P_B)$. Referring to FIG. 27, the first step is to set $P_B$ to the beginning of its range (block 2003 of FIG. 27). This range may be between zero and 1000 Watts at 13.56 MHz, as one possible example. The next step is to measure or sample plasma parameters of wafer voltage $V_{wafer}$, etch rate ER, plasma ion density η and wafer current $I_{Wafer}$ using the measurement instrument 140 of FIG. 26 (block 2005). Then the contour generator 1120, through the controller 950, increments $P_B$ by a small predetermined amount or small fraction of the range (block 2007). A determination is then made as to whether the end of the bias power range has been reached (block 2009). If not (No branch of block 2009), the process loops back to the step of block 2005. If the end of range has been reached (YES branch of block 2009), then the process continues to the next step, namely block 2011. The step of block 2011 consists of using the sampled data to construct functions $V_{Wafer}(P_B)$, $ER(P_B)$, $\eta(P_B)$ and $I_{Wafer}(P_B)$, which are stored in memory. These functions may be constructed by curve fitting techniques, for example. Then, in preparation for generation of functions depending upon other chamber parameters, the chamber parameter $P_B$ is returned to its initial value, preferably a midrange value (block 2013).

Figure 28:
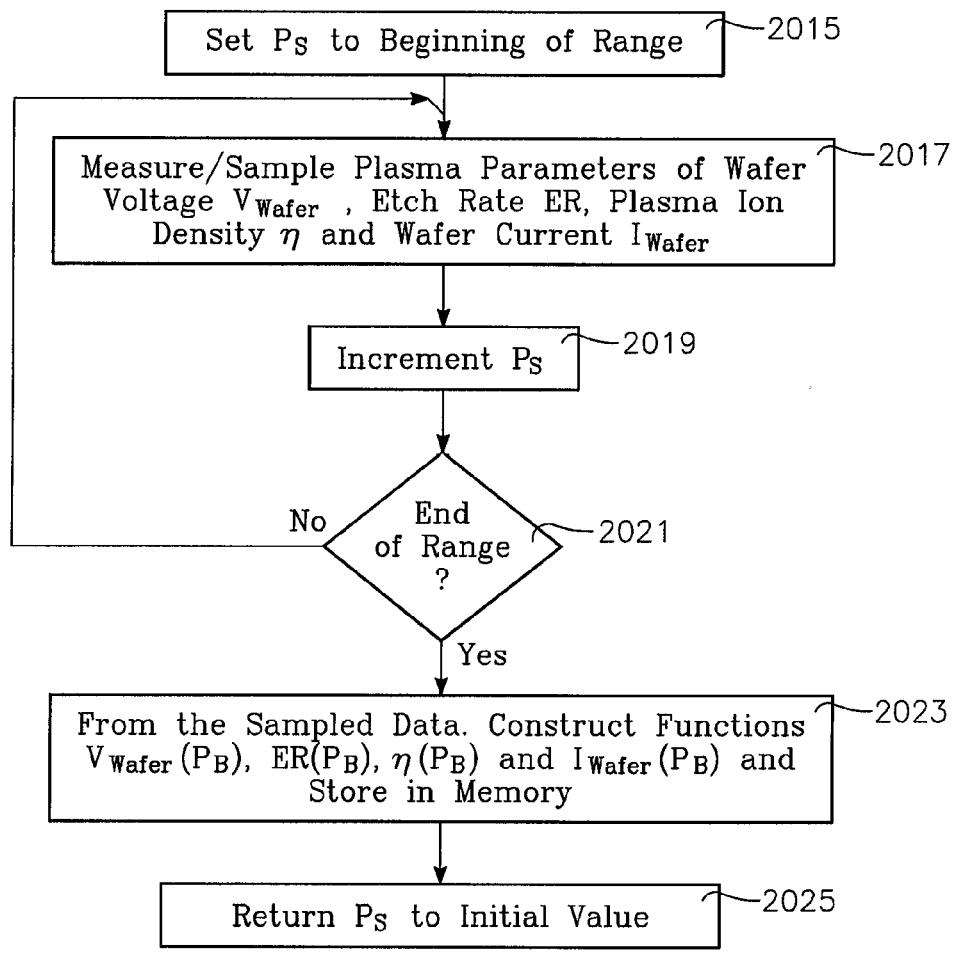

The purpose of the next process, which is depicted in FIG. 28, is to find the single variable functions of which source power is the single variable, namely the functions $V_{Wafer}(P_S)$, $ER(P_S)$, $\eta(P_S)$ and $I_{Wafer}(P_S)$. Referring to FIG. 28, the first step is to set $P_S$ to the beginning of source power range (block 2015 of FIG. 28). The RF plasma source power range may be from zero to 3000 Watts at 162 MHz, as one possible example. The next step is to measure or sample the plasma parameters of wafer voltage $V_{Wafer}$, etch rate ER, plasma ion density $\eta$ and wafer current $I_{Wafer}$ with the measurement instrument 140 (block 2017 of FIG. 28). Then, the generator 1120/controller 950 incremented $P_S$ (block 2019). A determination is then made of whether the end of the source power range has been reached (block 2021). If not (NO branch of block 2021), the process returns to the step of block 2017. Otherwise (YES branch of block 2021), the process continues to the next step of block 2023. In the step of block 2023, the sampled data (from block 2017) is used to construct the single variable functions $V_{Wafer}(P_S)$, $ER(P_S)$, $\eta(P_S)$ and $I_{Wafer}(P_S)$, and these functions are stored in memory. $P_S$ is then returned to its initial value (block 2025).

Figure 29:
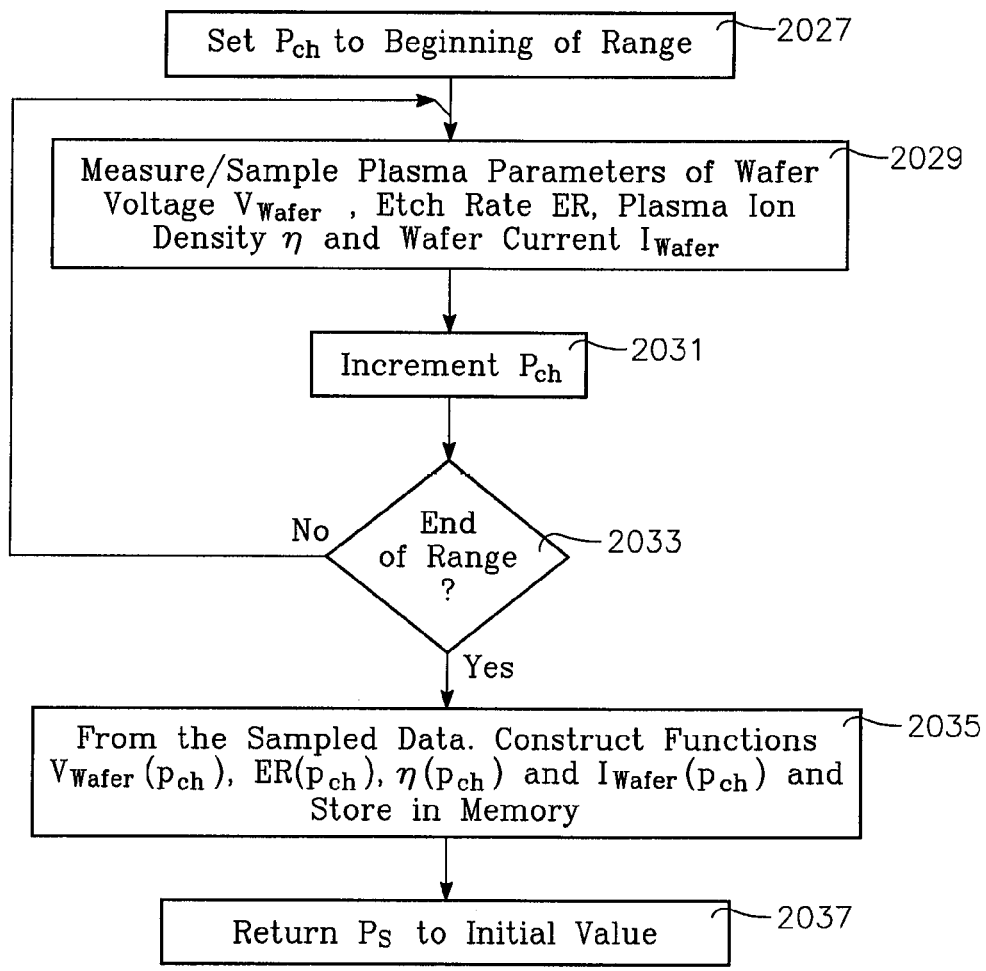

The purpose of the next process, which is depicted in FIG. 29, is to find the single variable functions of which chamber pressure is the single variable, namely the functions $V_{Wafer}(p_{ch})$, $ER(p_{ch})$, $\eta(p_{ch})$ and $I_{Wafer}(p_{ch})$. The first step is to set $p_{ch}$ to beginning of the chamber pressure range (block 2027). This range may lie between 0.5 mT and 200 mT, as one possible example. The next step is to measure or sample the plasma parameters of wafer voltage $V_{Wafer}$, etch rate ER, plasma ion density $\eta$ and wafer current $I_{Wafer}$ with the measurement instrument 140 (block 2029). Then, the generator 1120/controller 950 increments $p_{ch}$ by a small fraction of the pressure range (block 2031). A determination is made at this point of whether the end of the chamber pressure range has been reached (block 2033). If not (NO branch of block 2033), the process loops back to the step of block 2029. Otherwise (YES branch of block 2033), the process continues with the next step, namely block 2035. In block 2035, the sampled data from the step of block 2029 is used to construct the functions $V_{Wafer}(p_{ch})$, $ER(p_{ch})$, $\eta(p_{ch})$ and $I_{Wafer}(p_{ch})$, which are then stored in memory. In block 2037, $p_{ch}$ is returned to its initial value.

Figure 30:
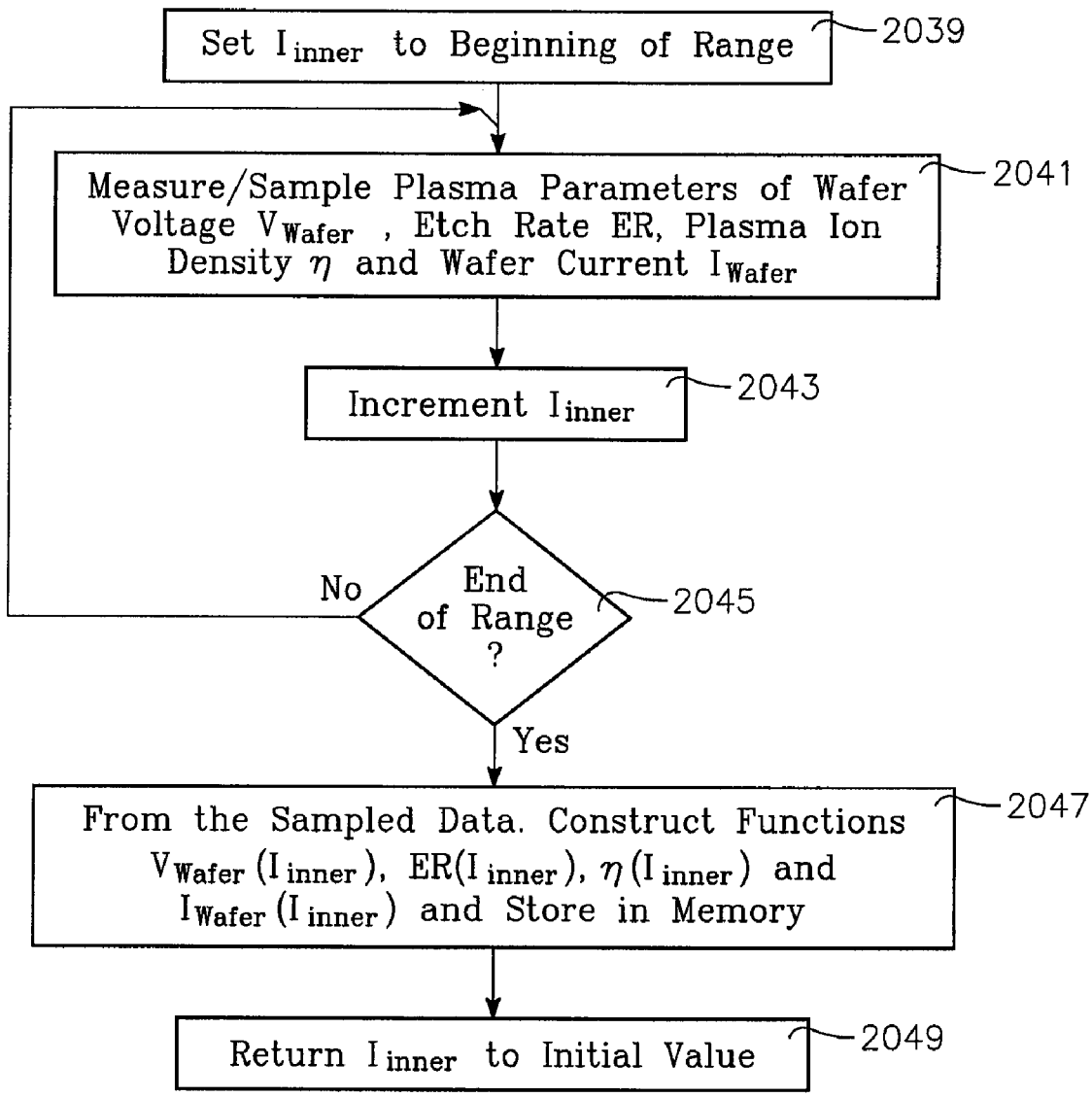

The purpose of the next process, which is depicted in FIG. 30, is to find the single variable functions of which the current of the inner magnet coil 1210 of FIG. 26) is the single variable, namely the functions $V_{Wafer}(I_{inner})$, $ER(I_{inner})$, $\eta(I_{inner})$ and $I_{Wafer}(I_{inner})$. In other embodiments, the current could be (instead) the AC current applied to MERIE magnets if these are present in the reactor. First, $I_{inner}$ is set to the beginning of its range (block 2039). The next step is to measure or sample the plasma parameters of wafer voltage $V_{Wafer}$, etch rate ER, plasma ion density $\eta$ and wafer current $I_{Wafer}$ with the measurement instrument 140 (block 2041). Then, the generator 1120/controller 950 increments $I_{inner}$ by a small predetermined fraction of its range (block 2043). As determination is made at that point of whether the end of the magnet coil current range has been reached (block 2045). If not (NO branch of block 2045), the process loops back to the step of block 2041. Otherwise (YES branch of block 2045), the process proceeds to the next step, namely block 2047. In the step of block 2047, the sampled data from the step of block 2041 is used to construct the functions $V_{Wafer}(I_{inner})$, $ER(I_{inner})$, $\eta(I_{inner})$ and $I_{Wafer}(I_{inner})$, which are then stored in memory. The last step of this process is to return $I_{inner}$ to its initial value (block 2049).

Figure 31:
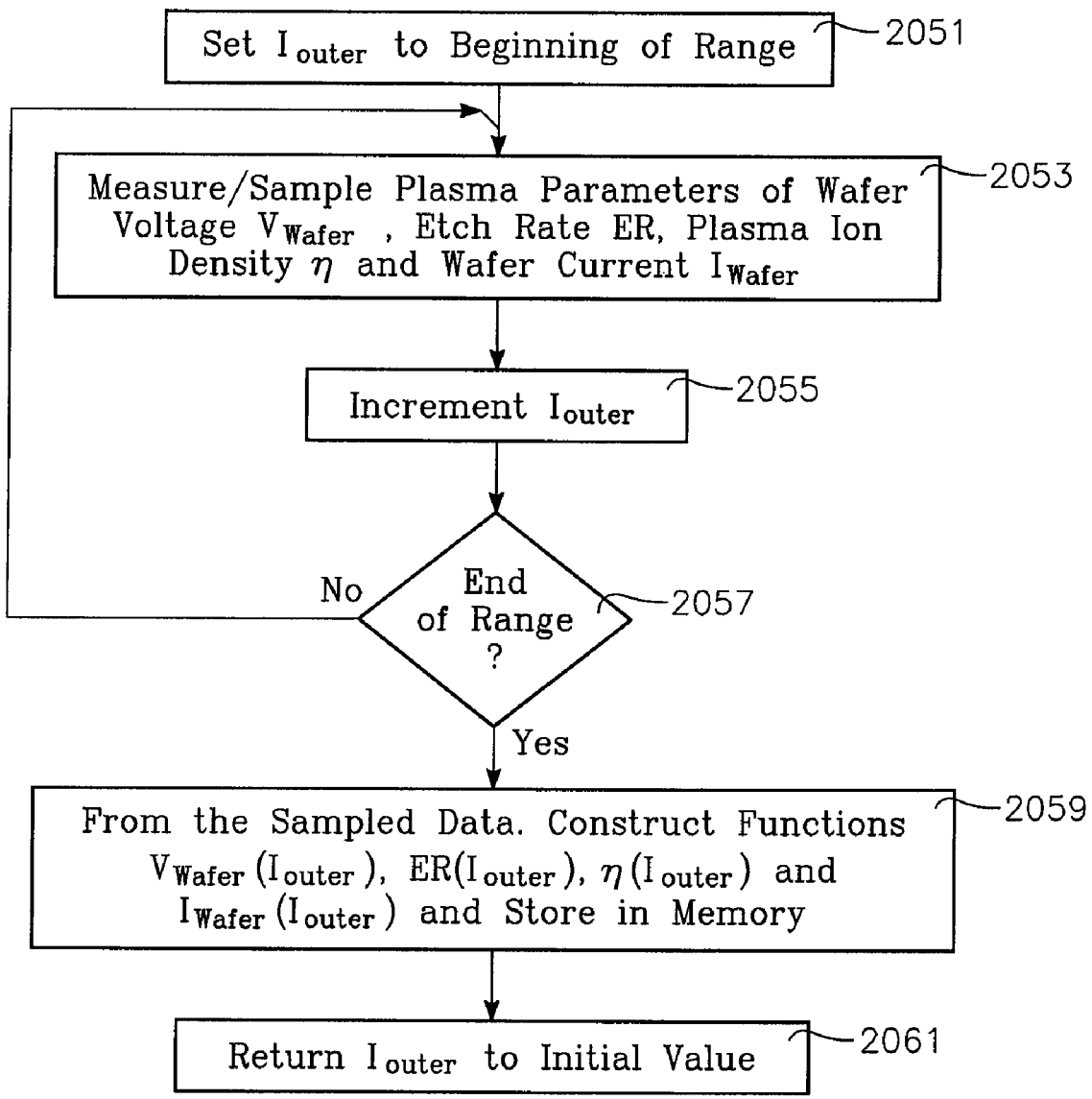

The purpose of the next process, which is depicted in FIG. 31, is to find the single variable functions of which the current supplied to the outer magnet coil 1215 of FIG. 26 is the single variable, namely the functions $V_{Wafer}(I_{outer})$, $ER(I_{outer})$, $\eta(I_{outer})$ and $I_{Wafer}(I_{outer})$. The first step is to set $I_{outer}$ to beginning of its range (block 2051 of FIG. 31). The next step is to measure or sample the plasma parameters of wafer voltage $V_{Wafer}$, etch rate ER, plasma ion density $\eta$ and wafer current $I_{Wafer}$ with the measurement instrument 140 (block 2053). The generator 1120/controller 950 then increment $I_{outer}$ by a predetermined small fraction of its range (block 2055). A determination is made as to whether the end of range has been reached (block 2057). If not, the process loops back to the step of block 2053. Otherwise, the process proceeds with the next step. In the next step (block 2059), the sampled data from the step of block 2053 is used to construct the functions $V_{Wafer}(I_{outer})$, $ER(I_{outer})$, $\eta(I_{outer})$ and $I_{Wafer}(I_{outer})$, which are then stored in memory. This process concludes by returning $I_{outer}$ to its initial value (block 2061).

Figure 32:
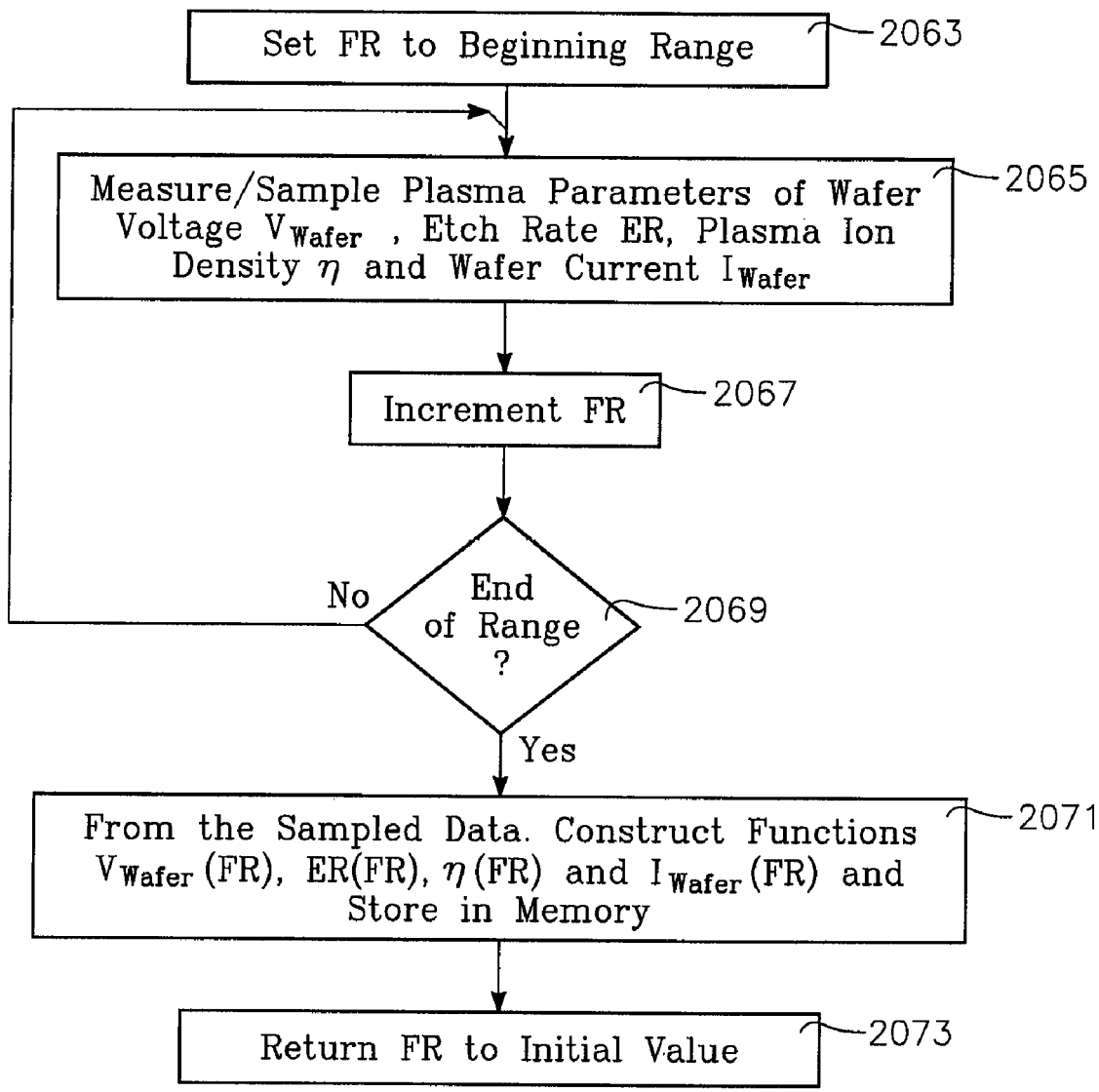

The purpose of the next process, which is depicted in FIG. 32, is to find the single variable functions of which the gas flow rate FR (or alternatively, the gas composition) is the single variable, namely the functions $V_{Wafer}(FR)$, $ER(FR)$, $\eta(FR)$ and $I_{Wafer}(FR)$. The gas composition may be the ratio between the carrier gas (e.g., argon) and the etchant species (fluorine or fluorocarbon or fluorhydrocarbon species), for example. The gas composition or gas flow rate may be separately defined as two different variables for each of the two (inner and outer) gas injection zones 912, 914, for example. Thus, there are four possible variables or chamber parameters concerning gas flow that may be employed: inner zone gas flow rate, outer zone gas flow rate, inner zone gas composition, outer zone gas composition. The present example of FIG. 32 concerns the use of a particular one of any of the foregoing gas flow-related chamber parameters, which will is labelled FR.

The first step of the process of FIG. 32 is to set FR to beginning of range (block 2063). The next step is to measure or sample the plasma parameters of wafer voltage $V_{Wafer}$, etch rate ER, plasma ion density $\eta$ and wafer current $I_{Wafer}$ with the measurement instrument 140 (block 2065). The next step is to increment FR (block 2067). A determination is then made of whether the end of range of the gas flow or gas composition parameter FR has been reached (block 2069). If not (NO branch of block 2069), the process loops back to the measurement step of block 2065. Otherwise (YES branch of block 2069), the next step (block 2071) is performed. In the step of block 2071, the sampled data is used to construct the functions $V_{Wafer}(FR)$, $ER(FR)$, $\eta(FR)$ and $I_{Wafer}(FR)$, which are then stores in memory. The construction of such functions may employ curve fitting techniques, for example. The final step of this process is to return FR to its initial value (block 2073).

Process Control in a 3-D Control Space—Translating Desired Plasma Parameter Values to Chamber Parameter Values:

The single variable functions produced for the different plasma parameters in the processes of FIGS. 27-32 may be employed in subsequent processes (depicted in FIGS. 33-36) to construct a three-dimensional control space with two-dimensional surfaces of constant plasma parameter values for later use in controlling the reactor chamber during wafer processing. In the example of FIGS. 33-36, the three chamber parameters of source power, bias power and chamber pressure (i.e., $P_B$, $P_S$ and $p_{ch}$) are selected.

Figure 33:
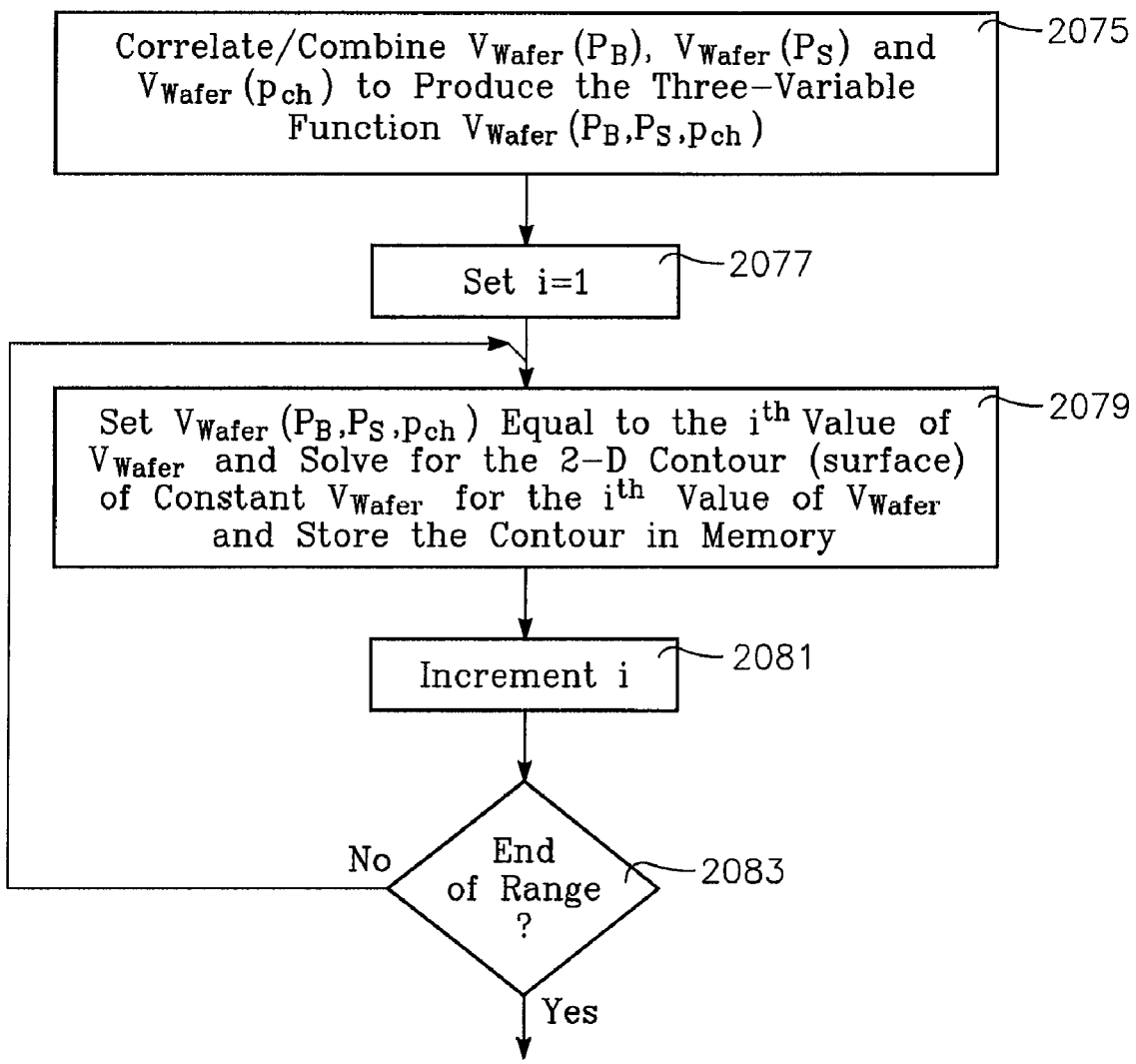
FIGS. 33-36 depict an example in which contours (i.e., surfaces) of constant value of four plasma parameters are produced from the single variable functions of FIGS. 27-32 in a three dimensional control space with dimensions of source power, bias power and chamber pressure.

The purpose of the process of FIG. 33 (performed by the contour generator 1120) is to exploit the 3-D control space of $P_B$, $P_S$ and $p_{ch}$ to produce 2-D contours (surfaces) of constant $V_{Wafer}$. These will be accumulated in a collection of such surfaces for later use in controlling the reactor chamber during wafer processing.

The first step (block 2075) in the process of FIG. 33 is to correlate or combine the single-variable functions $V_{Wafer}(P_B)$, $V_{Wafer}(P_S)$ and $V_{Wafer}(p_{ch})$ into a single three-variable function $V_{Wafer}(P_B, P_S, p_{ch})$. Curve fitting techniques of the type referred to earlier in this specification may be employed, for example, to accomplish this step. Next, an index "i" is initialized to one: by setting i=1 (block 2077). An equation is formed (block 2079) by setting the function $V_{Wafer}(P_B, P_S, p_{ch})$ equal to the $i^{th}$ value in the range of values of $V_{Wafer}$. This equation is solved to find the 2-D contour (surface) of constant $V_{Wafer}$ for the $i^{th}$ value of $V_{Wafer}$. This contour is stored in the memory 1120a of the contour generator 1120. The index i is then incremented by one by setting i=i+1 (block 2081), and the process loops back to block 2079 if the end of the range of values of $V_{Wafer}$ has not been reached (No branch of block 2183). Otherwise, if the end of range has been reached (YES branch of block 2183), the current process is complete and the next process is begun.

The purpose of the next process (FIG. 34) (performed by the contour generator 1120) is to exploit the 3-D control space of $P_B$, $P_S$ and $p_{ch}$ to produce 2-D contours (surfaces) of constant etch rate (ER). These will be accumulated in a collection of such surfaces for later use in controlling the reactor chamber during wafer processing.

Figure 34:
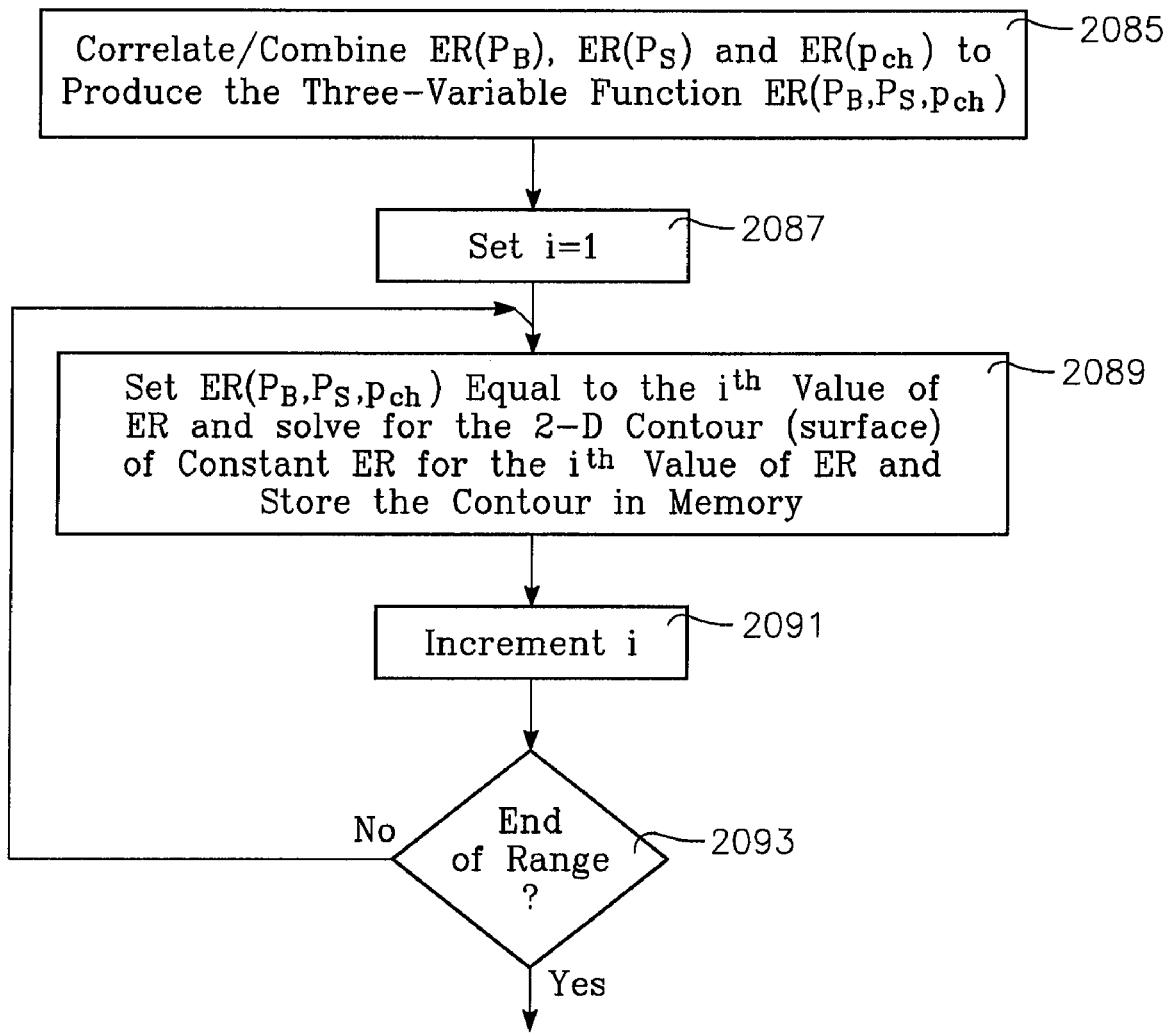

The first step (block 2085) in the process of FIG. 34 is to correlate/combine the single variable functions $ER(P_B)$, $ER(P_S)$ and $ER(p_{ch})$ into a single three variable function $ER(P_B, P_S, p_{ch})$. An index i is initialized to one by setting i=1 (block 2087). Then an equation is formed by setting the function $ER(P_B, P_S, p_{ch})$ equal to the $i^{th}$ value in the range of values of ER. This equation is solved to produce the 2-D contour (surface) of constant ER for the $i^{th}$ value of ER. This contour is then stored in the memory 1120a (block 2089). The index i is incremented by one by setting i=i+1 (block 2091). A determination is then made of whether the end of the range of ER values has been reached (block 2093). If not (NO branch of block 2093), the process loops back to the step of block 2089. Otherwise (YES branch of block 2093), the current process is complete and the next process is performed.

The purpose of the next process (FIG. 35) (performed by the contour generator 1120) is to exploit the 3-D control space of $P_B$, $P_S$ and $p_{ch}$ to produce 2-D contours (surfaces) of constant η. These will be accumulated in a collection of such surfaces for later use in controlling the reactor chamber during wafer processing.

Figure 35:
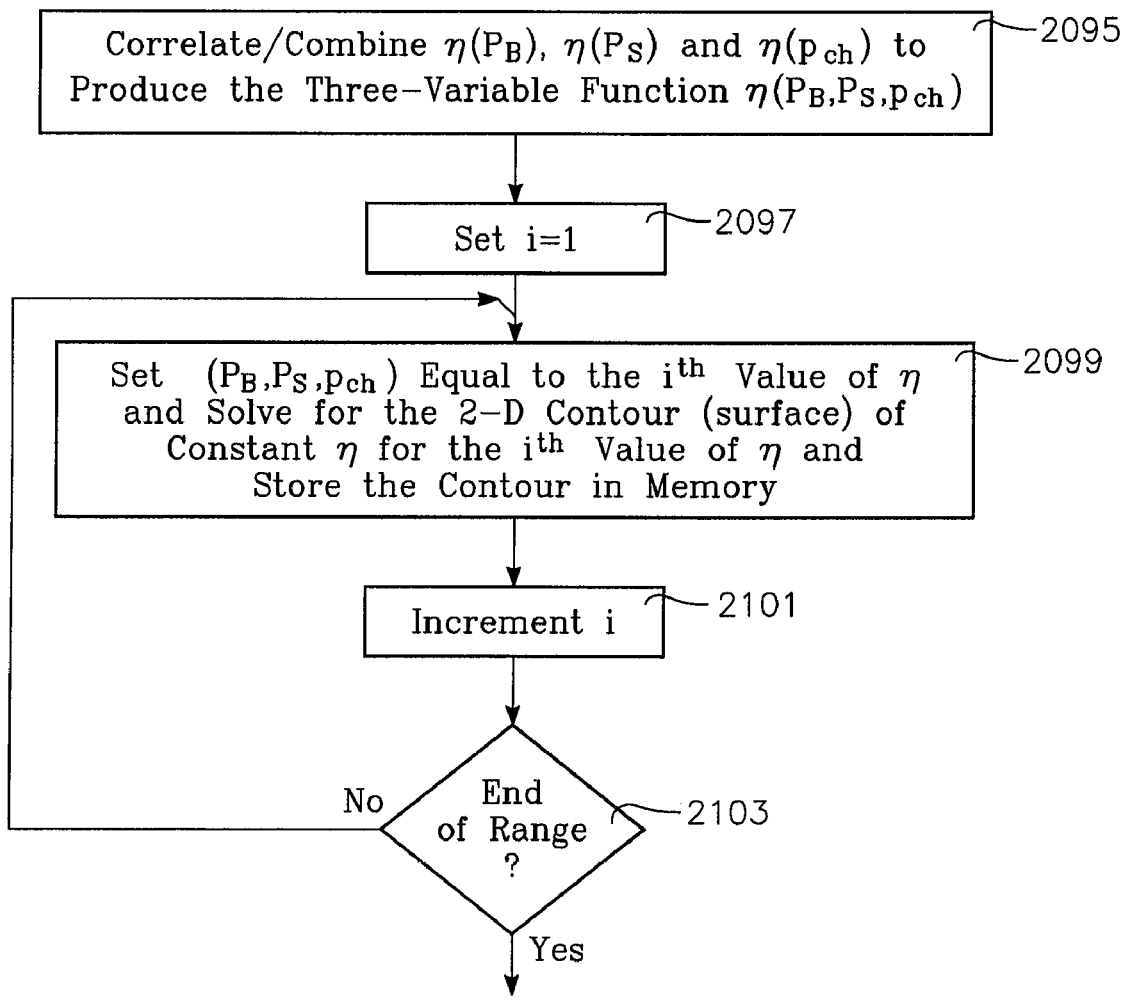

The first step (block 2095) in the process of FIG. 35 is to correlate or combine the single variable functions $\eta(P_B)$, $\eta(P_S)$ and $\eta(p_{ch})$ into a single three-variable function $\eta(P_B, P_S, p_{ch})$ The step may be carried out using curve fitting techniques, for example. Then, an index i is initialized to one by setting i=1 (block 2097). Then, an equation is created by setting the function $\eta(P_B, P_S, p_{ch})$ equal to the $i^{th}$ value in the range of values of the plasma parameter η. This equation is solved for the 2-D contour (surface) of constant η for the $i^{th}$ value of η. This contour is stored in the contour generator memory 1120a (block 2099). The index i is incremented by one by setting i=i+1 (block 2101). A determination is then made of whether the end of the range of ER values has been reached (block 2103). If not (NO branch of block 2103), the process loops back to the step of block 2099. Otherwise (YES branch of block 2103), the current process is complete and the next process is performed.

The purpose of the next process (FIG. 36) (performed by the contour generator 1120) is to exploit the 3-D control space of $P_B$, $P_S$ and $p_{ch}$ to produce 2-D contours (surfaces) of constant $I_{Wafer}$. These will be accumulated in a collection of such surfaces for later use in controlling the reactor chamber during wafer processing.

Figure 36:
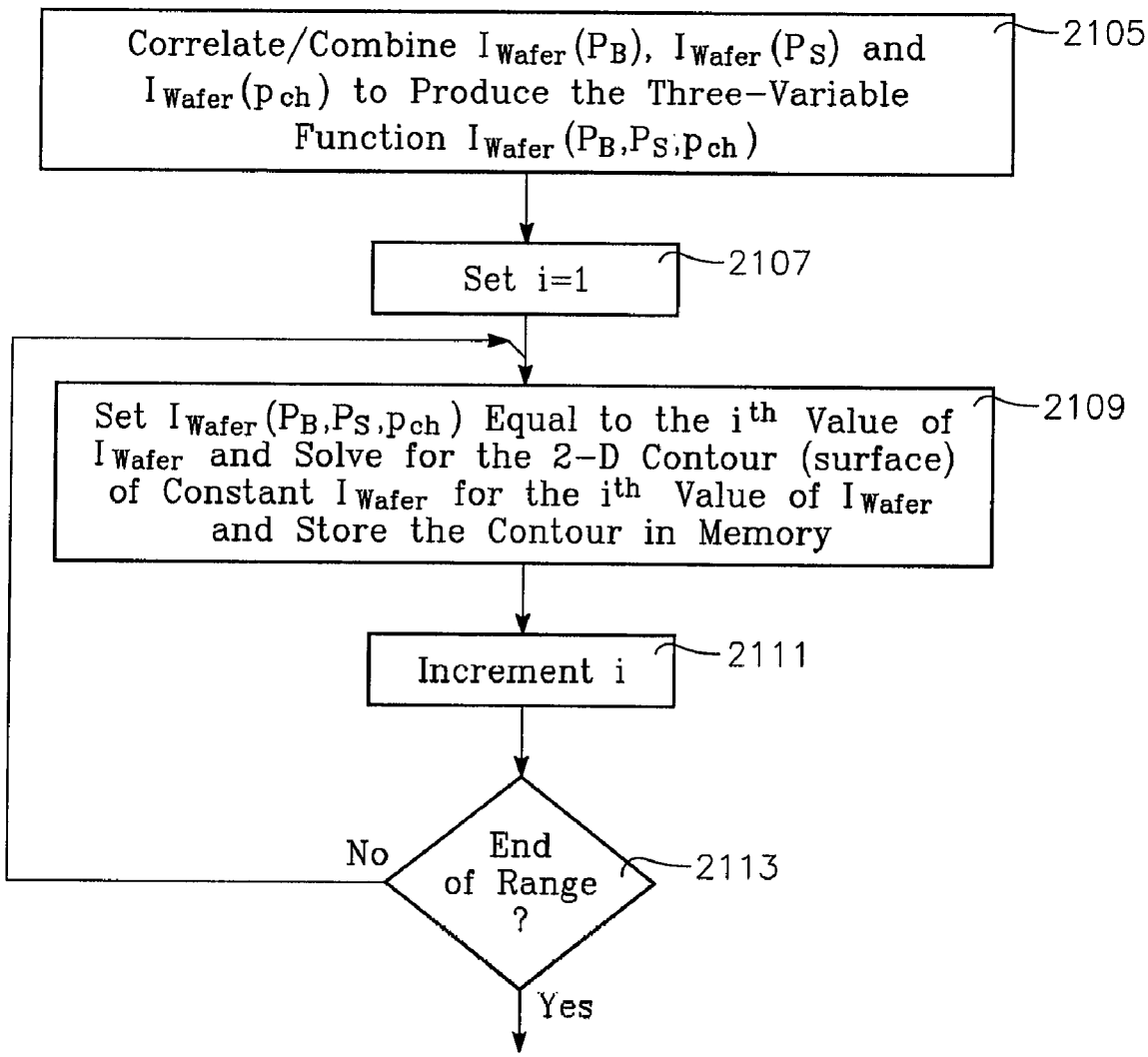

The first step (block 2105) in the process of FIG. 36 is to correlate or combine the single variable functions $I_{Wafer}(P_B)$, $I_{Wafer}(P_S)$ and $I_{Wafer}(p_{ch})$ to produce a single three-variable function $I_{Wafer}(P_B, P_S, p_{ch})$. The next step is to initialize an index i to one by setting i=1 (block 2107). In the step of block 2109, an equation is created by setting the function $I_{Wafer}(P_B, P_S, p_{ch})$ equal to the $i^{th}$ value of $I_{Wafer}$. This equation is solved for the 2-D contour (surface) of constant $I_{Wafer}$ for the $i^{th}$ value of $I_{Wafer}$. This contour is then stored in the contour generator memory 1120a. The index i is incremented by one by setting i=i+1 (block 2111). A determination is made of whether the end of range of the values of $I_{Wafer}$ has been reached (block 2113). If not (No branch of block 2113), the process loops back to the step of block 2109. Otherwise (YES branch of block 2113), the current process is complete and the next process is performed.

The same processes may be performed for other chamber parameters. Such chamber parameters may include the gas flow rates of the inner and outer gas injection zones and the gas compositions of the different gas mixtures supplied to the inner and outer gas injection zones, for example. The foregoing procedures complete the characterization of the reactor chamber for the selected chamber parameters and plasma parameters.

Figure 37:
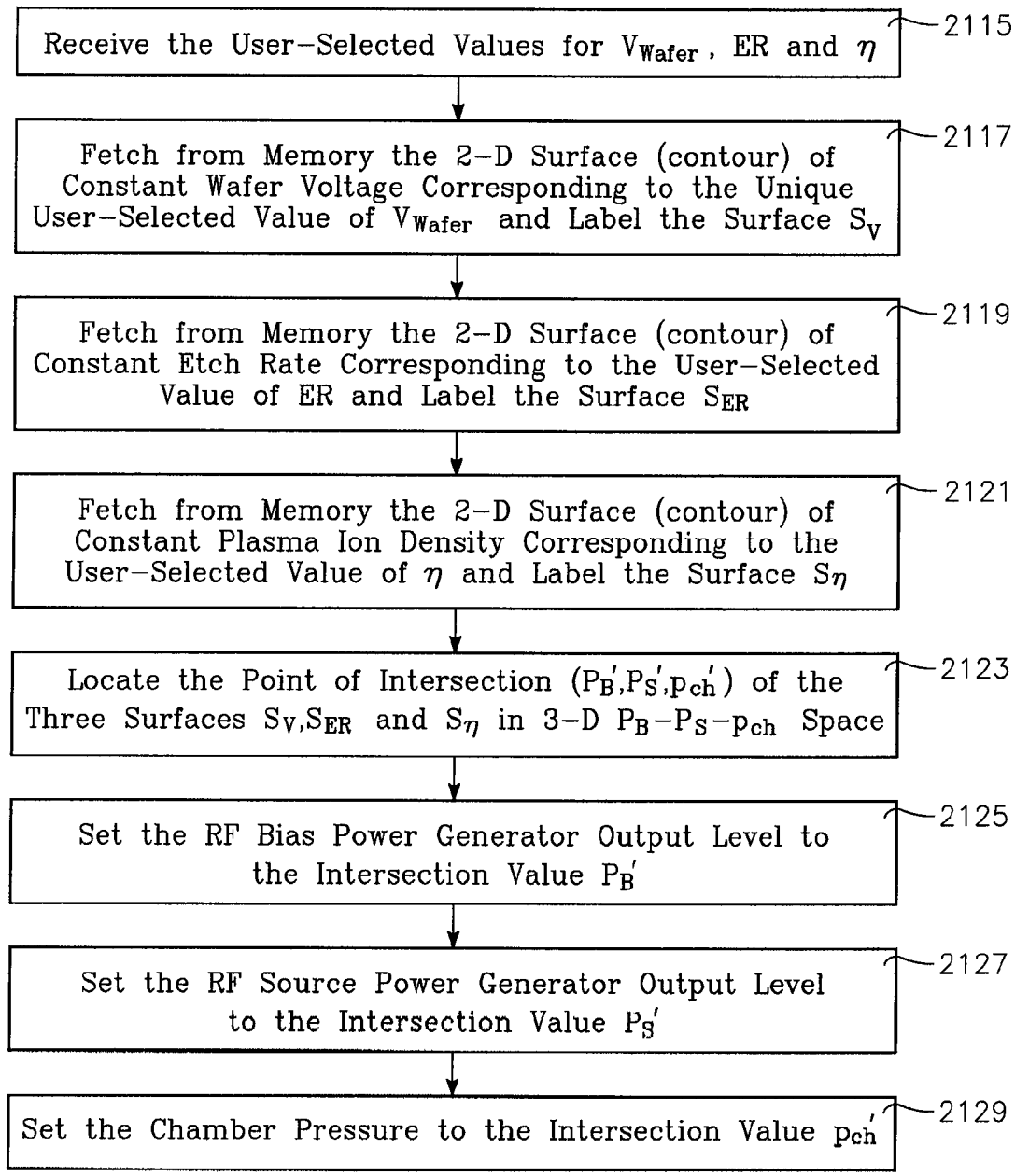
FIG. 37 depicts a process for controlling three plasma parameters using the contours of constant value of FIGS. 33-36.

The next process is to exploit the chamber characterization information obtained in the foregoing processes to provide a translation from desired values of selected plasma parameters to required values of selected chamber parameters. As one example of such a process, FIG. 37 depicts a process for controlling three selected plasma parameters in the 3-D $P_B$-$P_S$-$p_{ch}$ control space in response to user-selected values for $V_{Wafer}$, ER and η. This process is controlled by the process set point controller 1110 of FIG. 26.

The process of FIG. 37 is controlled by the set point controller and begins with the set point controller 1110 receiving the user-selected values for $V_{Wafer}$, ER and η (block 2115 of FIG. 37). The next step is to fetch from memory the 2-D surface (contour) of constant wafer voltage corresponding to the unique user-selected value of $V_{Wafer}$ and label the surface $S_V$ (block 2117 of FIG. 37). Then, the controller 1110 fetches from memory the 2-D surface (contour) of constant etch rate corresponding to the user-selected value of ER and label the surface $S_{ER}$ (block 2119). Next, the controller 1110 fetches from memory the 2-D surface (contour) of constant plasma ion density corresponding to the user-selected value of η and labels the surface $S_\eta$ (block 2121). The controller 1110 then locates the point of intersection ($P_B'$, $P_S'$, $p_{ch}'$) of the three surfaces $S_V$, $S_{ER}$ and $S_\eta$ in 3-D $P_B$-$P_S$-$p_{ch}$ space (block 2123). The set point controller 1110, acting through the feedback controller 950, then sets the RF bias power generator output level to the intersection value $P_B'$ (block 2125), sets the RF source power generator output level to the intersection value $P_S'$ (block 2127) and sets the chamber pressure to the intersection value $p_{ch}'$ (block 2129). This completes one control cycle of the process.

Figure 38:
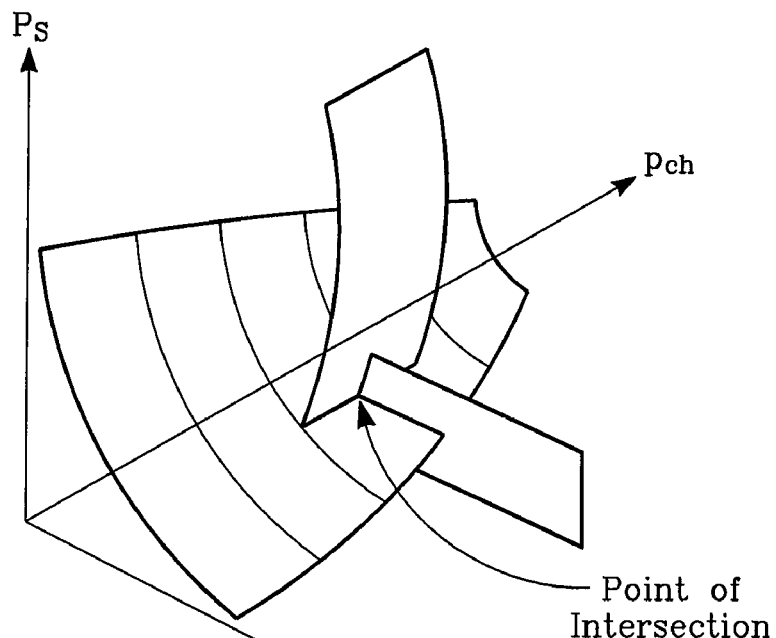
FIG. 38 depicts the intersection of the contours of constant value in the three-dimensional control space in the process of FIG. 37.

The intersection of three surfaces of constant plasma parameter values (of three different plasma parameters) in three dimensional chamber parameter space of the type exploited in the process of FIG. 37 is depicted in FIG. 38. The surfaces are two-dimensional objects residing in three-dimensional space. The intersection of the three surfaces lies at a single point whose location is specified by the 3-vector ($P_B'$, $P_S'$, $p_{ch}'$). The three orthogonal axes of FIG. 38 correspond to the three chamber parameters ($P_B$, $P_S$, $p_{ch}$). The three surfaces in FIG. 38 are the surfaces of constant value for each of the plasma parameters $V_{Wafer}$, ER and η, for which the values are the user-selected values.

Figure 39:
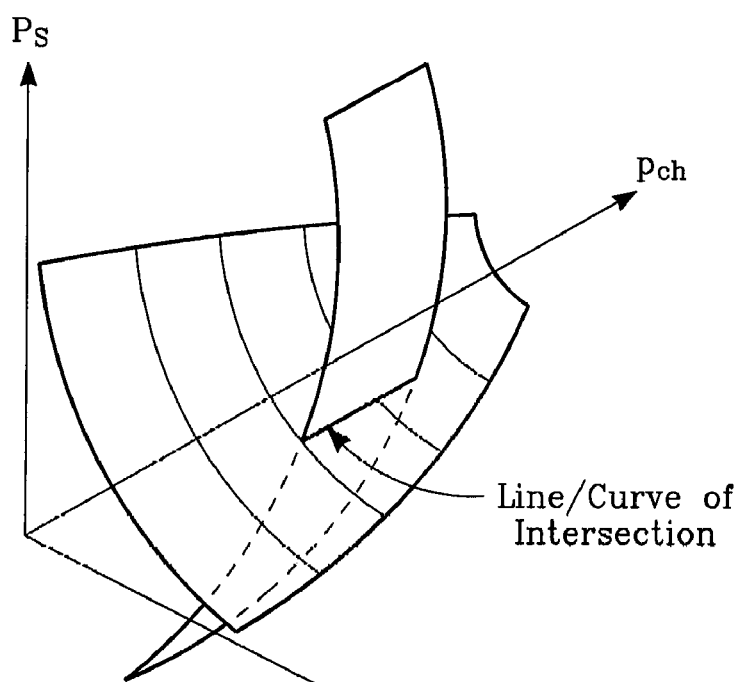
FIG. 39 is a view of the three-dimensional control space corresponding to that of FIG. 38 but for the underconstrained case in which only two contours of constant value are specified and therefore intersect along a curve, FIG. 39 depicting a method of varying the chamber parameters along the curve of intersection.
Figure 40:
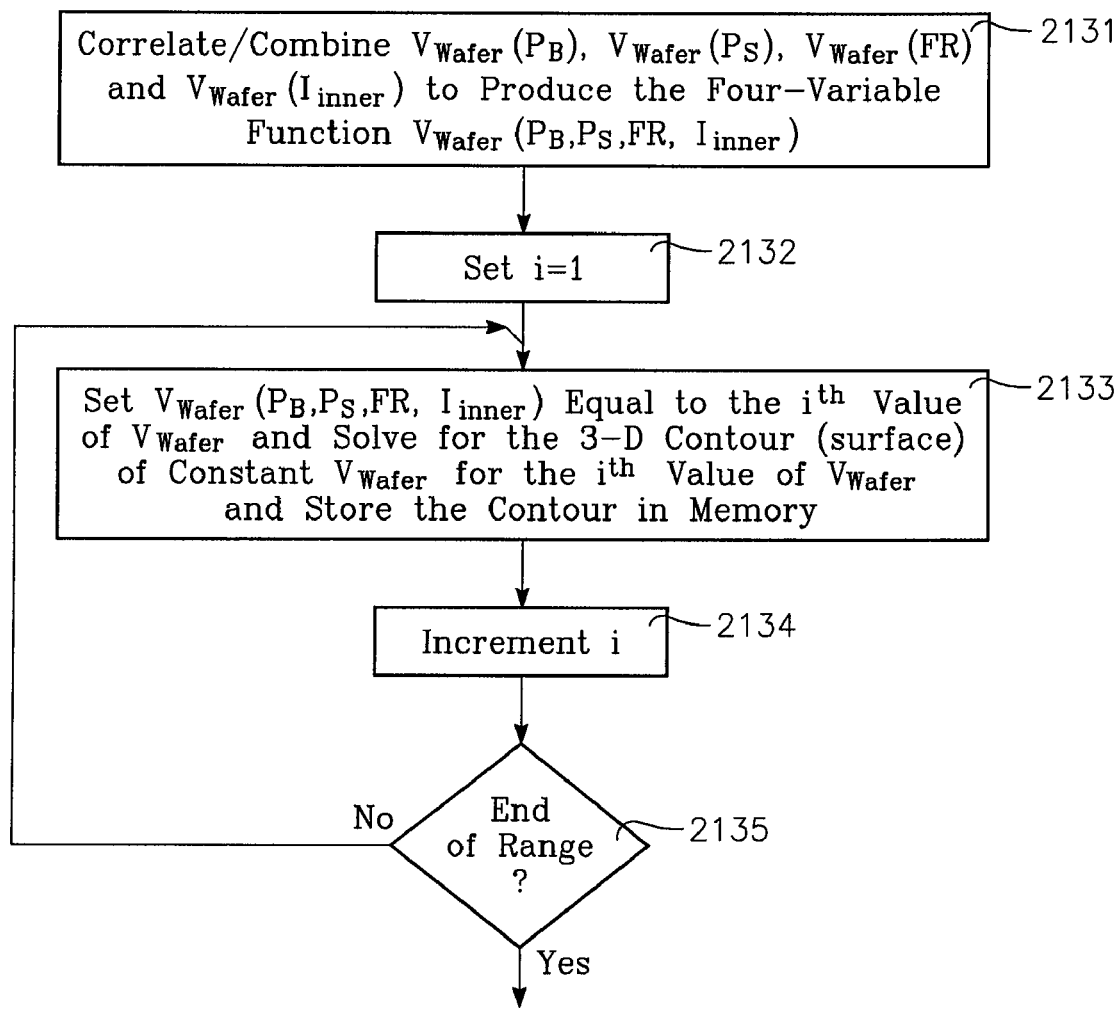
FIGS. 40-43 depict an example in which contours (i.e., surfaces) of constant value of four plasma parameters are produced from the single variable functions of FIGS. 27-32 in a four dimensional control space with dimensions of source power, bias power, gas flow rate (or composition) and magnet coil current.

Under-constrained 3-D Control Space—Providing an Extra Degree of Freedom to Vary the Chamber Parameters:

In the example of FIG. 38, the number of plasma parameters and the number of chamber parameters is the same. It is possible to obtain an additional degree of freedom by under-constraining the chamber parameters. This feature arises whenever the number of selected plasma parameters is less than the number of selected chamber parameters. FIG. 39 illustrates such a case, in which the three chamber parameters are constrained by user selected values of only two plasma parameters. For example, in a three dimensional control space of $P_B$, $P_S$, $p_{ch}$, the only constrained plasma parameters may be $V_{Wafer}$ and η. In this case, there are only two surfaces intersecting the 3-D control space, and such an intersection occurs along a line or curve. The allows the user to vary the chamber parameters to any set of values ($P_B'$, $P_S'$, $p_{ch}'$) lying on that line while continuing to meet the user-selected values for $V_{Wafer}$ and η.

Alternating Set Point Control in 3-D Control Space with Real Time Feedback Control:

The foregoing chamber control process may be employed any time or all the time, but is particularly useful at the start of wafer processing, when no real time measurements of the plasma parameters are available. After plasma processing of the wafer is underway and measurements of plasma parameters become available through the measurement instrument 140, control may be taken over by the feedback controller 950. The feedback controller 950 compares actual real time measurements of selected plasma parameters (from the measurement instrument 140) with the user-selected values of those parameters. The feedback controller 950 minimizes those differences by correcting source power (for etch rate or ion density) and correcting bias power (for wafer voltage), as described earlier in this specification with reference to FIGS. 9 and 10.

If there is a significant change in one (or more) user selected values of plasma parameters, then the change can be immediately effected by reverting back to the control process of FIG. 37, in which the new chamber parameter settings are instantly ascertained by finding the intersection in 3-D control space of the contours corresponding to the (new) user-selected values of plasma parameters. This option enables the chamber to nearly instantaneously meet any changes in process recipe, a significant advantage.

Process Control in a 4-D Control Space—Translating Desired Plasma Parameter Values to Chamber Parameter Values:

FIGS. 40-45 depict a control process example involving a 4-dimensional control space. This example involves generating four-variable functions from the single variable functions produced by the chamber characterization processes of FIGS. 27-32. Specifically, FIGS. 40-45 illustrate the example of a 4-D control space of the chamber parameters $P_B$, $P_S$, FR and $I_{inner}$. In the first process of this example, that of FIG. 40, the task is to produce 3-D contours (in 4-D space) of constant $V_{Wafer}$. The first step (block 2131 of FIG. 40) is to correlate or combine the four single variable functions $V_{Wafer}(P_B)$, $V_{Wafer}(P_S)$, $V_{Wafer}(FR)$ and $V_{Wafer}(I_{inner})$ to produce a single four-variable function $V_{Wafer}(P_B, P_S, FR, I_{inner})$. Curve fitting techniques may be employed in carrying out this step. An index i is initialized to one by setting i=1 (block 2132). An equation is created by setting the function $V_{Wafer}(P_B, P_S, FR, I_{inner})$ equal to the $i^{th}$ value in the range of values of $V_{Wafer}$. This equation is solved for the 3-D contour (surface) of constant $V_{Wafer}$ corresponding to the $i^{th}$ value of $V_{Wafer}$. This contour is stored in the contour generator memory 1120a (block 2133). The index i is then incremented by setting i=i+1 (block 2134). A determination is made of whether the end of the range of values for $V_{Wafer}$ has been reached (block 2135). If not, the process returns to the step of block 2133 (NO branch of block 2135). Otherwise, the process is finished and the next process is begun (YES branch of block 2135).

Figure 41:
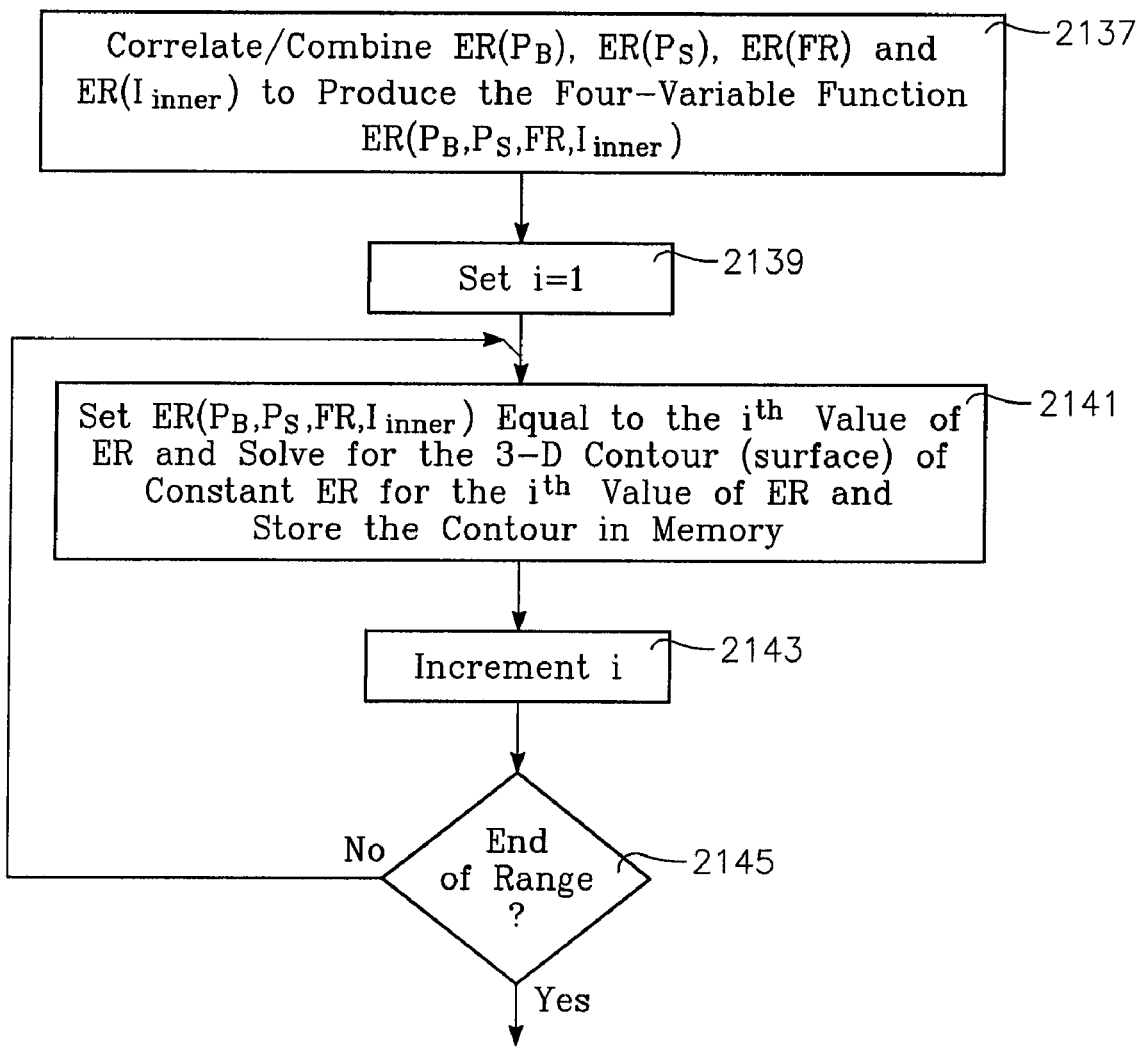

In the next process of this example, that of FIG. 41, the task is to produce 3-D contours (in 4-D space) of constant ER. The first step (block 2137) is to correlate or combine the four single variable functions ER($P_B$), ER($P_S$), ER(FR) and ER($I_{inner}$) into a single four-variable function ER($P_B$, $P_S$, FR, $I_{inner}$). This step may be carried out using curve fitting techniques. An index i is initialized to one by setting i=1 (block 2139). In the step of block 2141, an equation is created by setting the function ER($P_B$, $P_S$, FR, $I_{inner}$) equal to the $i^{th}$ value in the range of values of ER. This equation is solved for the 3-D contour (surface) of constant ER corresponding to the $i^{th}$ value of ER. This contour is stored in the contour generator memory 1120a. The index i is incremented (block 2143) and a determination is made of whether end of range of etch rate (ER) values has been reached (block 2145). If not (NO branch of block 2145), the process returns to the step of block 2141. Otherwise (YES branch of block 2145), the process is finished and the next process is begun.

Figure 42:
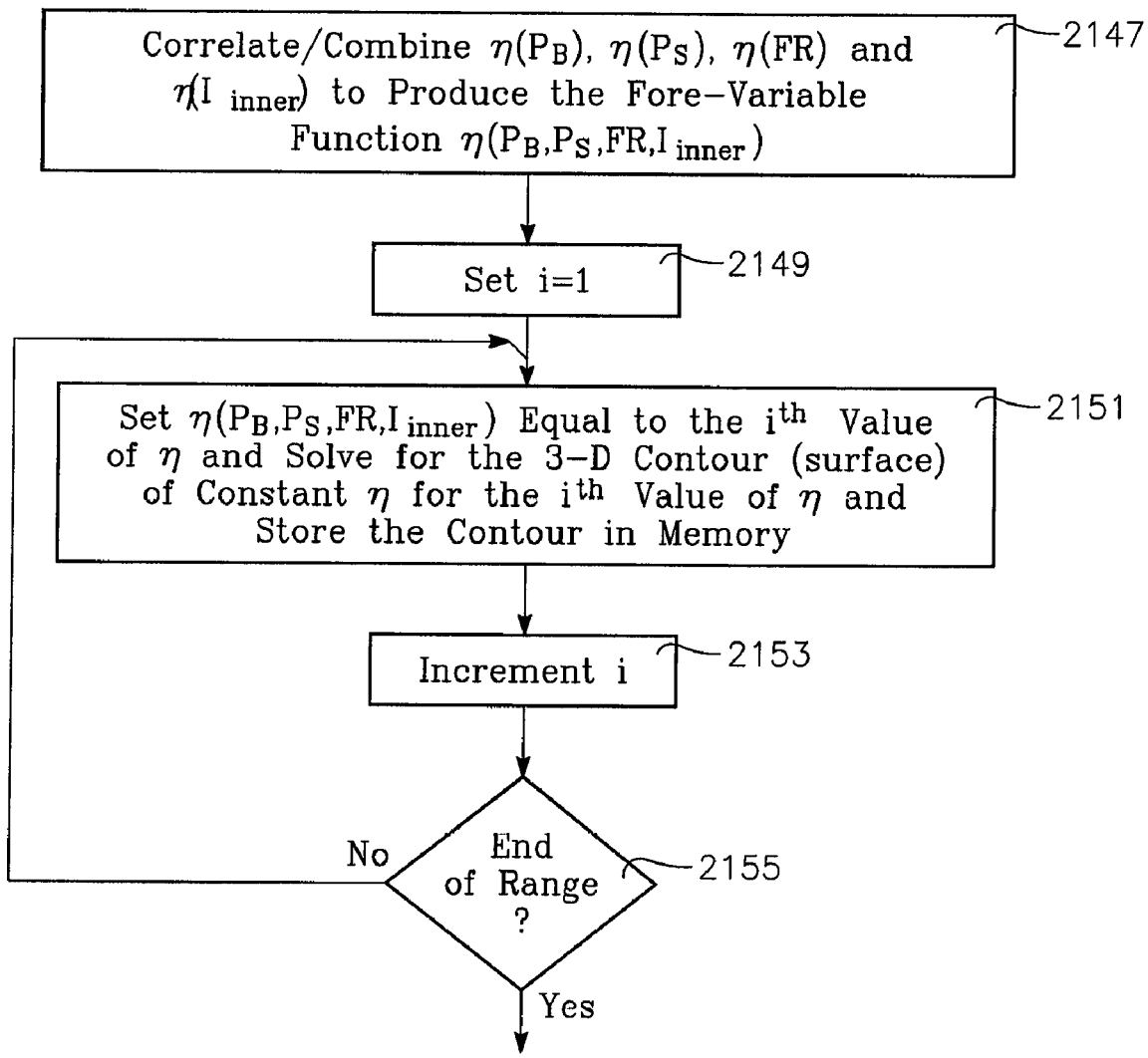

In the next process of this example, that of FIG. 42, the task is to produce 3-D contours (in 4-D space) of constant η (etch rate). The first step (block 2147 of FIG. 42) is to correlate or combine the four single-variable functions η($P_B$), η($P_S$), η(FR) and η($I_{inner}$) into a single four-variable function η($P_B$, $P_S$, FR, $I_{inner}$). This step may employ curve fitting techniques. An index i is initialized to one by setting i=1 (block 2149). In the step of block 2151, an equation is created by setting the four-variable function η($P_B$, $P_S$, FR, $I_{inner}$) equal to the $i^{th}$ value of the range of ion density values η. This equation is solved for the 3-D contour (surface) of constant η corresponding to the $i^{th}$ value of η. The contour is stored in the contour generator memory 1120a. The index i is incremented by setting i=i+1 (block 2153) and a determination is made of whether the end of range of ion density (η) values has been reached (block 2155). If not (No branch of block 2155), the process returns to the step of block 2151. Otherwise (YES branch of block 2155), the process is finished and the next process is begun.

Figure 43:
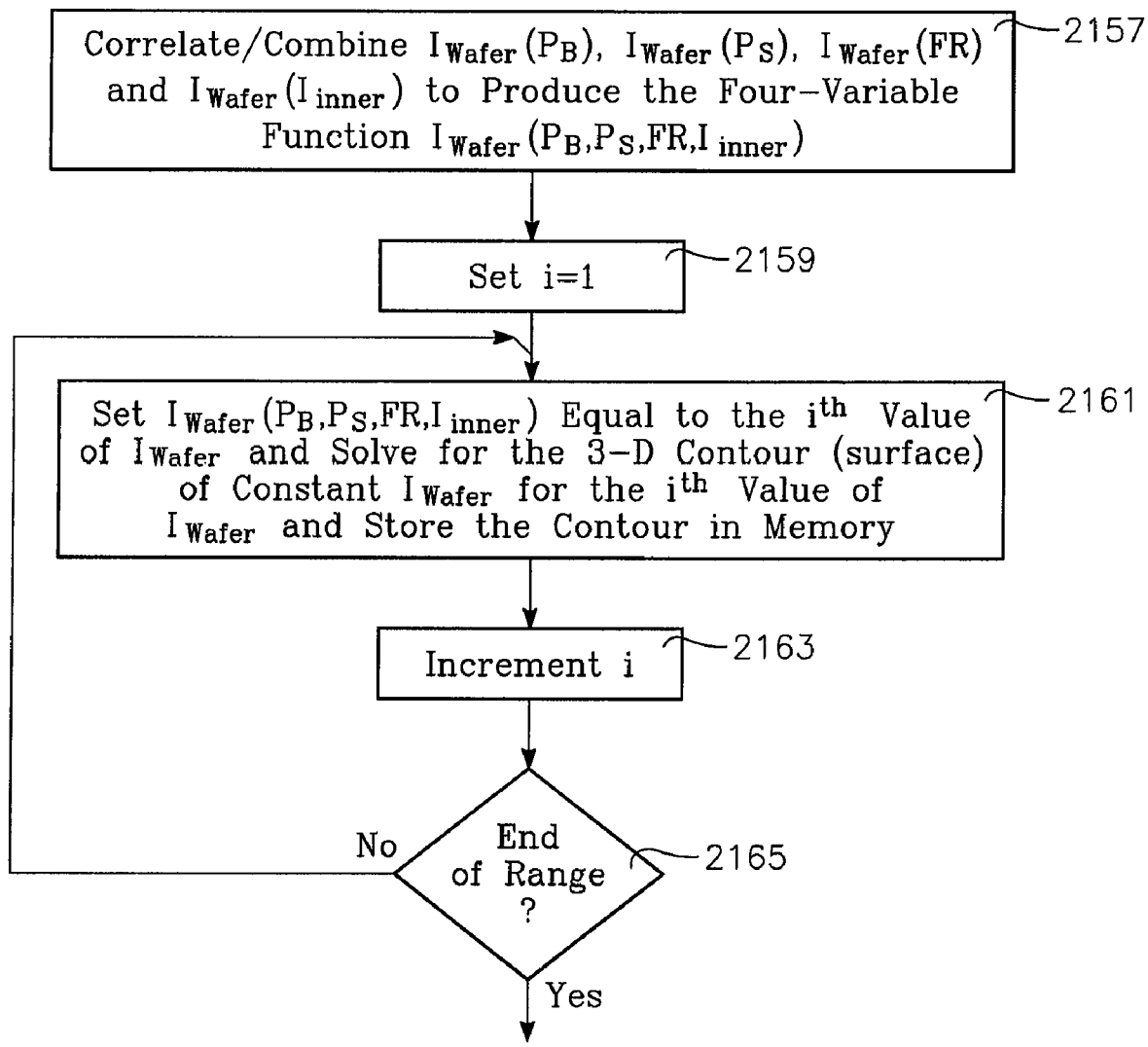

In the next process of this example, that of FIG. 43, the task is to produce 3-D contours (in 4-D space) of constant $I_{Wafer}$. The first step (block 2157 of FIG. 43) is to correlate or combine the four single-variable functions $I_{Wafer}(P_B)$, $I_{Wafer}(P_S)$, $I_{Wafer}(FR)$ and $I_{Wafer}(I_{inner})$ into a single four-variable function $I_{Wafer}(P_B, P_S, FR, I_{inner})$. An index i is initialized to one by setting i=1 (block 2159). In the step of 2161, an equation is created by setting the four-variable function $I_{Wafer}(P_B, P_S, FR, I_{inner})$ equal to the $i^{th}$ value of $I_{Wafer}$. This equation is solved for the 3-D contour (surface) of constant $I_{Wafer}$ corresponding to the $i^{th}$ value of $I_{Wafer}$. This contour is stored in the contour generator memory 1120a. The index i is incremented by one by setting i=i+1 (block 2163). At this point, a determination is made whether the end of range of the values of $I_{Wafer}$ has been reached (block 2165). If not (NO branch of block 2165), the process returns to the step of block 2161. Otherwise (YES branch of block 2165), the process is finished. This completes the chamber characterization tasks required for the subsequent translation of user-selected values of four plasma parameters (e.g., $V_{Wafer}$, ER, η and $V_I$) to target values of four chamber parameters (e.g., $P_B$, $P_S$, FR, $I_{inner}$). The processes for performing such a translation are now described with reference to FIG. 44.

Figure 44:
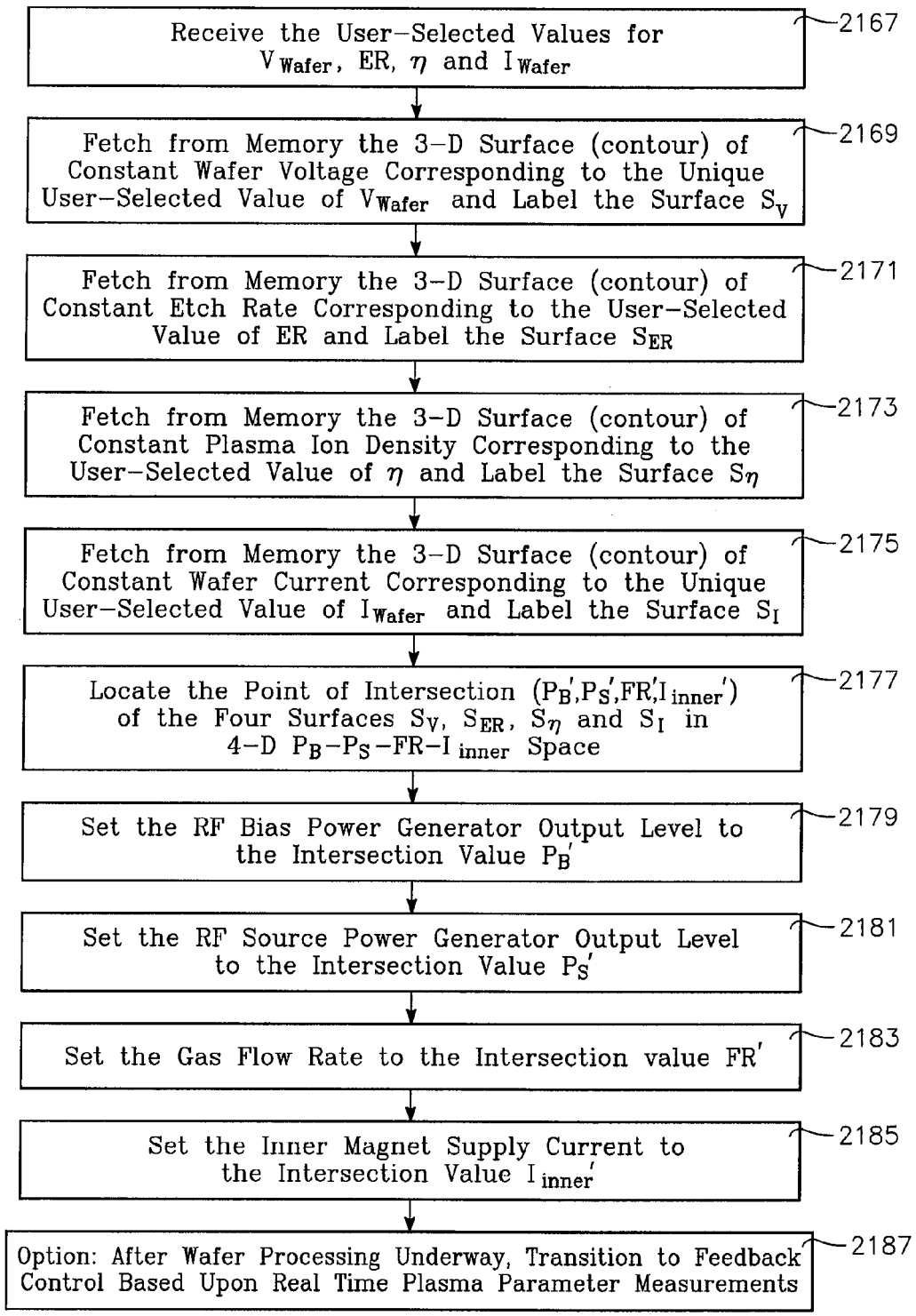
FIG. 44 depicts a process for controlling four plasma parameters using the contours of constant value of FIGS. 40-43.

FIG. 44 illustrates a process for controlling four selected plasma parameters (e.g., $V_{Wafer}$, ER, η and $V_{Wafer}$) in the 4-D $P_B$-$P_S$-FR-$I_{inner}$ control space in response to user-selected values for the selected plasma parameters ($V_{Wafer}$, ER, η and $I_{Wafer}$). This process translates the user-selected values for the plasma parameters $V_{Wafer}$, ER, η and $V_{Wafer}$ to required values for the chamber parameters $P_B$, $P_S$, FR and $I_{inner}$.

The first step in the process of FIG. 44 is for the process set point controller 1110 to receive the user-selected values for $V_{Wafer}$, ER, η and $I_{Wafer}$ (block 2167 of FIG. 44). In the step of block 2169, the process set point controller 1110 fetches from the contour generator memory 1120a the 3-D surface (contour) of constant wafer voltage corresponding to the unique user-selected value of $V_{Wafer}$. This surface may be labelled $S_V$. The controller 1110 also fetches from the memory 1120a the 3-D surface (contour) of constant etch rate corresponding to the user-selected value of ER, which may be labelled $S_{ER}$ (block 2171). The controller 1110 fetches the 3-D surface (contour) of constant plasma ion density corresponding to the user-selected value of η and labels the surface $S_\eta$ (block 2173). Finally, the controller 1110 fetches the 3-D surface (contour) of constant wafer current corresponding to the unique user-selected value of $I_{Wafer}$ and labels the surface $S_I$ (block 2175).

The next step is for the set point controller 1110 to locate the point of intersection ($P_B'$, $P_S'$, FR', $I_{inner}'$) of the four surfaces $S_V$, $S_{ER}$, $S_\eta$ and $S_I$ in the 4-D $P_B$-$P_S$-FR-$I_{inner}$ control space (block 2177). This four-dimensional step is analogous to the three dimensional case of three intersecting surfaces depicted in FIG. 38. The chamber parameters are then set to the respective values of $P_B'$, $P_S'$, FR' and $I_{inner}'$ corresponding to the point of intersection. This is accomplished by the set point controller 1110 acting through the feedback controller 950 to effect the chamber parameters, as follows: setting the RF bias power generator output level to the intersection value $P_B'$ (block 2179), setting the RF source power generator output level to the intersection value $P_S'$ (block 2181), setting the gas flow rate to the intersection value FR' (block 2183) and setting the inner magnet supply current to the intersection value $I_{inner}'$ (block 2185).

Alternating Set Point Control in 4-D Control Space with Real Time Feedback Control:

The foregoing steps exploiting the 4-D control space bring the selected plasma parameters in line with their user-selected values. This fact can be verified by taking real time direct measurements of the plasma parameters from the measurement instrument 140. As described earlier in this specification with reference to FIGS. 9-11, such real time measurements form the basis of a feedback control system in which chamber parameters (e.g., $P_S$ and $P_B$) are changed to minimize the differences between the real time measurements and the user-selected or target values for the plasma parameters $V_{Wafer}$, ER, η. For example, $P_S$ is changed to bring either ER or η closer to the corresponding user-selected values, and $P_B$ is changed to bring $V_{Wafer}$ closer to the corresponding user selected value.

Therefore, as one option the chamber control process of steps 2167-2185 of FIG. 44 may be phased out and process control turned over to the feedback control loops of FIGS. 9-11 based upon real time measurements of plasma parameters by the measurement instrument 140. This option is depicted in the step of block 2187 of FIG. 44. The translation-based chamber control steps of blocks 2167-2185 may be employed at the beginning of a plasma process (when no real time measurements are available). Then, after the plasma process is sufficiently underway for real time measurements to become available, the step of block 2187 is performed to transition chamber control to the real time feedback control loops of FIGS. 9-11. Process control may be temporarily returned to the translation-based steps of blocks 2167-2185 whenever a significant change is made in the user selected values of one or tore plasma parameters. This option enables the chamber to nearly instantaneously meet any changes in process recipe, a significant advantage.

Figure 45:
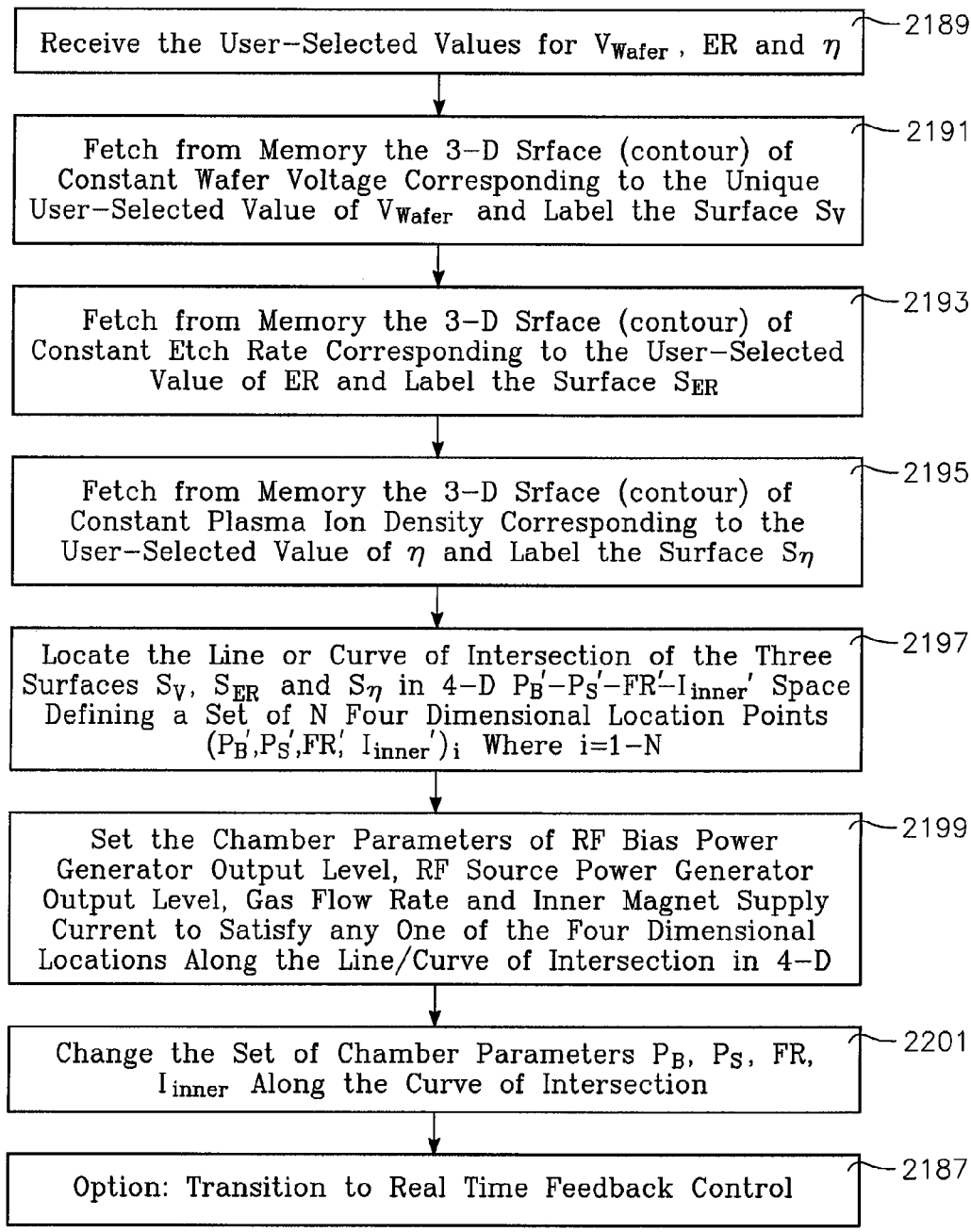
FIG. 45 depicts an under-constrained version of the process of FIG. 44 in which only three plasma parameters are controlled in four dimensional control space by varying them along a trajectory or curve along which the three corresponding contours intersect in four-dimensional space.

Under-constrained Case: Controlling Three Selected Plasma Parameters (e.g., $V_{Wafer}$, ER, η) in the 4-D $P_B$-$P_S$-FR-$I_{inner}$ Control Space in Response to User-selected Values for $V_{Wafer}$, ER and η:

FIG. 45 depicts an example of providing an extra degree of freedom by operating in a chamber parameter space of dimensionality exceeding the number of user-controlled plasma parameters. This is a four-dimensional version of the under-constrained control case illustrated in FIG. 39, in which the chamber parameters are permitted to vary along a curve or trajectory determined by the intersecting surfaces.

The first step in the process of FIG. 45 is for the set point controller 1110 to receive the user-selected values for the selected plasma parameters, e.g., $V_{Wafer}$, ER and η (block 2189). The next step is for the set point controller 1110 to fetch from the contour generator memory 1120a the 3-D surface (contour) of constant wafer voltage corresponding to the unique user-selected value of $V_{Wafer}$ and labels the surface $S_V$ (block 2191). The set point controller 1110 also fetches the 3-D surface (contour) of constant etch rate corresponding to the user-selected value of ER and labels the surface $S_{ER}$ (block 2193). And, the controller 1110 fetches the 3-D surface (contour) of constant plasma ion density corresponding to the user-selected value of η and labels the surface $S_\eta$ (block 2195). The contour generator then locates the line or curve of intersection of the three surfaces $S_V$, $S_{ER}$ and $S_\eta$ in 4-D $P_B$-$P_S$-FR-$I_{inner}$ space (block 2197). This curve lies along a set tour dimensional location point $(P_B', P_S', FR', I_{inner}')_i$ where the index i refers to a particular one of a theoretically infinite number of four-dimensional points along the line or curve of intersection.

The next step is to set the chamber parameters of $P_B$, $P_S$, FR, $I_{inner}$ concurrently to any one of the four dimensional locations along the line/curve of intersection in 4-D space (block 2199). Thereafter, the chamber parameters $P_B$, $P_S$, FR, $I_{inner}$ may be varied along the curve of intersection so that their concurrent values coincides with one of the four-dimensional point $(P_B', P_S', FR', I_{inner}')_i$ along the line or curve of intersection (block 2201).

Alternating the Under-constrained 4-D Control Space Method with Real Time Feedback Control:

A further option is to transition control over to the real time feedback control loops of FIGS. 9-11 in the step of block 2187 of FIG. 45. Specifically, the chamber control process of steps 2189-2201 of FIG. 45 may be phased out and process control turned over to the feedback control loops of FIGS. 9-11 based upon real time measurements of plasma parameters by the measurement instrument 140. This option is depicted in the step of block 2187 of FIG. 45. The translation-based chamber control steps of blocks 2167-2185 may be employed at the beginning of a plasma process (when real time measurements are available). Then, after the plasma process is sufficiently underway for real time measurements to become available, the step of block 2187 is performed to transition chamber control to the real time feedback control loops of FIGS. 9-11. Process control may be temporarily returned to the translation-based steps of blocks 2189-2201 whenever a significant change is made in the user selected values of one or more plasma parameters. This option enables the chamber to nearly instantaneously meet any changes in process recipe, a significant advantage.

Controlling M Plasma Parameters with N Chamber Parameters:

The processes described above in this specification concern two-dimensional, three-dimensional or four-dimensional control spaces. In fact, the invention may be carried out using any number of chamber parameters to simultaneously realized desired values of any number of plasma parameters. The plasma parameters subject to user-selected values may be selected from the group of plasma parameters that includes ion energy or wafer voltage, ion density, ion mass, etch rate, wafer current, etch selectivity, and so forth. The chamber parameters to that are controlled may be selected from the group that includes source power, bias power, chamber pressure, inner coil magnet current, outer coil magnet current, inner gas injection zone gas composition, outer gas injection zone gas composition, inner gas injection zone flow rate, outer gas injection zone flow rate, and so forth. Preferably, the number of selected plasma parameters is the same as the number of selected chamber parameters. However, the numbers may differ. For example, if the number of selected plasma parameters is less than the number of selected chamber parameters, then the system is under-constrained and at least one additional degree of freedom is present that permits the chamber parameters to be varied while continuinq to meet the user-selected plasma parameter values. If the number of selected plasma parameters exceeds the number of selected chamber parameters, then the system is over constrained. In this case, the contours or surfaces of constant plasma parameter values may intersect at along several lines or points and control may require choosing between such points or interpolating between them.

Figure 46:
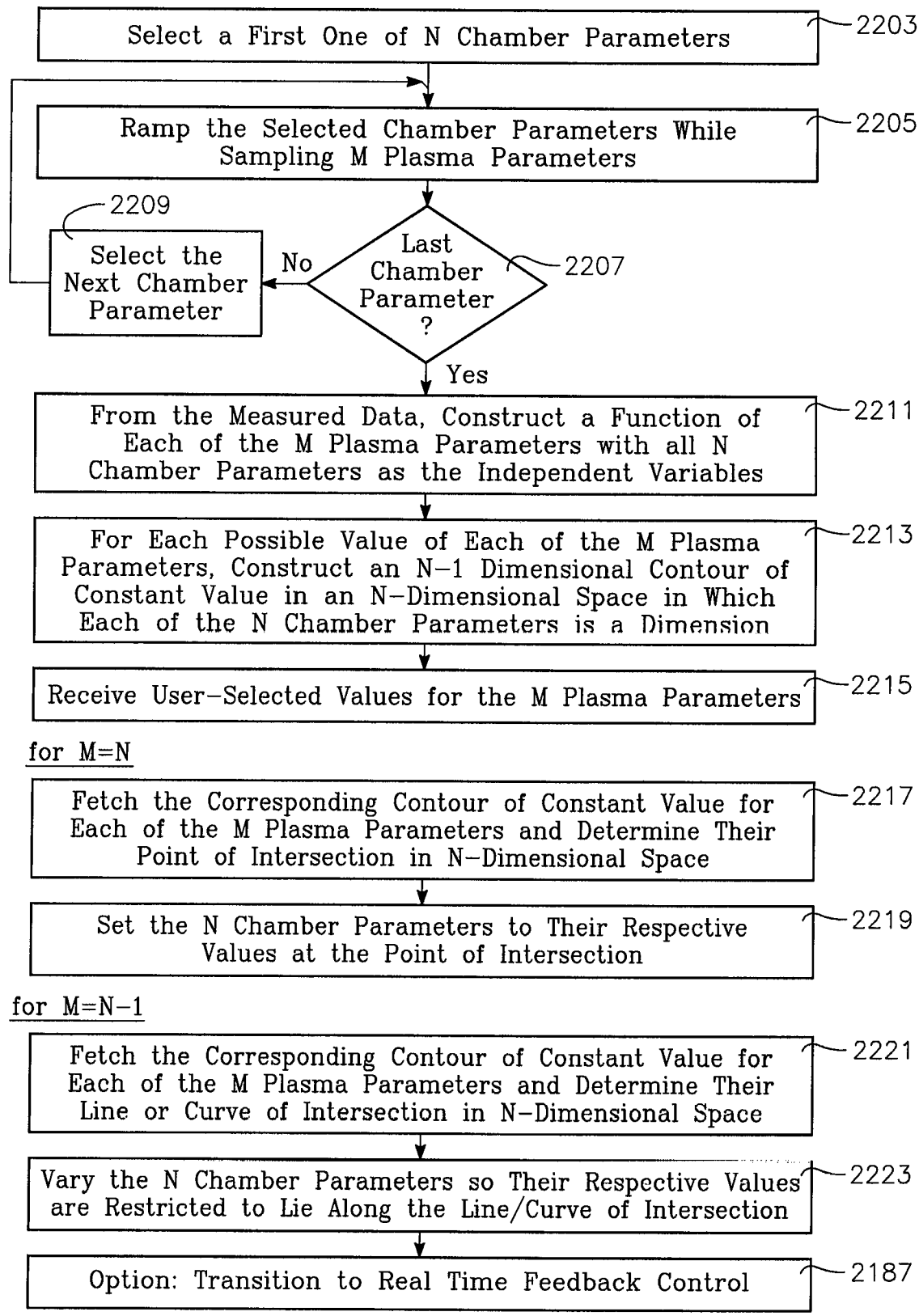
FIG. 46 depicts a process for characterizing the reactor chamber and controlling M plasma parameters with N chamber parameters.

The process of FIG. 46 requires characterization of the chamber, which begins with the step of selecting a first one of N chamber parameters (block 2203) and ramping the selected chamber parameter while sampling M selected plasma parameters with the measurement instrument 140 (block 2205). A determination is made of whether all of the N chamber parameters have been selected (block 2207). If not (NO branch of block 2207), the next one of the N chamber parameters is selected (block 2209) and the process loops back from block 2209 to the step of block 2205. Otherwise (YES branch of block 2207), the process continues with the next step, namely the step of block 2211. In the step of block 2211, the measured data from block 2205 is used to construct an N-variable function of each of the M plasma parameters. Each of these functions has all N chamber parameters as independent variables. In the next step (block 2213), for each possible value of each of the M plasma parameters, the contour generator 1120 constructs an N−1 dimensional contour of constant value in an N-dimensional space in which each of the N chamber parameters is a dimension. This completes the characterization of the chamber that will enable subsequent steps or process to translate the M plasma parameters to concurrent values of the N chamber parameters.

The next phase of the process of FIG. 46 is to translate a set of M user-selected values for the M plasma parameters to concurrent set of N values for the N chamber parameters. This phase begins with the receipt of the user-selected values for the M plasma parameters (block 2215).

If the number of plasma and chamber parameters is the same (i.e., if M=N), then the next step is the step of block 2217. In the step of block 2217, the controller 1110 fetches the corresponding contour of constant value for each of the M plasma parameters and determines their point of intersection in N-dimensional space. Then, the feedback controller 950 sets the N chamber parameters to their respective values at the point of intersection (block 2219).

If the number of plasma parameters is less than the number of chamber parameters (e.g., if M=N−1), then the system is under-constrained so that there is at least one extra degree of freedom. For the case in which M is one less than M, the following steps may be performed:

Block 2221: fetch the corresponding contour of constant value for each of the M plasma parameters and determine their line or curve of intersection in N-dimensional space;

Block 2223: vary the N chamber parameters so that their respective values are restricted to lie along the line/curve of intersection.

The foregoing steps complete the configuration of the N chamber parameters to realize a set of user-selected values for the M plasma parameters, or (conversely) the translation of the user-selected values of the M plasma parameters to required concurrent values of the N chamber parameters. In the optional step of block 2187, this process may be temporarily replaced by the real time feedback control process discussed above with reference to the feedback loops of FIGS. 9-11 based upon real time measurements of plasma parameters by the measurement instrument 140.

While the invention has been described in detail with reference to preferred embodiments, it is understood that variations and modifications thereof may be made without departing from the true spirit and scope of the invention.

What is claimed is:

1. A method of operating a plasma reactor chamber with respect to two plasma parameters selected from the group consisting of ion density, wafer voltage, etch rate, wafer current, by controlling chamber parameters of source power, bias power and chamber pressure, said method comprising:

characterizing the reactor chamber by performing the steps of:

a. for each one of said selected chamber parameters, ramping the level of the one chamber parameter while sampling RF electrical parameters at an RE bias power input to a wafer support pedestal and computing from each sample of said RF electrical parameters the values of the plasma parameters, and storing said values with the corresponding levels of said one chamber parameter as corresponding chamber parameter data;

b. for each one of said selected chamber parameters, deducing, from the corresponding chamber parameter data, a single variable function for each of said plural plasma parameters having said one chamber parameter as an independent variable;

c. constructing combinations of said functions and from said combinations, constructing surfaces defining simultaneous values of all of said selected chamber parameters, each respective surface corresponding to a respective constant value of one of said plural plasma parameters, and storing said surfaces;

controlling a plasma in the chamber during processing of a production wafer in the chamber in accordance with user-selected values of each of said plural plasma parameters by performing the following steps:

a. for each one of said selected plasma parameters, fetching a relevant surface of constant value corresponding to the user-selected value of said one plasma parameter, and determining an intersection of the relevant surfaces, said intersection corresponding to a target value of source power, bias power and chamber pressure; and b. setting said source power, bias power and the pressure in said chamber, respectively, to the respective target value.

2. The method of claim 1 wherein the number of said selected plasma parameters is three.

3. The method of claim 2 wherein said selected plasma parameters are ion density, wafer voltage and etch rate.

4. The method of claim 1 wherein the step of sampling RF electrical parameters at an RF bias power input to said wafer support pedestal comprises:

sensing an input impedance, an input current and an input voltage to a transmission line coupled between a bias power impedance match circuit and an electrode within the wafer pedestal.

5. The method of claim 4 wherein the step of computing from each sample of said RF electrical parameters the values of plural plasma parameters is carried out separately for plasma parameters of ion density, wafer voltage and etch rate.

6. The method of claim 5 wherein the step of computing from each sample of said RF electrical parameters the values of plural plasma parameters comprises:

computing a junction admittance of a junction between said transmission line and the electrode within the wafer pedestal from said input impedance, input current and input voltage and from parameters of the transmission line.

7. The method of claim 6 wherein the step of computing from each sample of said RF electrical parameters the values of plural plasma parameters further comprises:

providing shunt electrical quantities of a shunt capacitance between the electrode and a ground plane;

providing load electrical quantities of a load capacitance between the electrode and a wafer on the pedestal.

8. The method of claim 7 wherein the step of computing from each sample of said RF electrical parameters the values of plural plasma parameters further comprises:

computing said etch rate, plasma ion density and wafer voltage from said junction admittance, said shunt electrical quantities, said load electrical quantities and a frequency of RF bias power applied to said electrode.

9. The method of claim 8 wherein said parameters of said transmission line comprise a length of said transmission line, a characteristic impedance of said transmission line and a complex loss factor of said transmission line.

10. The method of claim 9 wherein said shunt electrical quantities are computed from the size of an electrode-to-ground gap length, an area of said wafer, an electrode-to-ground dielectric constant and an electrode-to-ground conductive loss component.

11. The method of claim 10 wherein said load electrical quantities are computed from an electrode-to-wafer gap length, an area of the wafer, an electrode-to-wafer dielectric constant and an electrode-to-wafer conductive loss component.

12. The method of claim 11 wherein the step of computing said etch rate, plasma ion density and wafer voltage comprises:

first computing said wafer voltage and an imaginary part of a plasma admittance comprising a plasma susceptance, and computing said ion density and etch rate from said wafer voltage and said plasma susceptance.

13. The method of claim 1 wherein the combination of said functions for wafer voltage, $V_{wafer}$, having the variables of source power $P_{source}$, bias power $P_{bias}$, and chamber pressure p, is:

$$V_{wafer}(P_{source}, P_{bias}, p) = V_0(P_{bias}/P_{b0})^a[(P_{source}/P_{s0})K_1(p/p_0)^{-1} + (p/p_0)^b]^c$$

where $V_0$ is a reference voltage, $P_{b0}$ is a maximum bias power, $P_{s0}$ is a maximum source power, $p_0$ is a minimum chamber pressure and $K_1$ is a constant and a, b and c are real numbers.

14. The method of claim 13 further comprising:

determining $V_0$ by applying zero plasma source power and maximum plasma bias power and setting chamber pressure at the minimum $p=p_0$ and measuring the wafer voltage; and determining $K_1$ by increasing the source power to the maximum value while measuring wafer voltage and adjusting $K_1$ until the expression yields the measured value for wafer voltage.

15. The method of claim 13 wherein other plasma parameters comprising ion density and etch rate are functions of (i) $V_{wafer}(P_{source}, P_{bias}, p)$ and (ii) plasma susceptance S, and $$S(P_{source}, P_{bias}, p) = S_0(P_{bias}/P_{b0})^e[(P_{source}/P_{s0})(p/p_0)^f]$$

$$[K_2(P_{bias}/P_{b0})^g(p/p_0)^h + (p/p_0)^i]$$

where $S_0$ is a reference susceptance and $K_2$ is a constant and e, f, g, h and i are real numbers.

16. The method of claim 15 further comprising:

determining $S_0$ by applying maximum bias power and zero source power while holding the chamber at minimum pressure and measuring susceptance;

determining $K_2$ by increasing source power to the maximum value, measuring susceptance and changing $K_2$ until the expression yields the measured value of susceptance.

17. The method of claim 16 wherein plasma ion density η is a function of susceptance and wafer voltage as follows:

$$\eta = S^2 V_{wafer}^2.$$

18. The method of claim 17 wherein etch rate ER is a function of susceptance and wafer voltage as follows:

$$ER = kS^2 V_{wafer}^{3/2}.$$

19. A method of operating a plasma reactor chamber with respect to two plasma parameters selected from the group consisting of ion density, wafer voltage, etch rate, wafer current, by controlling chamber parameters of source power, bias power and chamber pressure, said method comprising:
characterizing the reactor chamber by performing the steps of:
a. for each one of said selected chamber parameters, ramping the level of the one chamber parameter while sampling RF electrical parameters at an RE bias power input to said wafer support pedestal and computing from each sample of said RF electrical parameters the values of the plasma parameters, and storing said values with the corresponding levels of said one chamber parameter as corresponding chamber parameter data;
b. for each one of said selected chamber parameters, deducing, from the corresponding chamber parameter data, a single variable function for each of said plural plasma parameters having said one chamber parameter as an independent variable;
c. constructing combinations of said functions and from said combinations, constructing surfaces defining simultaneous values of all of said selected chamber parameters, each respective surface corresponding to a respective constant value of one of said plural plasma parameters, and storing said surfaces;
wherein the step of constructing surfaces defining simultaneous values of all of said chamber parameters comprises the following step carried out for each one of said selected plasma parameters:
combining the single variable functions dependent upon respective single variables of source power, bias power and chamber pressure into a single composite function dependent upon the following three variables: source power, bias power and chamber pressure.

20. The method of claim 19 wherein the step of constructing surfaces defining simultaneous values of all of said selected chamber parameters further comprises the following step carried out for each one of said selected plasma parameters:
setting the composite function equal to a succession of values of the respective plasma parameter.

21. The method of claim 20 wherein the step of constructing surfaces defining simultaneous values of all of said chamber parameters further comprises the following step carried out for each one of said selected plasma parameters:
for each one of said succession of values, solving for a surface defining a set of simultaneous values of source power, bias power and chamber pressure for which the respective plasma parameter has the one value.

22. A method of operating a plasma reactor chamber with respect to two plasma parameters selected from the group consisting of ion density, wafer voltage, etch rate, wafer current, by controlling chamber parameters of source power, bias power and chamber pressure, said method comprising:
characterizing the reactor chamber by performing the steps of:
a. for each one of said selected chamber parameters, ramping the level of the one chamber parameter while sampling RF electrical parameters at an RE bias power input to said wafer support pedestal and computing from each sample of said RF electrical parameters the values of the plasma parameters, and storing said values with the corresponding levels of said one chamber parameter as corresponding chamber parameter data;
b. for each one of said selected chamber parameters, deducing, from the corresponding chamber parameter data, a single variable function for each of said plural plasma parameters having said one chamber parameter as an independent variable;
c. constructing combinations of said functions and from said combinations, constructing surfaces defining simultaneous values of all of said selected chamber parameters, each respective surface corresponding to a respective constant value of one of said plural plasma parameters, and storing said surfaces;
wherein the number of said selected plasma parameters is less than three, said method further comprising:
controlling a plasma in the chamber during processing of a production wafer in the chamber in accordance with user-selected values of each of said selected plasma parameters by performing the following steps:
a. for each one of said selected plasma parameters, fetching a relevant surface of constant value corresponding to the user-selected value of said one plasma parameter, and determining an intersection of the relevant surfaces which defines a line in a 3-dimensional space whose dimensions are source power, bias power and chamber pressure; and
b. varying said source power, bias power and the pressure in said chamber, respectively, along said line.

* * * * *